(12) United States Patent
Yamazaki et al.

(10) Patent No.: US 7,888,681 B2
(45) Date of Patent: Feb. 15, 2011

(54) DISPLAY DEVICE

(75) Inventors: Shunpei Yamazaki, Setagaya (JP); Yasuyuki Arai, Atsugi (JP); Yukie Suzuki, Atsugi (JP); Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 237 days.

(21) Appl. No.: 12/222,672

(22) Filed: Aug. 14, 2008

(65) Prior Publication Data

US 2009/0045409 A1 Feb. 19, 2009

(30) Foreign Application Priority Data

Aug. 17, 2007 (JP) ............................... 2007-213055

(51) Int. Cl.
*H01L 29/04* (2006.01)
(52) U.S. Cl. ................................. 257/72; 257/E33.053
(58) Field of Classification Search .................. 257/72, 257/E33.053
See application file for complete search history.

(56) References Cited

U.S. PATENT DOCUMENTS

| 4,409,134 A | 10/1983 | Yamazaki |
| 5,571,578 A | 11/1996 | Kaji et al. |
| 2006/0113894 A1* | 6/2006 | Fujii et al. .................. 313/499 |
| 2007/0045627 A1* | 3/2007 | Park et al. .................. 257/66 |

FOREIGN PATENT DOCUMENTS

| JP | 04-242724 | 8/1992 |
| JP | 06-037313 | 2/1994 |
| JP | 07-211708 | 8/1995 |

OTHER PUBLICATIONS

Arai. T et al., "41.2: Micro Silicon Technology for Active Matrix OLED Display," SID Digest '07: SID International Symposium Digest of Technical Papers, 2007, vol. XXXVIII, pp. 1370-1373.
Lee. C et al., "Directly Deposited Nanocrystalline Silicon Thin-Film Transistors with Ultra High Mobilities," Appl. Phys. Lett. (Applied Physics Letters), Dec. 18, 2006, vol. 89, pp. 252101-1-252101-3.

(Continued)

*Primary Examiner*—Lex Malsawma
(74) *Attorney, Agent, or Firm*—Eric J. Robinson; Robinson Intellectual Property Law Office, P.C.

(57) ABSTRACT

A display device including both an n-channel thin film transistor and a p-channel thin film transistor each having excellent electric characteristics and high reliability is demonstrated, and a method for manufacturing thereof is also provided. The display device includes an inverted-staggered p-channel thin film transistor and an inverted-staggered n-channel thin film transistor in which a gate insulating film, a microcrystalline semiconductor film, and an amorphous semiconductor film are sequentially stacked over a gate electrode. The microcrystalline semiconductor film contains oxygen at a concentration of $1\times10^{16}$ atoms/cm$^3$ or less. Mobilities of the n-channel thin film transistor and the p-channel thin film transistor are from 10 to 45 cm$^2$/V·s and 0.3 cm$^2$/V·s or less, respectively.

23 Claims, 24 Drawing Sheets

OTHER PUBLICATIONS

Lee. C et al., "How to Achieve High Mobility Thin Film Transistors by Direct Deposition of Silicon Using 13.56 MHz RF PECVD?," IEDM, 2006, pp. 295-298.

Lee. H et al., "Leakage Current Mechanisms in Top-Gate Nanocrystalline Silicon Thin-Film Transistors," Appl. Phys. Lett. (Applied Physics Letters), Feb. 28, 2008, vol. 92, pp. 083509-1-083509-3.

Esmaeili-Rad. M et al:, "Absence of Defect State Creation in Nanocrystalline Silicon Thin Film Transistors Deduced from Constant Current Stress Measurements," Appl. Phys. Lett. (Applied Physics Letters), Sep. 12, 2007, vol. 91, pp. 113511-1-113511-3.

Lee. C et al., "Stability of nc-Si:H TFTs with Silicon Nitride Gate Dielectric,", IEEE Transactions of Electron Devices, Jan. 2007, vol. 54, No. 1, pp. 45-51.

Sazonov. A et al., "Low-Temperature Materials and Thin Film Transistors for Flexible Electronics," Proceedings of the IEEE, Aug. 1, 2005, vol. 93, No. 8, pp. 1420-1428.

Esmaeili-Rad. M et al., "Stability of Nanocrystalline Silicon Bottom-Gate Thin Film Transistors with Silicon Nitride Gate Dielectric," J. Appl. Phys. (Journal of Applied Physics), Sep. 28, 2007, vol. 102, pp. 064512-1-064512-7.

Lee. C et al., "Top-Gate TFTs Using 13.56 MHz PECVD Microcrystalline Silicon," IEEE Electron Device Letters, Sep. 5, 2005, vol. 26, No. 9, pp. 637-639.

Lee. C et al., "Postdeposition Thermal Annealing and Material Stability of 75° C. Hydrogenated Nanocrystalline Silicon Plasma-Enhanced Chemical Vapor Deposition Films," J. Appl. Phys. (Journal of Applied Physics). Aug. 4, 2005, vol. 98, pp. 034305-1-034305-7.

* cited by examiner

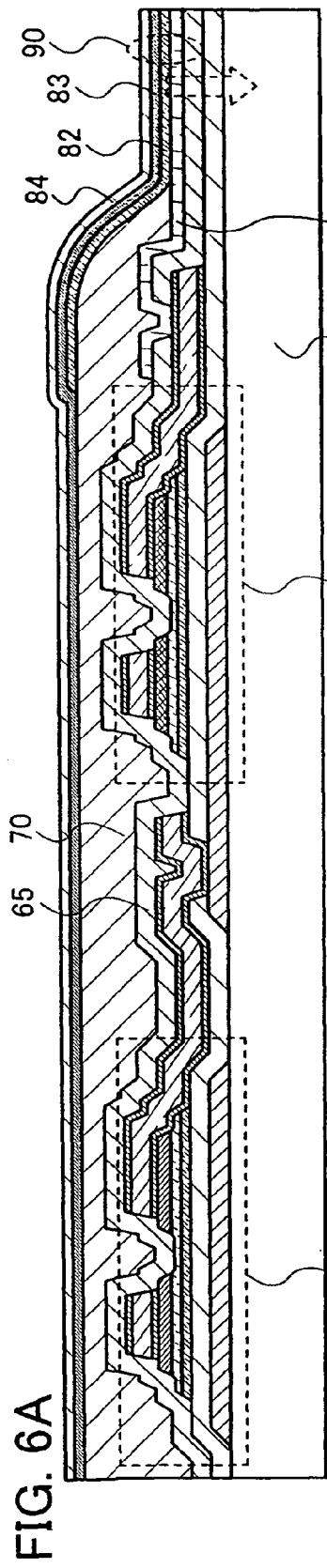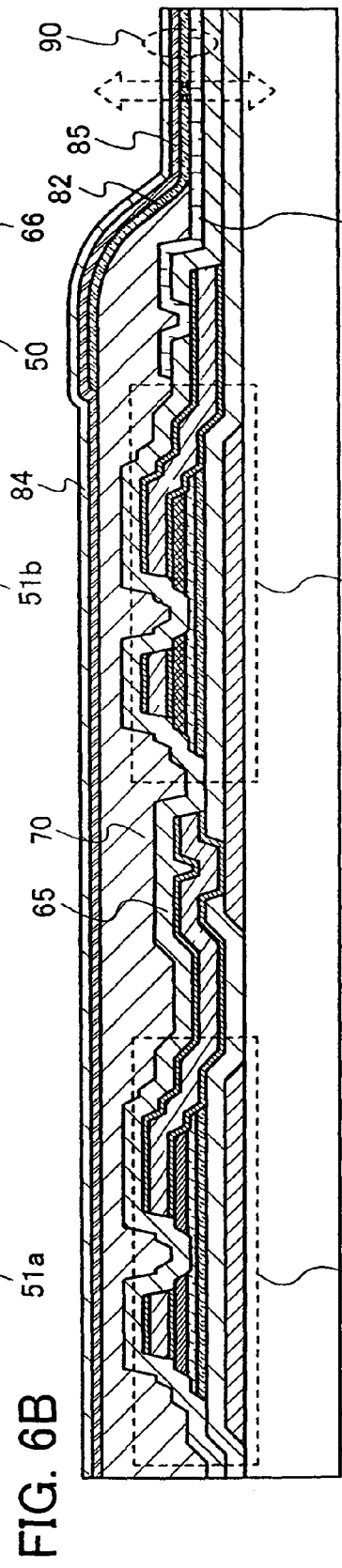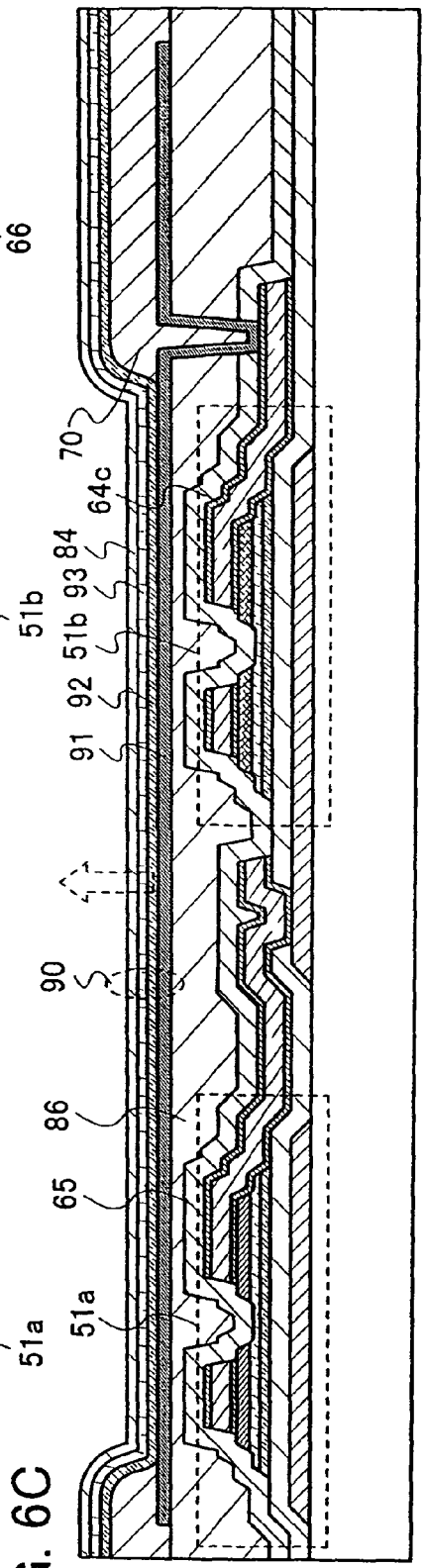

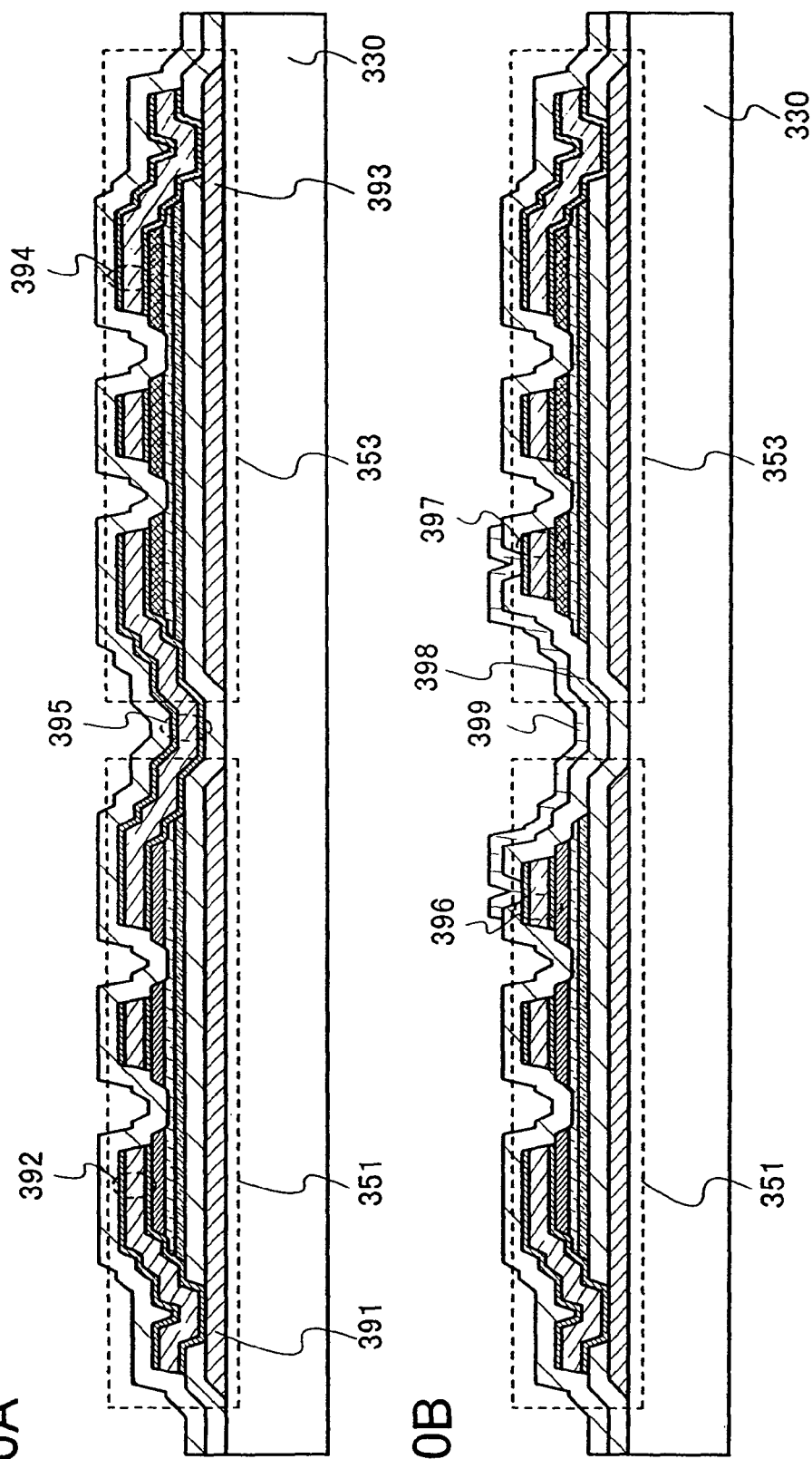

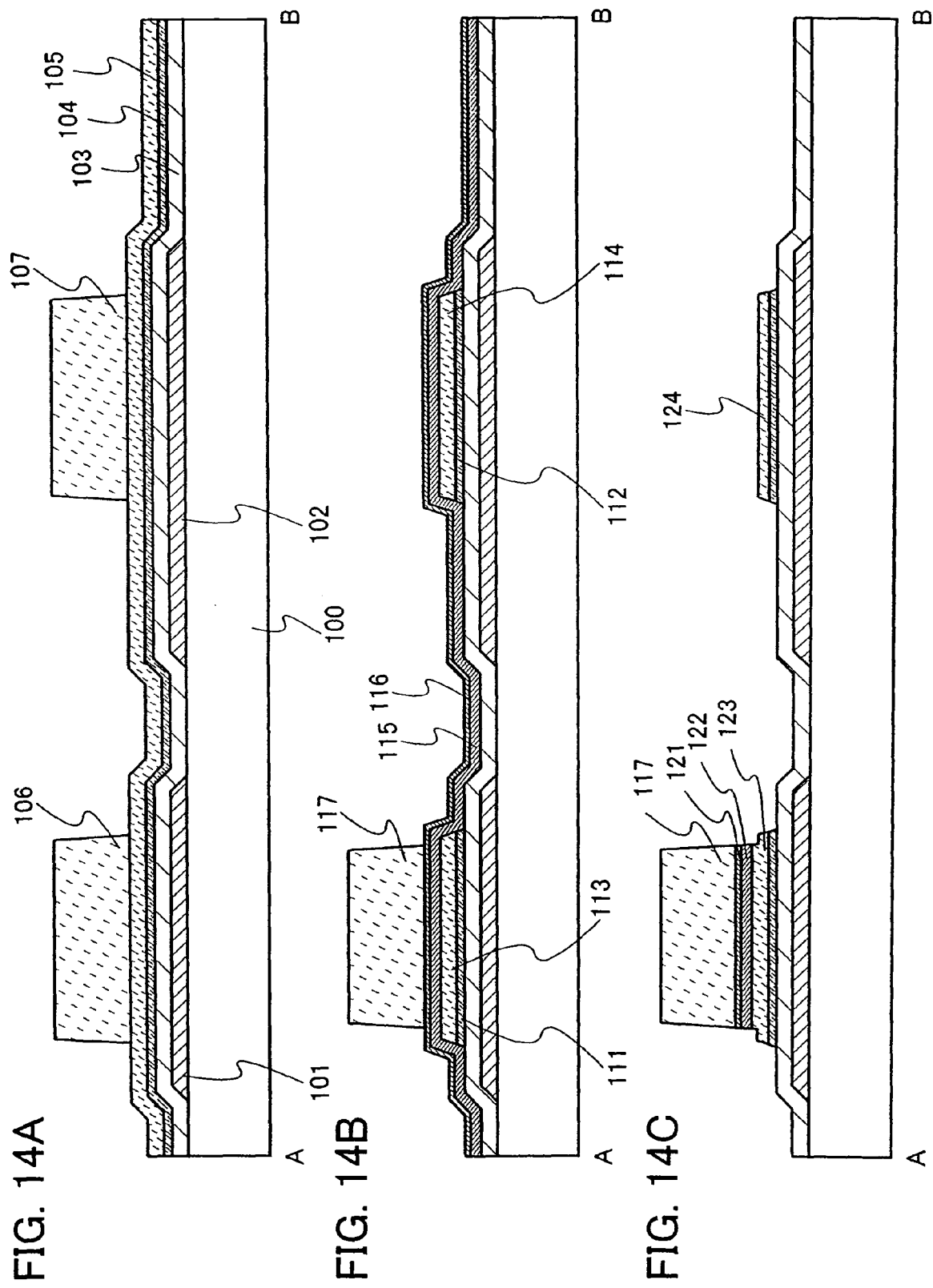

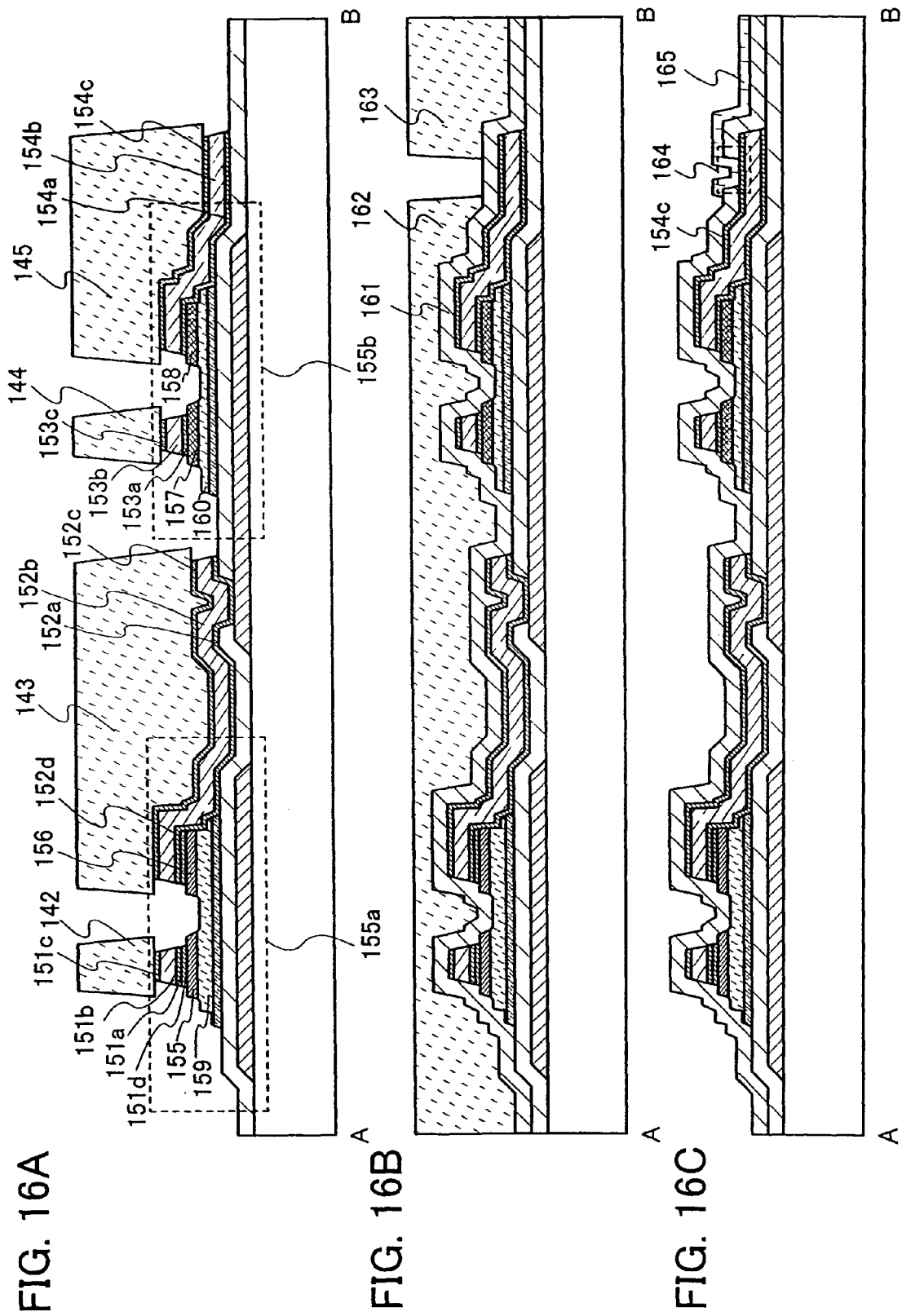

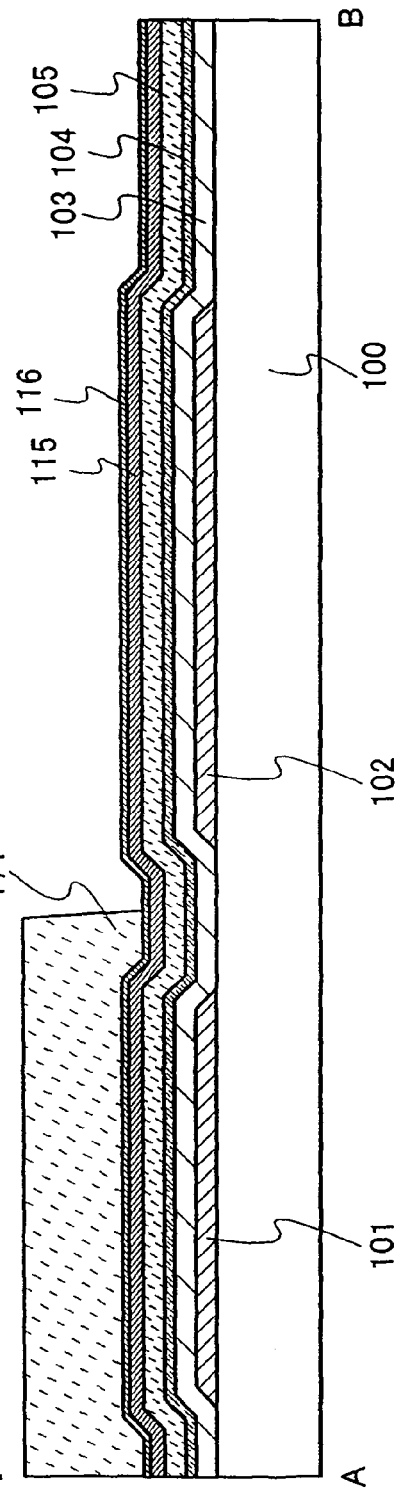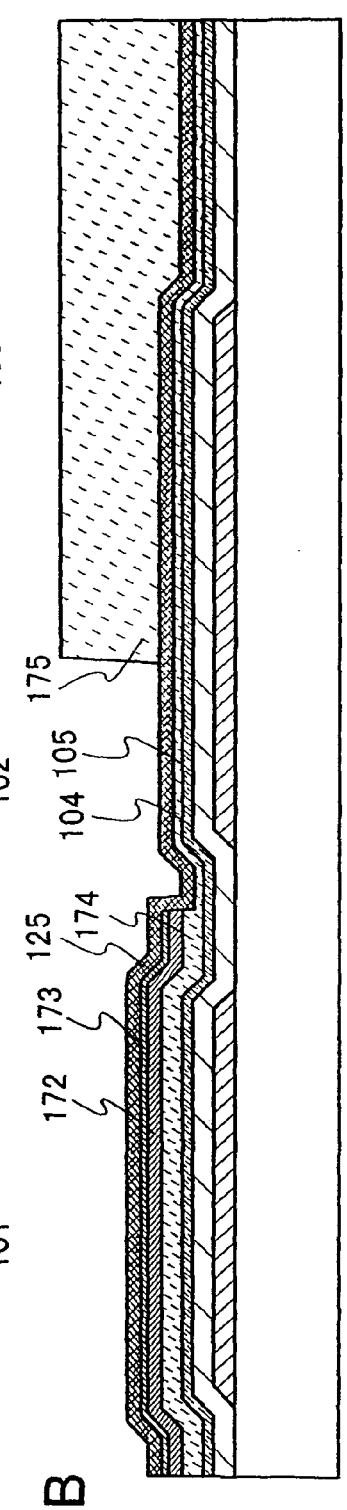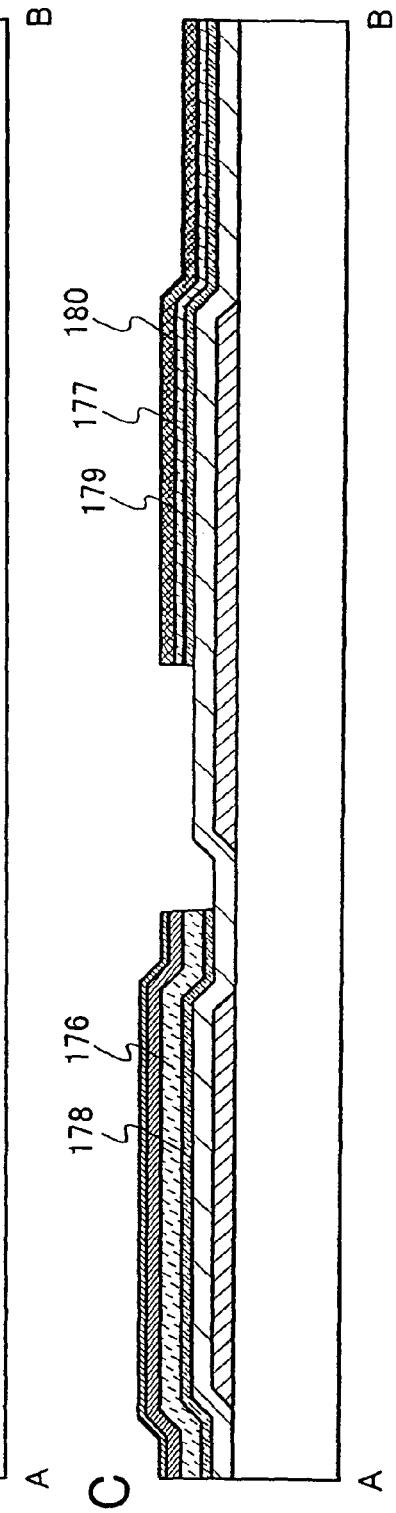

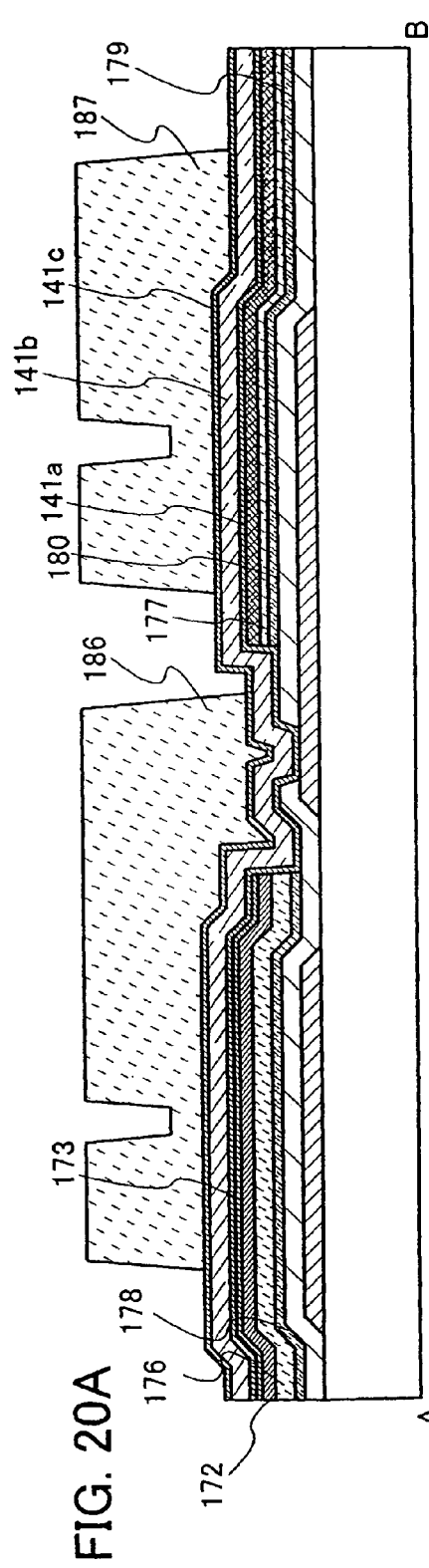
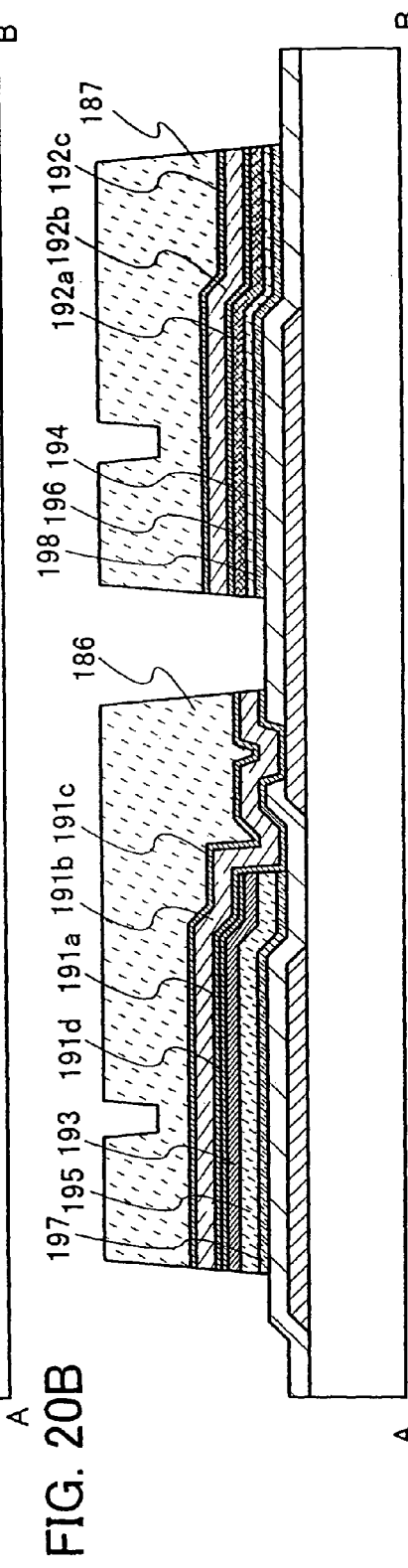
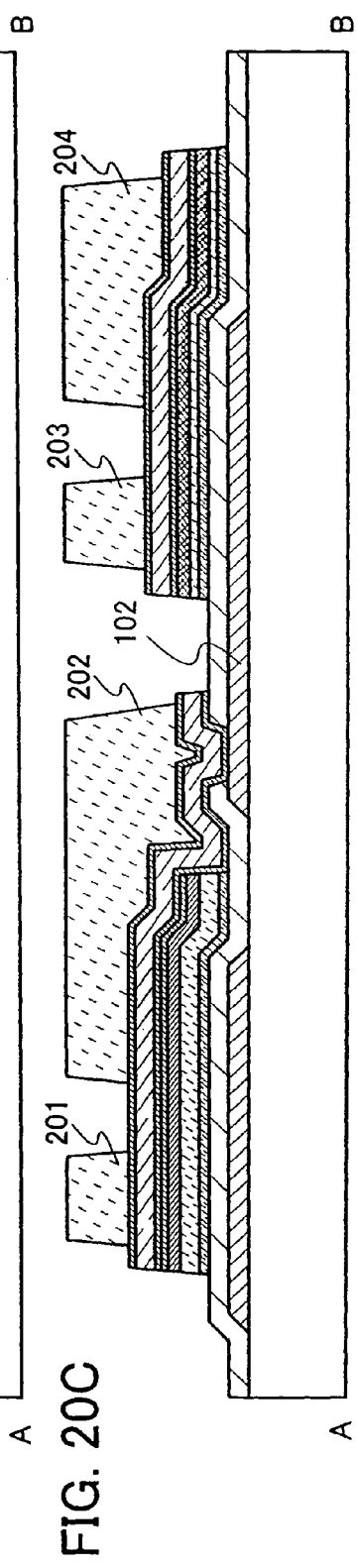
FIG. 20A
FIG. 20B
FIG. 20C

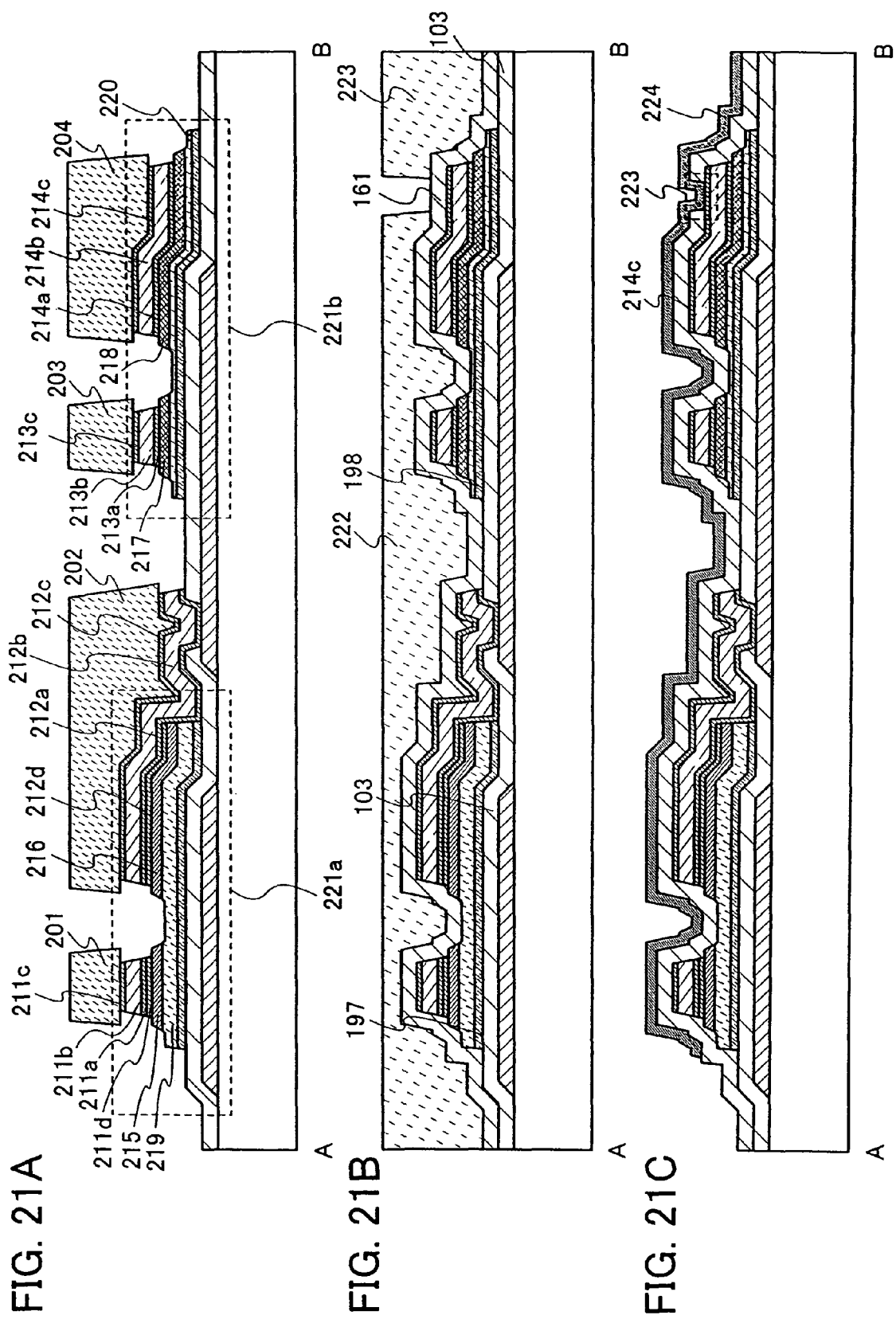

DISPLAY DEVICE

BACKGROUND OF THE INVENTION

1. Field of the Invention

The present invention relates to a display device using an n-channel thin film transistor and a p-channel thin film transistor.

2. Description of the Related Art

In recent years, a technology to form thin film transistors using semiconductor thin films (with a thickness of approximately several tens to several hundreds of nanometers) that are formed over substrates having an insulating surface has attracted attention. Thin film transistors have been widely applied to electronic devices such as ICs and electro-optical devices and rapidly developed especially as switching elements for image display devices.

A Thin film transistor using an amorphous silicon film for a channel formation region, a thin film transistor using a polycrystalline silicon film for a channel formation region, or the like are used as a switching element in an image display device. As a method for forming polycrystalline silicon films, a technology is known in which a pulsed excimer laser beam is processed into a linear shape by an optical system and an amorphous silicon film is scanned and irradiated with the linear beam for crystallization.

In addition, as switching elements of image display devices, thin film transistors using a microcrystalline silicon film as a channel formation region are used (Patent Document 1: Japanese Published Patent Application No. H4-242724, Non-Patent Document 1: Toshiaki Arai et al., SID 07 DIGEST, 2007, pp. 1370-1373).

A thin film transistor using a polycrystalline silicon film for a channel formation region has an advantage in that mobility is higher than that of a thin film transistor using an amorphous silicon film for a channel formation region by two or more digits, and a pixel portion and a peripheral driver circuit of a semiconductor display device can be formed over the same substrate. However, the thin film transistor using a polycrystalline silicon film for a channel formation region requires a more complicated process than the thin film transistor using an amorphous silicon film for a channel formation region because crystallization of the semiconductor film is required. Therefore, there are problems such as reduction in yield and increase in cost. Further, the sizes of crystal grains of a polycrystalline silicon film formed by irradiating an amorphous silicon film with an excimer laser beam readily vary because energy of the laser beam varies. Therefore, electric characteristics of a thin film transistor vary when it is formed using such a polycrystalline silicon.

On the other hand, the manufacturing process of a thin film transistor using an amorphous silicon film for a channel formation region is simple, since it can be formed with a few photomasks. However, fluctuation of the threshold of the thin film transistor is large and the mobility of the thin film transistor is low. Moreover, it is difficult to manufacture a p-channel thin film transistor when an amorphous silicon film is employed for a channel formation region.

In the case of an inverted-staggered thin film transistor using a microcrystalline silicon film for a channel formation region, crystallinity in an interface region of a gate insulating film and a microcrystalline semiconductor film is low and electric characteristics of the thin film transistor is poor. Additionally, it is difficult to manufacture an inverted-staggered p-channel thin film transistor when a microcrystalline silicon film is used for a channel formation region.

SUMMARY OF THE INVENTION

In view of above-mentioned problems, an object of the present invention is to offer a display device including an n-channel thin film transistor and a p-channel thin film transistor each having excellent electric characteristics and high reliability and a method for manufacturing the display device with high productivity.

One aspect of the present invention is a display device including an inverted-staggered p-channel thin film transistor and an inverted-staggered n-channel thin film transistor. In each of the p-channel thin film transistor and the n-channel thin film transistor, a gate insulating film, a microcrystalline semiconductor film, and an amorphous semiconductor film are sequentially stacked over a gate electrode, a pair of n-type or p-type semiconductor films are formed over the amorphous semiconductor films, and a pair of wirings are formed over the pair of n-type or p-type semiconductor films. The microcrystalline semiconductor film contains oxygen at a concentration of $1 \times 10^{16}$ atoms/cm$^3$ or less. Mobilities of the n-channel thin film transistor and the p-channel thin film transistor are from 10 to 45 cm$^2$/V·s and 0.3 cm$^2$/V·s or less, respectively.

In a step of manufacturing the inverted-staggered p-channel thin film transistor and the inverted-staggered n-channel thin film transistor, a substrate is set in a chamber in which ultra high vacuum evacuation with a pressure of lower than $10^{-5}$ Pa is performed, and a microcrystalline semiconductor film containing oxygen at a concentration of $1 \times 10^{16}$ atoms/cm$^3$ or less is formed by a plasma CVD method at a substrate temperature of 100 to 300° C., preferably 120 to 280° C., more preferably 120 to 220° C.

Formation of a microcrystalline semiconductor film is hindered by oxygen. However, ultra high vacuum evacuation in a deposition chamber enables promotion of the formation of the microcrystalline semiconductor film because the oxygen concentration in the chamber can be reduced. In addition, oxygen results in a defect and functions as a donor in the microcrystalline semiconductor film. Therefore, particularly in the p-channel thin film transistor, the concentration of oxygen which functions as a donor can be reduced, thereby the mobility of the p-channel thin film transistor can be raised.

When a deposition temperature of the microcrystalline semiconductor film is set at 100 to 300° C., preferably 120 to 280° C., more preferably 120 to 220° C., lattice distortion at the interface between the gate insulating film and the microcrystalline semiconductor film can be reduced and characteristics of the interface between the gate insulating film and the microcrystalline semiconductor film can be improved. Therefore, electric characteristics of the thin film transistor having the microcrystalline semiconductor film can be improved.

One aspect of the present invention is a display device including a pixel in which an inverted-staggered p-channel thin film transistor and an inverted-staggered n-channel thin film transistor function as a switch of a display element. Typical examples of the display device include liquid crystal display devices, light-emitting display devices, and the like. Liquid crystal display devices include liquid crystal elements. Light-emitting display devices include light-emitting elements. The light-emitting element includes elements of which luminance is controlled by a current or a voltage, and specifically includes inorganic electroluminescence (EL) elements, organic EL elements, and the like.

One aspect of the present invention is a display device including a protective circuit on the periphery of a pixel portion, in which each of an inverted-staggered p-channel thin film transistor and an inverted-staggered n-channel thin film transistor is diode-connected. The protective circuit is provided between the pixel portion and a driver circuit, or over the opposite side of the driver circuit across the pixel portion, so that damages and deterioration due to static electricity can be prevented.

One aspect of the present invention is a display device including a p-channel thin film transistor and an n-channel thin film transistor each formed using a microcrystalline semiconductor film in a pixel portion and a driver circuit. A part of or whole of the driver circuit is formed over a substrate, over which the pixel portion is formed, by using the n-channel thin film transistor and the p-channel thin film transistor each formed using a microcrystalline semiconductor film for a channel formation region, so that a system-on-panel can be formed.

In addition, the display device includes a panel in which a display element is sealed and a module in which an IC such as a controller or the like is mounted on the panel. The present invention further relates to one mode of an element substrate before the display element is completed in the manufacturing process of the display device, and the element substrate is provided with a means for applying a current or a voltage to the display element in each of a plurality of pixels. As for the element substrate, specifically, only a pixel electrode of the display element is formed or a conductive film to be a pixel electrode has been deposited and the conductive film is not etched yet to form a pixel electrode. Alternatively, any other mode may be applied to the element substrate.

Note that the display device in this specification refers to an image display device, a light-emitting device, or a light source (including a lighting device). Further, the display device includes any of the following modules in its category: a module on which a connector such as a flexible printed circuit (FPC), a tape automated bonding (TAB) tape, or a tape carrier package (TCP) is mounted; a module having a TAB tape or a TCP provided with a printed wiring board at the end thereof; and a module having an integrated circuit (IC) directly mounted on a display element by a chip on glass (COG) method.

According to the present invention, a display device including an n-channel thin film transistor and a p-channel thin film transistor each having excellent electric characteristics and high reliability can be manufactured with high productivity.

BRIEF DESCRIPTION OF THE DRAWINGS

FIGS. 6A to 6C are cross-sectional views illustrating the structure of a display device of the present invention.

FIGS. 10A and 10B are cross-sectional views illustrating a structure of the protective circuit which can be applied to a display device of the present invention.

FIGS. 14A to 14C are cross-sectional views illustrating a method for manufacturing a display device of the present invention.

FIGS. 16A to 16C are cross-sectional views illustrating a method for manufacturing a display device of the present invention.

FIGS. 18A to 18C are cross-sectional views illustrating a method for manufacturing a display device of the present invention.

FIGS. 20A to 20C are cross-sectional views illustrating a method for manufacturing a display device of the present invention.

FIGS. 21A to 21C are cross-sectional views illustrating a method for manufacturing a display device of the present invention.

DETAILED DESCRIPTION OF THE INVENTION

Figure 1B:
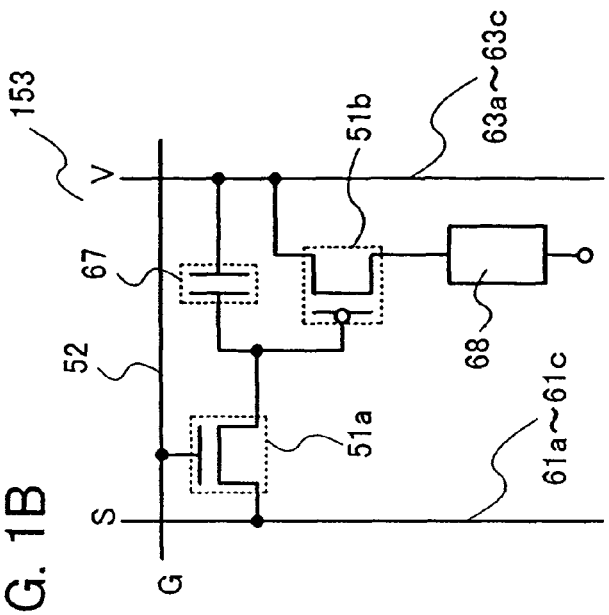
FIGS. 1A to 1C are a top plan view, an equivalent circuit diagram, and a cross-sectional view each illustrating the structure of a display device of the present invention.

Hereinafter, embodiment modes of the present invention will be described with reference to the accompanying drawings. However, the present invention can be carried out in many different modes, and it is easily understood by those skilled in the art that modes and details thereof can be modified in various ways without departing from the spirit and scope of the present invention. Therefore, the present invention should not be construed as being limited to the description in the following embodiment modes and embodiments. Note that, in the drawings hereinafter illustrated, the same portions or portions having similar functions are denoted by the same reference numerals, and repeated description thereof will be omitted.

Embodiment Mode 1

Figure 1A:
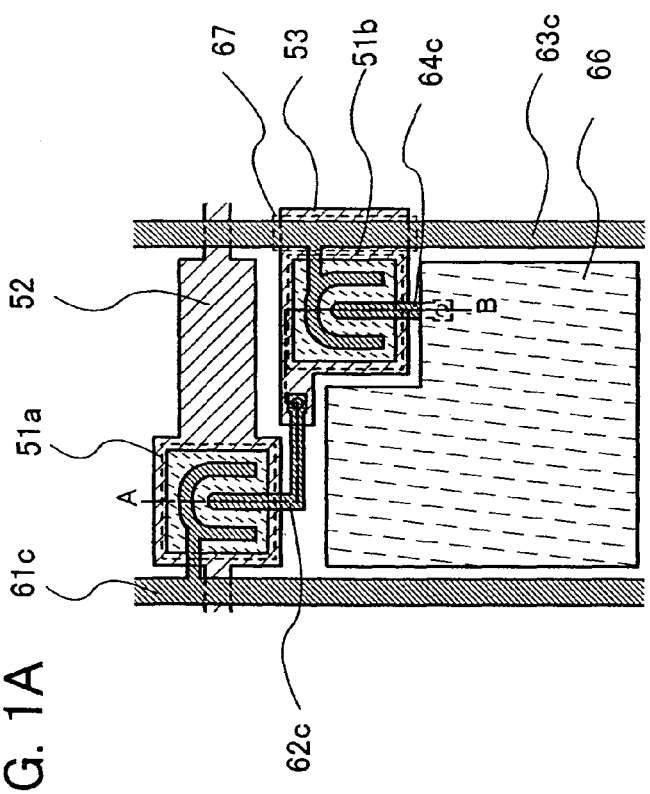
Figure 1C:
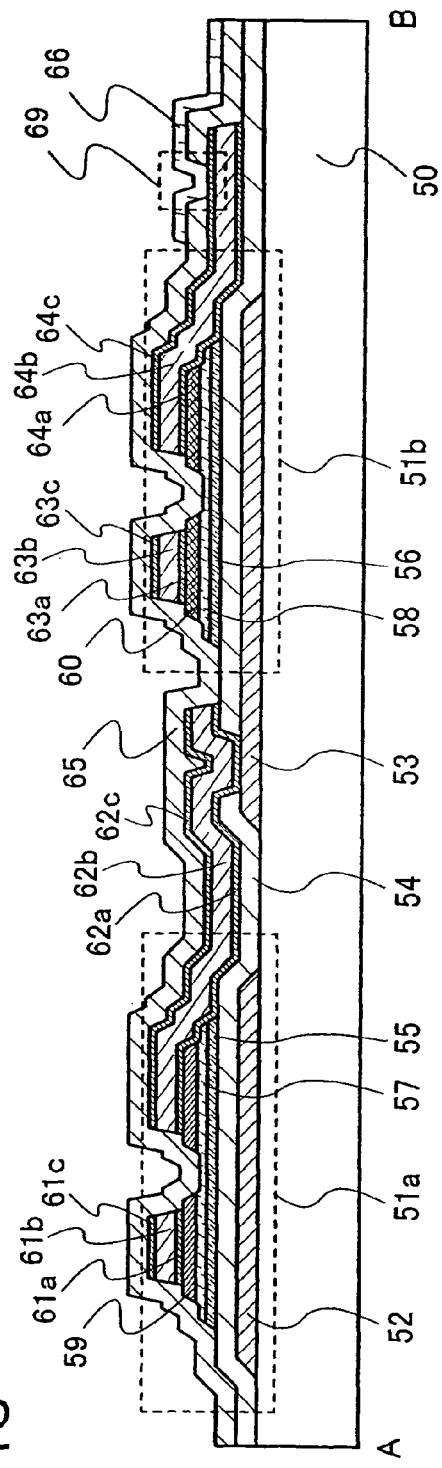

The structure of a pixel included in a display device of this embodiment mode is described. FIG. 1A illustrates one mode of the top plan view of a pixel. FIG. 1B illustrates one mode of the equivalent circuit diagram of a pixel. FIG. 1C illustrates one mode of the cross-sectional structure of a pixel along A-B in FIG. 1A.

In FIGS. 1A to 1C, a first thin film transistor 51a and a second thin film transistor 51b correspond to a switching thin film transistor for controlling input of a signal to a pixel electrode or a driving thin film transistor for controlling current or voltage application to a light-emitting element 68.

A gate electrode of the first thin film transistor 51a is connected to a scan line 52, one of a source or a drain of the first thin film transistor 51a is connected to wirings 61a to 61c which function as signal lines, and the other of the source or the drain is connected to a gate electrode 53 of the second thin film transistor 51b. One of a source or a drain of the second thin film transistor 51b is connected to wiring 63a to 63c which function as power supply lines, and the other of the source or the drain is connected to a pixel electrode 66 of a display device. Further, as shown in FIG. 1B, the other of the source or the drain of the first thin film transistor 51a and the gate of the second thin film transistor 51b are connected to a capacitor 67, and the capacitor 67 is connected to the wirings 63a to 63c which function as power supply lines.

Note that the capacitor 67 corresponds to a capacitor for holding a voltage between the gate and the source or between the gate and the drain of the second thin film transistor 51b (hereinafter referred to as a gate voltage) when the first thin film transistor 51a is off, and is not necessarily provided.

In this embodiment mode, the first thin film transistor 51a is formed using an n-channel thin film transistor, and the second thin film transistor 51b is formed using a p-channel thin film transistor. Note that the first thin film transistor 51a may be formed using a p-channel thin film transistor, and the second thin film transistor 51b may be formed using an n-channel thin film transistor.

Next, the structures of the first thin film transistor 51a and the second thin film transistor 51b are described with reference to FIG. 1C.

In the first thin film transistor 51a, a gate electrode 52, a gate insulating film 54, a microcrystalline semiconductor film 55, a buffer layer 57, a pair of n-type semiconductor films 59, and wirings 61a to 61c, and 62a to 62c are formed in this order over a substrate 50. A mobility of the first thin film transistor 51a is from 10 to 45 cm$^2$/V·s.

In the second thin film transistor 51b, a gate electrode 53, a gate insulating film 54, a microcrystalline semiconductor film 56, a buffer layer 58, a pair of p-type semiconductor films 60, and wirings 63a to 63c, and 64a to 64c are formed in this order over the substrate 50. The wiring 62a of the first thin film transistor 51a and the gate electrode 53 of the second thin film transistor 51b are connected in a contact hole of the gate insulating film 54. A mobility of the second thin film transistor 51b is 0.3 cm$^2$/V·s or less.

In this embodiment mode, the microcrystalline semiconductor films 55 and 56 serve as channel formation regions of the first thin film transistor 51a and the second thin film transistor 51b, respectively, and a concentration of oxygen contained in the microcrystalline semiconductor films 55 and 56 is $1\times10^{16}$ atoms/cm$^3$ or less. Oxygen in the microcrystalline semiconductor film is a defect. Thus, such a defect in the film can be reduced by reducing the concentration of oxygen in the microcrystalline semiconductor films 55 and 56, thereby the mobility of a carrier can be improved. In addition, since the microcrystalline semiconductor film is used for a channel formation region, fluctuation of threshold can be suppressed. Thus, electric characteristics of the first thin film transistor 51a and the thin film transistor 51b can be improved. Furthermore, in a p-channel thin film transistor, the mobility of the p-channel thin film transistor can be raised by reducing the concentration of oxygen which serves as a donor. Thus, with an inverted-staggered thin film transistor using a microcrystalline semiconductor film for a channel formation region, a p-channel thin film transistor can be manufactured.

The buffer layers 57 and 58 are provided between the microcrystalline semiconductor film 55 and the n-type semiconductor film 59, and between the microcrystalline semiconductor film 56 and the p-type semiconductor film 60. The buffer layers 57 and 58 serve as protective layers to prevent the oxidation of the microcrystalline semiconductor films 55 and 56 and serve as high-resistance regions as well. Thus, decrease of the mobility due to formation of an oxide in the microcrystalline semiconductor films 55 and 56 can be prevented and an off current of a thin film transistor can be reduced. Therefore, contrast of a display device can be improved.

Note that, in this embodiment mode, an equivalent circuit of the pixel is not limited to FIG. 1B. The equivalent circuit of the pixel may include an inverted-staggered p-channel thin film transistor, an inverted-staggered n-channel thin film transistor, and a pixel electrode connected to the inverted-staggered p-channel thin film transistor or the inverted-staggered n-channel thin film transistor.

As the substrate 50, a non-alkaline glass substrate manufactured by a fusion method or a float method, such as a barium borosilicate glass substrate, an aluminoborosilicate glass substrate, or an aluminosilicate glass substrate; a ceramic substrate; a plastic substrate having heat resistance that can withstand a processing temperature of the manufacturing process of this embodiment mode; or the like can be used. Alternatively, a metal substrate such as a stainless steel alloy substrate, which is provided with an insulating film over its surface, may be used. When the substrate 50 is a mother glass, any of the following sizes of the substrate can be used; the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

The gate electrodes 52 and 53 and a capacitor electrode (not shown) are formed of a metal material. Aluminum, chromium, titanium, tantalum, molybdenum, copper, or the like is applied as a metal material. Preferred examples of the gate electrodes 52 and 53 and the capacitor electrode are each formed using aluminum or a stacked structure of aluminum and barrier metal. As barrier metal, refractory metal such as titanium, molybdenum, or chromium is applied. It is preferable to provide a barrier metal in order to prevent hillock and oxidation of aluminum. Since a semiconductor film or a wiring is formed over the gate electrodes 52 and 53, the gate electrodes 52 and 53 are preferably processed to have tapered end portions for preventing disconnection.

The gate electrodes 52 and 53 are formed by a sputtering method, a CVD method, a vapor deposition method, a printing method, a droplet discharge method, or the like. Note that in the case of a sputtering method, a CVD method, or the like, the gate electrodes 52 and 53 and the capacitor electrode are formed in such a manner that after a metal material film is formed over an entire surface of the substrate 50, the metal material film is partially etched using a resist mask formed through a photolithography process.

The gate insulating film 54 is formed with an insulating material such as silicon nitride, silicon oxide, silicon nitride oxide, silicon oxynitride, aluminum nitride, or aluminum nitride oxide with a thickness of from 50 to 300 nm.

As an example of the gate insulating film 54, there is a structure in which a silicon nitride film (or a silicon nitride oxide film) is provided, as a first gate insulating film, over the gate electrodes 52 and 53 and a capacitor electrode, and a silicon oxide film (or a silicon oxynitride film) is provided thereover as a second gate insulating film. In this manner, the gate insulating film 54 can have a plurality of functions by being formed of a plurality of layers. For example, impurity diffusion from the element substrate can be prevented by providing a silicon nitride film (or a silicon nitride oxide film) as the first gate insulating film. As another effect, oxidation of the gate electrodes 52 and 53 or the like can be prevented. Alternatively, when aluminum is used for the gate electrodes 52 and 53, hillock of aluminum can be prevented. A silicon oxide film (or a silicon oxynitride film) is provided as the second gate insulating film, which allows for higher adhesion with the microcrystalline silicon film formed thereover and prevention of deformation of the first gate insulating film due to stress. It is preferable that the first gate insulating film is formed to a thickness of from 10 to 100 nm, and the second gate insulating film is formed to a thickness of from 50 to 150 nm. Further, a silicon nitride film with a thickness of from 5 to 10 nm may be formed over the silicon oxide film. In particular, when a display device is a light-emitting display device, it is preferable that the gate insulating film withstand a high voltage because a light-emitting display device is operated by DC driving. Thus, it is preferable that the gate insulating film have the three-layer structure as described above. Further, fluctuation of the threshold can be suppressed by using silicon oxynitride or silicon oxide for a gate insulating film.

The gate insulating film 54 is formed by a sputtering method, a CVD method, a coating method, or the like.

The microcrystalline semiconductor films 55 and 56 are films each including a semiconductor having an intermediate state between amorphous and crystalline structures (including single-crystal and polycrystalline structures). This semiconductor is a semiconductor having a third state that is stable in terms of free energy (i.e., thermodynamically stable) and is a crystalline substance having a short-range order and lattice distortion, and column-like or needle-like crystals with a grain size of 0.5 to 50 nm, preferably 1 to 20 nm grown in the direction of a normal line with respect to a surface of the substrate. In addition, a microcrystalline semiconductor and a non-single crystal semiconductor are mixed. A peak of the Raman spectrum of the microcrystalline silicon which is a typical example of a microcrystalline semiconductor is shifted toward lower wavenumber than 520.5 $cm^{-1}$ which is attributed to the peak of the Raman spectrum of single-crystal silicon. In other word, a peak of a Raman spectrum of microcrystalline silicon lies between 520.5 $cm^{-1}$ which represents that of single-crystal silicon, and 480 $cm^{-1}$ which represents that of amorphous silicon. The semiconductor includes at least 1 at. % of hydrogen or halogen to terminate a dangling bond. Moreover, a rare gas element such as helium, argon, krypton, or neon may be contained to further promote lattice distortion, so that stability is enhanced and a favorable microcrystalline semiconductor film can be obtained. Such description about a microcrystalline semiconductor film is disclosed in, for example, U.S. Pat. No. 4,409,134.

A thickness of each of the microcrystalline semiconductor films 55 and 56 is from 10 to 500 nm (preferably, from 100 to 250 nm). A thickness of each of the microcrystalline semiconductor film 55 and 56 is from 10 nm to 500 nm, so that a thin film transistor to be formed later is a fully depleted type. As each of the microcrystalline semiconductor films 55 and 56, a microcrystalline silicon film or a microcrystalline silicon film to which germanium or carbon is added is formed.

The microcrystalline semiconductor film shows low n-type conductivity when an impurity element for controlling valence electrons is not added thereto intentionally. Therefore, an impurity element imparting p-type conductivity may be added to the microcrystalline semiconductor film which functions as a channel formation region of a thin film transistor at the same time as or after deposition of the microcrystalline semiconductor film, so that the threshold may be controlled. A typical example of the impurity element imparting p-type conductivity is boron, and an impurity gas such as $B_2H_6$ or $BF_3$ may be added to silicon hydride at a proportion of from 1 to 1000 ppm, preferably from 1 to 100 ppm. A concentration of boron is preferably set at, for example, from $1 \times 10^{14}$ to $6 \times 10^{16}$ atoms/$cm^3$.

A concentration of each of nitrogen and carbon in the microcrystalline semiconductor film is preferably $3 \times 10^{18}$ atoms/$cm^3$ or less. By reducing the concentration of impurities in the microcrystalline semiconductor film, defects in the microcrystalline semiconductor film can be reduced.

A deposition method of the microcrystalline semiconductor films 55 and 56 is described in Embodiment Mode 2 in detail.

The buffer layers 57 and 58 are each formed using an amorphous semiconductor film with a thickness of 50 to 400 nm. An amorphous silicon film is typically used. Alternatively an amorphous silicon film containing one or more of nitrogen, fluorine, chlorine, helium, argon, krypton, and neon is used.

The buffer layers 57 and 58 are formed using silicon hydride such as $SiH_4$ or $Si_2H_6$ by a plasma CVD method. The silicon hydride is diluted with one of a plurality of rare gas elements selected from helium, argon, krypton, or neon, so that an amorphous semiconductor film can be formed. An amorphous semiconductor film containing hydrogen can be formed using hydrogen with a flow rate of 1 to 10 times, preferably 1 to 5 times as high as that of silicon hydride. Furthermore, the buffer layers 57 and 58 are formed by adding one or more kinds of gas containing nitrogen, ammonia, fluorine, chlorine, bromine, and iodine ($F_2$, $Cl_2$, HF, HCl, or the like) to the source gas.

Alternatively, the buffer layers 57 and 58 may be formed by a sputtering method.

An impurity element imparting one conductivity type for controlling valence electrons is added to the n-type semiconductor film 59 and the p-type semiconductor film 60. Phosphorus or arsenic is added to the n-type semiconductor film 59, and boron is added to the p-type semiconductor film 60. A typical example of the n-type semiconductor film 59 is an amorphous silicon or microcrystalline silicon film to which phosphorus is added, and a typical example of the p-type semiconductor film 60 is an amorphous silicon or microcrystalline silicon film to which boron is added.

Wirings 61*a* to 61*c*, 63*a* to 63*c* are extended in a direction perpendicular to the scan line connected to the gate electrode 52 and are given the potential of a source or a drain of the first thin film transistor 51*a*. Wirings 62*a* to 62*c* are connected to the gate electrode 53 of the second thin film transistor 51*b* and are given the potential of the gate electrode of the second thin film transistor 51*b*. Wirings 64*a* to 64*c* are connected to a pixel electrode and are given the potential of a drain or a source of the second thin film transistor 51*a*.

The wirings 61*a* to 61*c*, 62*a* to 62*c*, 63*a* to 63*c*, and 64*a* to 64*c* are preferably formed using aluminum, copper, or aluminum added with elements for improving heat resistance, such as silicon, titanium, neodymium, or scandium. An aluminum film is formed by a sputtering method or a vapor deposition method, and a predetermined pattern is formed using a photolithography technique. Alternatively, the wirings may be formed using a conductive nanopaste of silver, copper, or the like by a screen-printing method, an ink-jet method, or a nano-imprinting method.

The wirings 61a to 61c, 62a to 62c, 63a to 63c, and 64a to 64c may be formed using aluminum, copper, or the like as described above. Alternatively, a layered structure combined with a conductive material serving as a barrier layer which improves adhesion with a base and prevents diffusion may be used. For example, the wirings 61a to 64a serving as barrier layers are formed with refractory metal such as molybdenum, chromium, titanium, tantalum, or titanium nitride, the wirings 61b to 64b are formed with the above-mentioned aluminum or aluminum added with an element for improving heat resistance, and the wirings 61c to 64c are formed with similar conductive materials to the wirings 61a to 64a.

A protective insulating film 65 is formed so as to cover the buffer layers 57 and 58, the wirings 61a to 61c, 62a to 62c, 63a to 63c, and 64a to 64c. The protective insulating film 65 is preferably formed with silicon nitride or silicon nitride oxide. A contact hole 69 in which wiring 64c is exposed is formed in the protective insulating film 65.

The protective insulating film 65 is formed by a sputtering method or a CVD method.

The pixel electrode 66 is connected to the wiring 64c in the contact hole 69. The pixel electrode 66 is formed with a conductive material having a light transmitting property, such as indium tin oxide, zinc oxide, or tin oxide. Alternatively, a conductive material having light shielding property, such as aluminum, aluminum nitride, titanium, titanium nitride, tantalum, tantalum nitride, or silver is used. Still alternatively, an organic conductive material may be used.

Note that FIG. 1C illustrates a channel-etched thin film transistor, in which when the wirings 61a to 61c, 62a to 62c, 63a to 63c, and 64a to 64c, the n-type semiconductor film 59 and the p-type semiconductor film 60 are separated, part of the buffer layers 57 and 58 are also etched so that a depression is formed in part of the buffer layers 57 and 58, as each of the film transistors 51a and 51a. However, the present invention is not limited to this.

Figure 2:
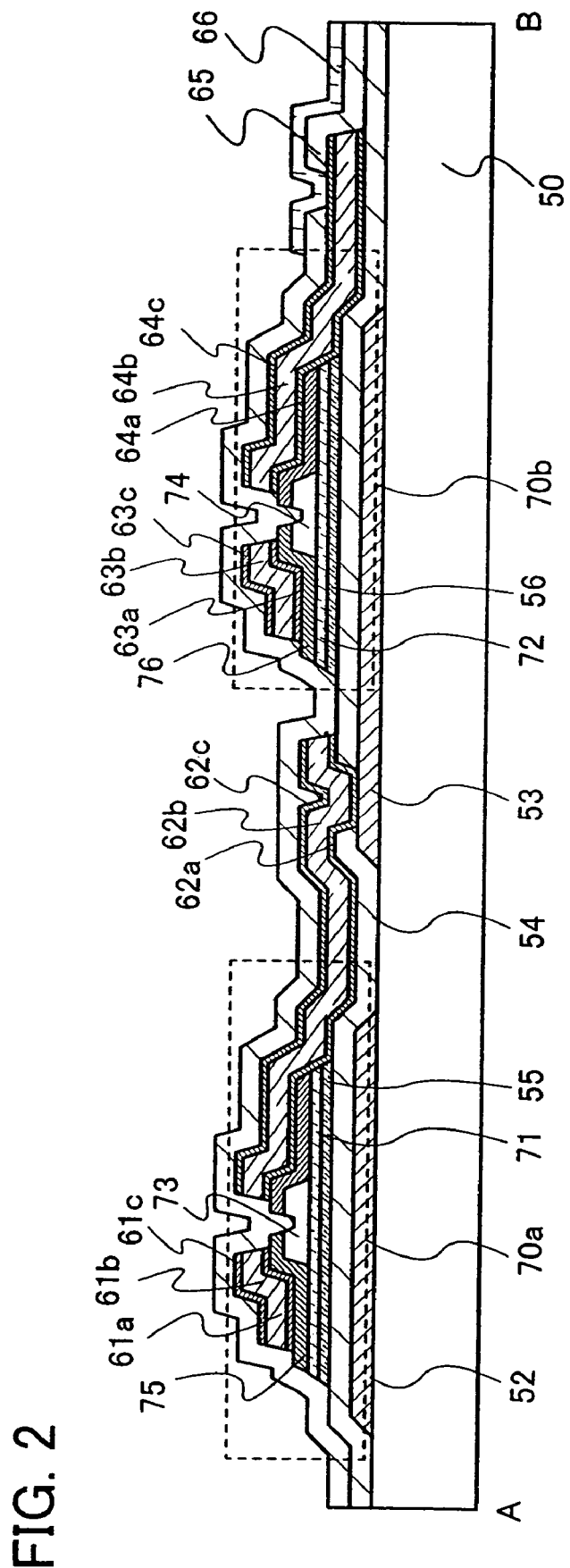
FIG. 2 is a cross-sectional view illustrating the structure of a display device of the present invention.

As illustrated in FIG. 2, a channel protective thin film transistor can be used as a first thin film transistor 70a which is fabricated by forming the gate insulating film 54, the microcrystalline semiconductor film 55, a buffer layer 71, a channel protective film 73, a pair of n-type semiconductor films 75, a pair of the wirings 61a to 61c, and 62a to 62c in this order over the gate electrode 52. Similarly, a channel protective thin film transistor can be applied as a second thin film transistor 70b which is fabricated by forming the gate insulating film 54, a microcrystalline semiconductor film 56, a buffer layer 72, a channel protective film 74, a pair of p-type semiconductor films 76, a pair of the wirings 63a to 63c, and 64a to 64c in this order over the gate electrode 53.

Note that FIG. 1C and FIG. 2 illustrate a thin film transistor of a single-gate structure. Alternatively, a multi-gate structure in which a plurality of thin film transistors are serially connected, and the plurality of thin film transistors shares one microcrystalline semiconductor film may be employed. An off current of the thin film transistor can be reduced by employing the multi-gate structure.

The display device described in this embodiment mode includes a pixel formed using an n-channel thin film transistor and a p-channel thin film transistor as a switching thin film transistor for controlling input of a signal to the pixel electrode or as a driving thin film transistor for controlling current or voltage application to the light-emitting element 68. The n-channel thin film transistor and the p-channel thin-film transistor each include a microcrystalline semiconductor film as a channel formation region, so that fluctuation of the threshold can be suppressed. A concentration of oxygen contained in the microcrystalline semiconductor film is $1 \times 10^{16}$ atoms/cm$^3$ or less. Therefore, defects in the microcrystalline semiconductor film can be reduced. Further, in a p-channel thin film transistor, a concentration of oxygen which serves as a donor can be reduced. Thus, the mobilities of an n-channel thin film transistor and a p-channel thin film transistor can be raised. Typically, a mobility of the n-channel thin film transistor can be from 10 to 45 cm$^2$/V·s, and a mobility of the p-channel thin film transistor can be 0.3 cm$^2$/V·s or less.

Embodiment Mode 2

In this embodiment mode, a plasma CVD apparatus and the method for depositing the gate insulating film, the microcrystalline semiconductor film, the buffer layer, the n-type semiconductor film, the p-type semiconductor film, the protective insulating film, and the like, which are described in Embodiment Mode 1, are described with reference to FIG. 3, FIG. 4, FIG. 5, and FIG. 24.

Figure 3:
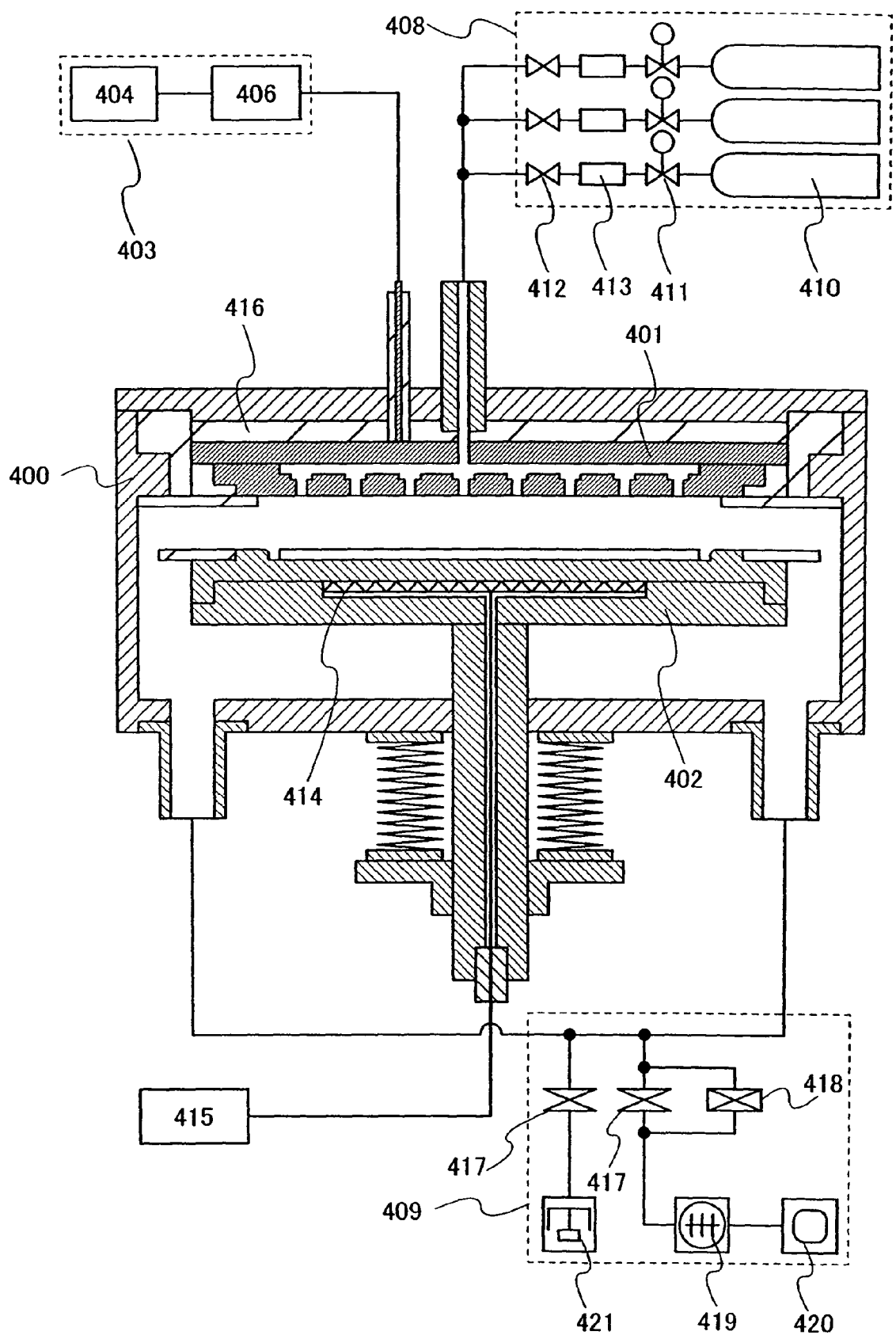
FIG. 3 illustrates the structure of a reaction chamber of a plasma CVD apparatus.

FIG. 3 illustrates one structure example of the plasma CVD apparatus to which high-frequency power is applied. A reaction chamber 400 is formed with a material having rigidity, such as aluminum or stainless steel, and provided with a system for performing vacuum evacuation inside the reaction chamber 400. The reaction chamber 400 is provided with a first electrode 401 and a second electrode 402.

The structure of the plasma CVD apparatus is such that the first electrode 401 is connected to a high-frequency power supply means 403, a ground potential is applied to the second electrode 402, and a substrate can be mounted. The first electrode 401 is insulated from the reaction chamber 400 by an insulating material 416 so as not to leak high-frequency power. Note that FIG. 3 illustrates a structure in which the first electrode 401 and the second electrode 402 are a capacitively-coupled type (parallel plate type). Alternatively, another structure such as an inductively-coupled type may be applied as long as plasma can be generated in the reaction chamber 400 by applying high-frequency power.

The high-frequency power supply means 403 includes a high-frequency power source 404 and a matching box 406 corresponding to the high-frequency power source 404. High-frequency power outputted from the high-frequency power source 404 is supplied to the first electrode 401.

As the high-frequency power which is supplied from the high frequency power source 404, a high frequency wave with a wavelength of 10 m or more and a frequency of 3 to 30 MHz, typically 13.56 MHz, in the HF band or a high frequency wave with a wavelength of less than 10 m and a frequency of 30 to 300 MHz in the VHF band is applied.

The first electrode 401 is also connected to a gas supply means 408. The gas supply means 408 includes a cylinder 410 filled with a reactive gas, a pressure regulator valve 411, a stop valve 412, a mass flow controller 413, and the like. In the reaction chamber 400, a surface of the first electrode 401, which faces a substrate, is processed like a shower plate which has many pores. A reactive gas supplied to the first electrode 401 is supplied to the reaction chamber 400 from the pores of the first electrode 401 having a hollow structure.

An exhaust means 409 connected to the reaction chamber 400 has functions of performing vacuum evacuation and controlling pressure in the reaction chamber 400 to be a given pressure when a reactive gas flows. The structure of the exhaust means 409 includes a butterfly valve 417, a conductance valve 418, a turbo-molecular pump 419, a dry pump 420, and the like. When the butterfly valve 417 and the conductance valve 418 are provided in parallel, exhaust velocity of a reactive gas can be controlled to keep pressure in the reaction chamber 400 in a predetermined range by closing the butterfly valve 417 to operate the conductance valve 418. Further, high vacuum evacuation can be performed by opening the butterfly valve 417 having high conductance.

When ultra high vacuum evacuation with a pressure of lower than $10^{-5}$ Pa is performed, it is preferable to additionally use a cryo pump 421. Alternatively, when exhaust is performed to ultra-high vacuum as ultimate vacuum, the inner wall of the reaction chamber 400 is polished into a mirror surface, and the reaction chamber 400 may be provided with a heater for baking in order to reduce deflation from the inner wall.

The second electrode 402 is provided with a substrate heater 414 of which temperature is controlled by a heater controller 415. In the case of being provided in the second electrode 402, the substrate heater 414 adopts a thermal conduction heating method and includes a sheath heater or the like. Distance between the first electrode 401 and the second electrode 402 can be adjusted appropriately. For adjustment of the distance, a bellows is provided in order to adjust the height of the second electrode 402 in the reaction chamber 400.

By using the reaction chamber of the plasma CVD apparatus according to this embodiment mode, an insulating film typified by a silicon oxide film and a silicon nitride film, a semiconductor film typified by a microcrystalline silicon film and an amorphous silicon film, and various kinds of thin films used for a thin film transistor or the like can be formed.

A deposition method of a thin film, a process for forming a microcrystalline silicon film as a typical example, will be described below in chronological order with reference to FIG. 4.

Figure 4:
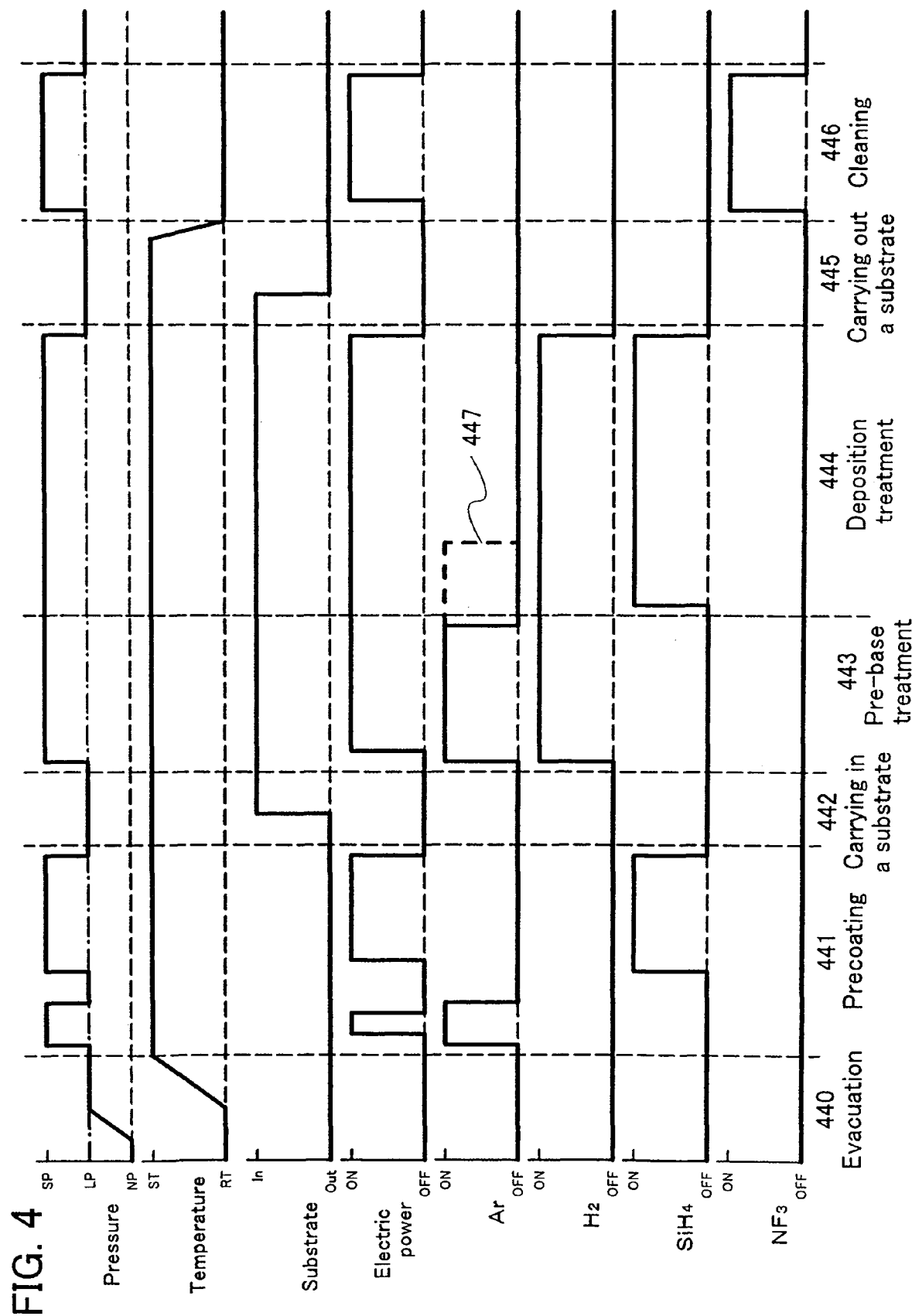
FIG. 4 is a time chart diagram illustrating a method for manufacturing a display device of the present invention.

FIG. 4 is a time chart illustrating a typical example of the process for forming a microcrystalline silicon film. Illustration of FIG. 4 starts from a stage of vacuum evacuation 440, then, treatment stages of precoating 441, carrying in a substrate 442, pre-base treatment 443, deposition treatment 444, carrying out a substrate 445, and cleaning 446 are illustrated in chronological order.

First, vacuum evacuation in a reaction chamber is performed to the predetermined degree of vacuum. When ultra high vacuum evacuation with a pressure of lower than $10^{-5}$ Pa is performed, evacuation is performed by the turbo-molecular pump, and further, vacuum evacuation is performed by the cryo pump. In addition, it is preferable to perform heat treatment for the reaction chamber and then degas the inner wall. Further, a temperature is stabilized by operating the heater for heating the substrate. The temperature for heating the substrate is 100 to 300° C., preferably 120 to 280° C., more preferably 120 to 220° C.

In the stage of the precoating 441, plasma treatment is preferably performed by introducing a rare gas such as argon in order to remove a gas which is adsorbed to the inner wall of the reaction chamber (atmosphere components such as oxygen and nitrogen, or an etching gas used for cleaning the reaction chamber). The degree of ultimate vacuum can be increased by this treatment. Further, treatment for covering the inner wall of the reaction chamber with the same kind of film as a film to be deposited on the substrate is included. This embodiment mode describes a step of forming a microcrystalline silicon film. Therefore, a treatment of forming a silicon film as a coating film on the inner wall is performed. In the stage of the precoating 441, plasma is generated by applying high-frequency power after a silane gas is introduced. Since a silane gas reacts with oxygen, moisture, or the like, oxygen and moisture in the reaction chamber can be removed by flowing a silane gas, and further, generating silane plasma.

After the precoating 441, the carrying in the substrate 442 is performed. Since the substrate on which a microcrystalline silicon film is to be deposited is stored in a load chamber which is subjected to vacuum evacuation, degree of vacuum does not remarkably decrease even when the substrate is carried into a reaction chamber.

The pre-base treatment 443 is effective treatment when a microcrystalline silicon film is formed, and is preferably performed. In other words, when a microcrystalline silicon film is deposited on a surface of a glass substrate, an insulating film, or amorphous silicon by a plasma CVD method, an amorphous layer is formed in the initial stage of deposition due to an impurity, lattice mismatch, and so on. It is preferable to perform the pre-base treatment 443 in order to reduce the thickness of the amorphous layer as much as possible or remove the amorphous layer if possible. As the pre-base treatment, rare gas plasma treatment, hydrogen plasma treatment, or a combination of both treatments is preferable. A rare gas element having a large mass number, such as argon, krypton, or xenon, is preferably used for rare gas plasma treatment. This pre-treatment is carried out for removing oxygen, moisture, an organic substance, a metal element, or the like by the action of sputtering. Hydrogen plasma treatment is effective for removing the impurity adsorbed to the surface by a hydrogen radical and for forming a clean surface by etching an insulating film or an amorphous silicon film. In addition, a function for promoting microcrystalline nucleation is expected by using both of rare gas plasma treatment and hydrogen plasma treatment.

In terms of promoting microcrystalline nucleation, it is effective to keep supplying a rare gas such as argon in the initial stage of a microcrystalline silicon film deposition, as shown by dashed line 447 in FIG. 4.

Deposition treatment 444 in which a microcrystalline silicon film is formed is treatment following the pre-base treatment 443. A microcrystalline silicon film is deposited by glow discharge plasma in a mixed gas of silane (when an impurity semiconductor is formed, a doping gas is added as well as silane) and hydrogen and/or a rare gas. Silane is diluted with hydrogen and/or a rare gas by from 10 to 2000 times. A temperature for heating a substrate is from 100 to 300° C., preferably from 120 to 280° C., more preferably 120 to 220° C. It is preferable that deposition be performed at a temperature of 120 to 220° C. in order that a growing surface of the microcrystalline silicon film is inactivated with hydrogen, and growth of microcrystalline silicon is promoted.

Glow discharge plasma is generated by applying a high-frequency power of from 1 to 20 MHz, typically 13.56 MHz, or high-frequency power of 20 to 120 MHz in the VHF band, as described in this embodiment mode.

In this case, the microcrystalline silicon film can be prevented from containing impurities which originate from metal of the reaction chamber by performing treatment of the precoating 441. In other words, the reaction chamber is covered by silicon, so that the reaction chamber can be prevented from being etched by plasma and the concentration of impurities in the microcrystalline silicon film can be reduced.

In the stage of deposition treatment 444, helium may be added to a reactive gas. Helium has ionization energy of 24.5 eV, which is the highest ionization energy in all gases, and has a metastable state in a level of about 20 eV which is a little lower than the level of the ionization energy. Thus, only about 4 eV, which is the difference between the ionization energy and the metastable state, is needed for ionization while discharge is maintained. Therefore, a discharge starting voltage of helium shows the lowest value in all gases. By such characteristics, helium can hold plasma stably. In addition, uniform plasma can be formed so that plasma density is equalized even when the area of the substrate on which a microcrystalline silicon film is deposited is increased.

After deposition of the microcrystalline silicon is completed, the supply of a reactive gas such as silane or hydrogen and high-frequency power is stopped to perform the carrying out a substrate 445. When deposition treatment is performed on another substrate sequentially, the same treatment is performed from the stage of the carrying in a substrate 442. The cleaning 446 is performed to remove a film or powder which is attached to the reaction chamber.

For the cleaning 446, plasma etching is performed by introducing an etching gas typified by $NF_3$ and $SF_6$. Alternatively, the cleaning 446 is performed by introducing a gas such as $ClF_3$ in which etching can be performed without using plasma. In the stage of the cleaning 446, it is preferable to turn off the heater which is used for heating the substrate in order to decrease a temperature of the reaction chamber for a purpose of suppressing formation of a reaction by-product in etching. After completion of the cleaning 446, the same treatment may be performed from the stage of precoating 441.

In this embodiment mode, a deposition method of a microcrystalline silicon film is described with reference to FIG. 4. However, this embodiment mode is not limited to this method. Various kinds of thin films can be formed by changing a reactive gas. This embodiment mode can be employed for deposition of an amorphous silicon film, an amorphous silicon germanium film, an amorphous silicon carbide film, a microcrystalline silicon germanium film, a microcrystalline silicon carbide film, or the like, as a semiconductor film. This embodiment mode can be also utilized for deposition of a silicon oxide film, a silicon nitride film, a silicon oxynitride film, silicon nitride oxide film, or the like, as an insulating film.

Note that a silicon oxynitride film refers to a film that contains a higher composition of oxygen than that of nitrogen. In the case where measurements are performed using Rutherford backscattering spectrometry (RBS) and hydrogen forward scattering (HFS), the silicon oxynitride film contains oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film refers to a film that contains higher composition of nitrogen than that of oxygen and, in the case where measurements are performed using RBS and HFS, the silicon nitride oxide film contains oxygen, nitrogen, silicon, and hydrogen at concentrations ranging from 5 to 30 at. %, 20 to 55 at. %, 25 to 35 at. %, and 10 to 30 at. %, respectively. It is to be noted that assuming that the total percentage of atoms contained in silicon oxynitride or silicon nitride oxide is 100 at. %, percentages of nitrogen, oxygen, silicon, and hydrogen are within the ranges given above.

In the above-described manner, a thin film of which an oxygen concentration is $1 \times 10^{16}$ atoms/cm$^3$ or less, typically a microcrystalline silicon film, can be formed according to this embodiment mode.

Next, a structure example which is suitable for deposition of a gate insulating film and a semiconductor film included in a TFT is described as an example of a plasma CVD apparatus to which the above-mentioned reaction chamber is applied.

Figure 5:
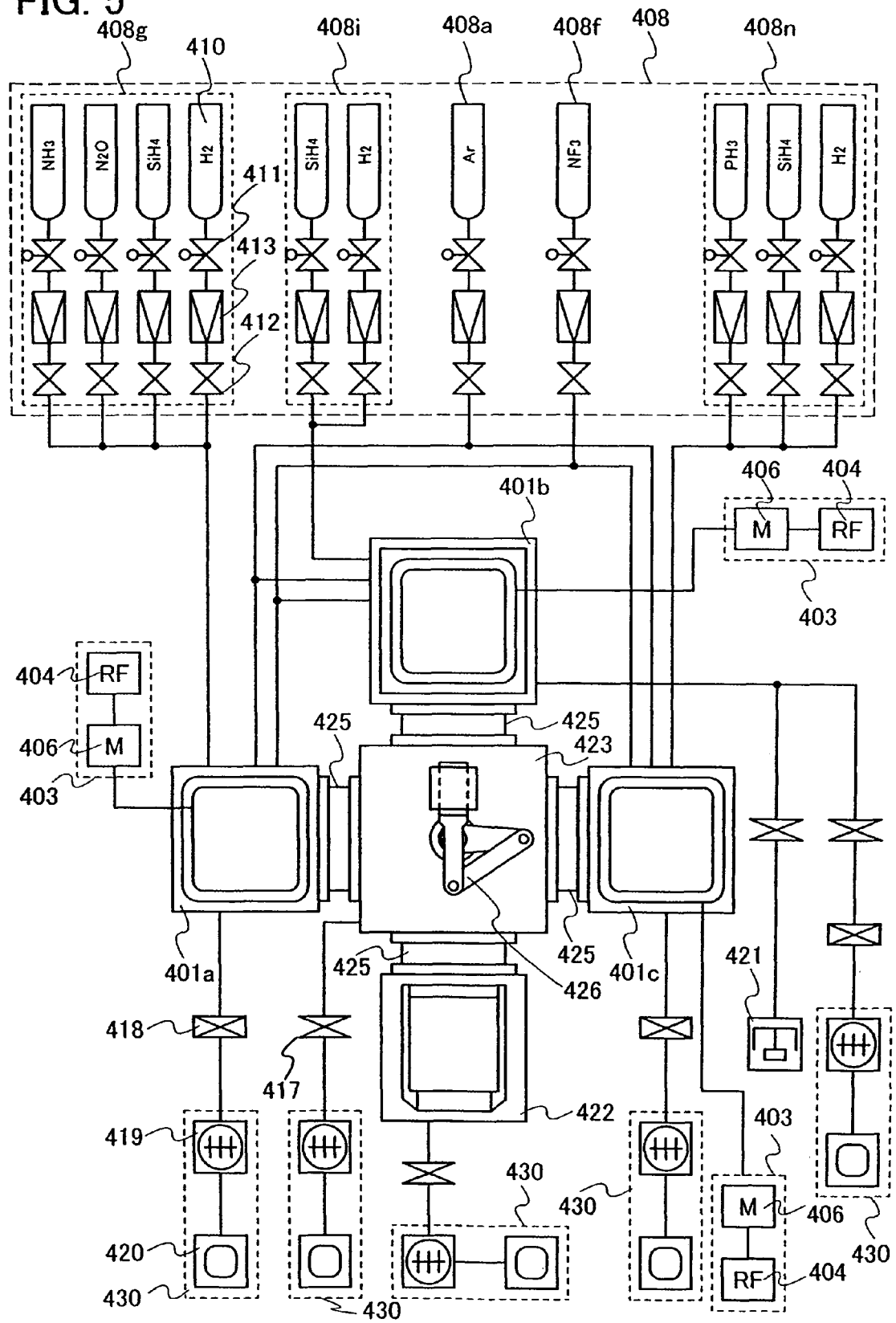
FIG. 5 illustrates a structure of a multi-chamber plasma CVD apparatus provided with a plurality of reaction chambers.

FIG. 5 illustrates an example of a multi-chamber plasma CVD apparatus provided with a plurality of reaction chambers. The apparatus is provided with a common chamber 423, a load/unload chamber 422, a first reaction chamber 401a, a second reaction chamber 401b, and a third reaction chamber 401c. In this apparatus, a substrate is loaded by single wafer processing, and the substrate which is loaded into a cassette of the load/unload chamber 422 is transferred to each reaction chamber by a transport mechanism 426 of the common chamber 423. Each gate valve 425 is provided between the common chamber 423 and each chamber such that treatments performed in chambers do not interfere with each other.

Reaction chambers are separated depending on the kind of a thin film to be formed. For example, an insulating film such as a gate insulating film is deposited in the first reaction chamber 401a, a microcrystalline semiconductor layer for channel formation is deposited in the second reaction chamber 401a, and an impurity semiconductor layer having one conductivity type which forms a source and a drain is deposited in the third reaction chamber 401c. Note that the number of reaction chambers is not limited to that shown in FIG. 5, and the number of reaction chambers can be increased or decreased as necessary. One film may be formed in one reaction chamber, or a plurality of films may be deposited in one reaction chamber.

The turbo-molecular pump 419 and the dry pump 420 are connected to each reaction chamber for exhaust means 430. The exhaust means is not limited to a combination of these vacuum pumps, and another vacuum pump can be used as long as exhaust can be performed to a degree of vacuum approximately from $10^{-1}$ to $10^{-5}$ Pa. In addition, the second reaction chamber 401b in which a microcrystalline semiconductor film is formed is connected to the cryo pump 421 which performs vacuum evacuation to reach an ultra high-vacuum. The butterfly valve 417 is provided between the exhaust means 430 and each reaction chamber, which can interrupt vacuum evacuation, and the conductance valve 418 can control exhaust velocity to adjust pressure in each reaction chamber.

The gas supply means 408 includes the cylinder 410 in which a gas used for the process, such as a rare gas or a semiconductor source gas typified by silane, is filled, the stop valve 412, the mass flow controller 413, and the like. A gas supply means 408g is connected to the first reaction chamber 401a and supplies a gas for depositing a gate insulating film. A gas supply means 408i is connected to the second reaction chamber 401b and supplies a gas for forming a microcrystalline semiconductor film. A gas supply means 408n is connected to the third reaction chamber 401c and supplies a gas for forming an n-type semiconductor film. A gas supply means 408a supplies hydrogen, a gas supply means 408f is a system for supplying an etching gas used for cleaning the reaction chamber, and these means are connected to all reaction chambers.

The high-frequency power supply means 403 for generating plasma is connected to each reaction chamber. A high-frequency power supply means 403 includes the high-frequency power source 404 and the matching box 406.

Figure 24:
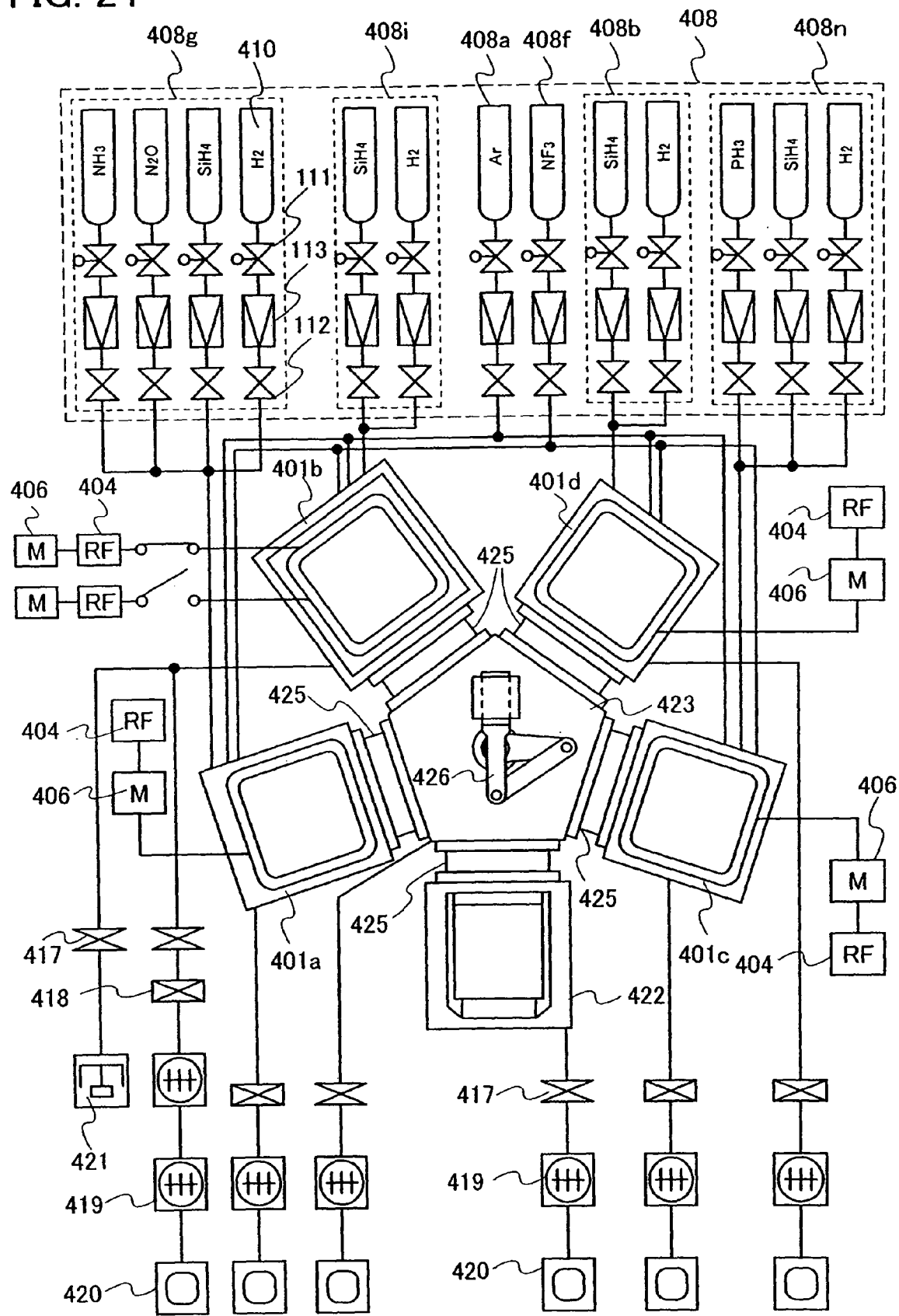
FIG. 24 illustrates the structure of a multi-chamber plasma CVD apparatus provided with a plurality of reaction chambers.

FIG. 24 illustrates a structure in which a fourth reaction chamber 401d is added to the structure of the multi-chamber plasma CVD apparatus in FIG. 5. A gas supply means 408b is connected to the fourth reaction chamber 401d. The structures of a high frequency power supply means and an exhaust means are similar. Reaction chambers can be used separately depending on the kind of a film to be formed. For example, an insulating film such as gate insulating film is deposited in the first reaction chamber 401a, a microcrystalline semiconductor layer for channel formation is deposited in the second reaction chamber 401b, a buffer layer which protects a semiconductor layer for channel formation is formed in the fourth reaction chamber 401d, and an impurity semiconductor layer having one conductivity type which forms a source and a drain is deposited in the third reaction chamber 401c. Since the most suitable deposition temperature depends on each film, it is necessary to independently control the temperature of the reaction chambers. Management of the deposition temperature can be readily achieved by separating reaction chambers individually. Further, the same kind of films can be repeatedly deposited, so that influence of residual impurities attributed to a film formed previously can be excluded.

As described in this embodiment mode, a plurality of reaction chambers which are connected by a common chamber are used, so that a plurality of different kinds of layers can be successively stacked without being exposed to air, as shown in FIG. 5 and FIG. 24.

Note that a gas supply means for supplying a gas for forming a p-type semiconductor film (typically, diborane, silane, and hydrogen) and a reaction chamber which is connected to the gas supply means are provided, although they are not shown in FIG. 5 and FIG. 24.

Embodiment Mode 3

Next, light-emitting devices which are one mode of display devices are described with reference to FIGS. 1A to 1C, FIGS. 6A to 6C, and FIG. 7. As such light-emitting devices, light-emitting elements utilizing electroluminescence are used for description, here. Light emitting elements utilizing electroluminescence are classified according to whether a light-emitting material is an organic compound or an inorganic compound. In general, the former is referred to as an organic EL element and the latter is referred to as an inorganic EL element.

In the case of an organic EL element, by applying a voltage to the light-emitting element, electrons and holes are injected from a pair of electrodes into a layer containing an organic compound with a light-emitting property to cause a current flow. Then, recombination of these carriers (the electrons and holes) results in an excited state of the organic compound with a light-emitting property, and light is emitted when the excited state relaxes to a ground state. Based on this mechanism, such a light-emitting element is referred to as a current excitation type light-emitting element.

Inorganic EL elements are classified based on their element structures into a distributed inorganic EL element and a thin-film inorganic EL element. The distributed inorganic EL element includes a light-emitting layer in which particles of a light-emitting material are distributed in a binder and adopts donor-acceptor recombination emission in which a donor level and an acceptor level are utilized as a mechanism of light emission. The thin-film inorganic EL element has a structure in which a light-emitting layer is interposed between dielectric layers and the light-emitting layer interposed between dielectric layers is further interposed between electrodes and adopts local emission in which inner shell electron transition in a metal ion is utilized.

Here, an organic EL element is used as a light-emitting element for description. Further, although a channel-etched thin film transistor shown in FIG. 1C is used as a thin film transistor, a channel-protective thin film transistor shown in FIG. 2 may be used as appropriate.

As one mode of a light-emitting device, a pixel having the structure shown in FIGS. 1A and 1C and including an equivalent circuit shown in FIG. 1B is given. Typically, as shown in FIG. 6A, a first thin film transistor 51a serving as a thin film transistor for switching a second thin film transistor 51a, the second thin film transistor 51b serving as a thin film transistor for driving a light-emitting element, and a pixel electrode 66 connected to a wiring 64c of the second thin film transistor 51b in a contact hole of a protective insulating film 65 are formed over a substrate 50.

A partition wall 70 is formed over the protective insulating film 65 and an end portion of the pixel electrode 66 as shown in FIG. 6A. The partition wall 70 has an opening and the pixel electrode 66 is exposed in the opening. The partition wall 70 is formed using an organic resin film such as a siloxane polymer, and an inorganic insulating film. In particular, it is preferable that the partition wall 70 be formed of a photosensitive material, and the opening be formed in the pixel electrode so that a side wall of the opening has a sloped surface with a continuous curvature.

Next, a light-emitting layer 82 is formed so as to be in contact with the pixel electrode 66 in the opening of the partition wall 70, a counter electrode 83 is formed so as to cover the light-emitting layer 82, and a protective insulating film 84 is formed so as to cover the counter electrode 83 and the partition wall 70.

The light-emitting layer 82 may be formed to have a single-layer structure or a layered structure including a plurality of layers. Further, in the case where the second thin film transistor 51b is a p-channel thin film transistor, an anode formed of a conductive material having a high work function is used as the pixel electrode 66. In the case where the second thin film transistor 51b is an n-channel thin film transistor, a cathode formed of a conductive material having a low work function is used as the pixel electrode 66.

In the opening of the partition wall 70, the pixel electrode 66, the light-emitting layer 82, and the counter electrode 83 overlap with one another, so that a light-emitting element 90 is formed.

The protective insulating film 84 is formed using a silicon nitride film, a silicon nitride oxide film, a DLC film, or the like so that oxygen, hydrogen, water, carbon dioxide, or the like does not enter the light-emitting element 90.

Further, in a practical case, it is preferable that the protective insulating film 84 be packaged (sealed) with a protective film (such as a laminated film or an ultraviolet curable resin film) or a cover material, which has high gas barrierability and low degasification to prevent the protective insulating film 84 from being exposed to air.

Next, the structure of a light-emitting element will be described with reference to FIGS. 6A to 6C. Here, the case where the second thin film transistor 51b which is a driving thin film transistor is a p-channel thin film transistor is taken as an example to describe the cross-sectional structure of the light-emitting element.

In order to extract light emission from the light-emitting element, at least one of the anode and the cathode of the light-emitting element is required to be transparent. The thin film transistors and the light-emitting element are formed over the substrate. There are light-emitting elements having a top emission structure in which light emission is extracted through the surface opposite to the substrate, having a bottom emission structure in which light emission is extracted through the surface on the substrate side, and having a dual emission structure in which light emission is extracted through the surface on the substrate side and the surface opposite to the substrate. The pixel structure of this embodiment mode can be applied to a light-emitting element having any of these emission structures.

A light-emitting element having a bottom emission structure is described with reference to FIG. 6A. The cross-sectional view of the light-emitting element in the case where the driving thin film transistor 51b is a p-channel transistor and light from the light-emitting element 90 is emitted through the pixel electrode 66 is shown. Here, the pixel electrode 66 functions as an anode. The pixel electrode 66 formed of a light-transmitting conductive material and electrically connected to the second thin film transistor 51b which is a driving thin film transistor is formed, and the light-emitting layer 82 and the counter electrode 83 are sequentially stacked over the pixel electrode 66. Note that the counter electrode 83 serves as a cathode in this example. The pixel electrode 66 is formed using a light-transmitting conductive material having a high work function, such as a light-transmitting conductive film of indium tin oxide, zinc oxide, tin oxide, or the like. As the counter electrode 83, a known material can be used as long as it is a conductive film which has a low work function and shields light. For example, Ca, Al, MgAg, AlLi, or the like is desirably used. The light-emitting layer 82 may be formed to have a single-layer structure or a layered structure including a plurality of layers. In the case of a layered structure including a plurality of layers, a hole injecting layer, a hole transporting layer, a light-emitting layer, an electron transporting layer, and an electron injecting layer are sequentially stacked over the pixel electrode 66. Note that it is not necessary to form all of these layers.

A region in which the light-emitting layer 82 is interposed between the counter electrode 83 and the pixel electrode 66 corresponds to the light-emitting element 90. In the case of the pixel shown in FIG. 6A, light from the light-emitting element 90 is emitted to the side of pixel electrode 66 as shown by the outline arrow.

Next, a light-emitting element with a dual-emission structure will be described with reference to FIG. 6B. In FIG. 6B, the light-emitting layer 82 and the cathode 85 are sequentially stacked over the light-transmitting pixel electrode 66 electrically connected to the second thin film transistor 51b which is a driving thin film transistor. The pixel electrode 66 functions as an anode. For the cathode 85, a known material can be used as long as it is a conductive film which has a low work function as in the case of FIG. 6A. It is to be noted that the cathode 85 is thick enough to transmit light. For example, Al or MgAg, which has a thickness of 20 nm, may be used for the cathode 85. The light-emitting layer 82 may be formed to have a single-layer structure or layered structure including a plurality of layers as in the case of FIG. 6A. The pixel electrode 66 can be formed using a light-transmitting conductive material having a high work function as in the case of FIG. 6A.

A portion in which the pixel electrode 66, the light-emitting layer 82, and the cathode 85 overlap one another corresponds to the light-emitting element 90. In the case of the pixel shown in FIG. 6B, light from the light-emitting element 90 is emitted to both of the pixel electrode 66 side and the cathode 85 side as shown by the outline arrows.

A light-emitting element with a top emission structure is described with reference to FIG. 6C.

FIG. 6C shows the cross-sectional view of a pixel in the case where the driving thin film transistor 51b is a p-channel transistor and light emitted from the light-emitting element 90 passes through a cathode 93. In FIG. 6C, the anode 91 of the light-emitting element 90 and the driving thin film transistor 51b are electrically connected to each other, and a light-emitting layer 92 and the cathode 93 are sequentially stacked over the anode 91. The anode 91 is formed using a light-transmitting conductive material. Typically, the anode 91 preferably has a layered structure of the anode material shown in FIG. 6A and a light-transmitting conductive material such as aluminum, titanium, titanium nitride, tantalum, tantalum nitride, or silver. For the cathode 93, a conductive film having a low work function, which is shown in FIG. 6A, can be used. It is to be noted that the cathode 93 is thick enough to transmit light. For example, Al or MgAg, which has a thickness of from 5 to 20 nm, may be used for the cathode 93. The light-emitting layer 92 may be formed to have a single-layer structure or layered structure including a plurality of layers similarly to the light-emitting layer 82 shown in FIG. 6A.

The portion in which the anode 91, the light-emitting layer 92, and the cathode 93 overlap one another corresponds to the light-emitting element 90. In the case of the pixel shown in FIG. 6C, light from the light-emitting element 90 is emitted to the cathode 93 side as shown by the outline arrows.

Note that a light-emitting element with a top emission structure can emit light even in the case where it is over the first thin film transistor 51a or the second thin film transistor 51a; thus, a light emission area can be increased. However, if the layers located under the light-emitting layer 92 is uneven, thickness distribution is nonuniform due to unevenness and the anode 91 and the cathode 93 are short-circuited, so that a display defect is caused. Therefore, a planarizing film 86 is formed over the protective insulating film 65, which is followed by the formation of the anode 91 connected to the wiring 64c in a contact hole formed in the planarizing film 86 and the protective insulating film 65. The planarizing film 86 is preferably formed using an organic resin such as acrylic polymer, polyimide, or polyamide, or a siloxane polymer. Note that since the anode 91 is formed over the planarizing film 86, unevenness of the surface of the protective insulating film 65 can be reduced. Note that since in the contact hole, the anode 91 is uneven, a partition wall 70 having an opening is provided to cover the uneven portion in the anode 91. In the opening of the partition wall 70, the light-emitting layer 92 is formed so as to be in contact with the anode 91, and the cathode 93 is formed so as to cover the light-emitting layer 92. The protective insulating film 84 is further formed so as to cover the cathode 93 and the partition wall 70.

Note that although an organic El element is described as the light-emitting element here, an inorganic EL element may be provided as the light-emitting element.

The light-emitting device can be manufactured through the above process. For the light-emitting device of this embodiment mode, a thin film transistor with a small off current, which is excellent in electric characteristics and highly reliable, is used, so that the light-emitting device of this embodiment mode is excellent in contrast and visibility.

Next, an example of the equivalent circuit of a pixel 153 of the light-emitting display device described in this embodiment mode is illustrated in FIG. 1B.

The pixel 153 includes the first thin film transistor 51a, the second thin film transistor 51b, a capacitor 67, and a light-emitting element 68. Note that although an example is described here in which the first transistor 51a is an n-channel thin film transistor and the second thin film transistor 51b is a p-channel thin film transistor, the present invention is not limited thereto. The first thin film transistor 51a may be a p-channel thin film transistor and the second thin film transistor 51b may be an n-channel thin film transistor.

A gate of the first thin film transistor 51a is electrically connected to a scan line (here, referred to as "a scan line G"), which is any of the scan lines G1 to Gy. One of a source and a drain of the first thin film transistor 51a is electrically connected to a signal line (here, referred to as "a signal line S"), which is any of the signal lines S1 to Sx, and the other of the source and the drain of the first thin film transistor 51a is electrically connected to one of electrodes of the capacitor 67 and a gate of the second thin film transistor 51b. It is to be noted that the first thin film transistor 51a may be referred to as a switching thin film transistor or a thin film transistor for switching.

The gate of the second thin film transistor 51b is electrically connected to the other of the source and the drain of the first thin film transistor 51a and one of electrodes of the capacitor 67. One of a source and a drain of the second thin film transistor 51b is electrically connected to a power supply line (here, referred to as "a power supply line V"), which is any of the power supply lines V1 to Vx, and the other of the source and the drain of the second thin film transistor 51b is electrically connected to one of electrodes of the light-emitting element 68. The other of the electrodes of the light-emitting element 68 may be set to a low power source potential. It is to be noted that the second thin film transistor 51b may be referred to as a driving thin film transistor.

It is to be noted that the low power source potential refers to a potential satisfying a relationship, (the low power source potential)<(a high power source potential), based on the high power source potential set to the power supply line V. As the low power source potential, GND, 0 V, or the like may be set.

The other of the electrodes of the capacitor 67 is electrically connected to the power supply line (here, referred to as "the power supply line V"), which is any of the power supply lines V1 to Vx. It is to be noted that the gate capacitance of the second thin film transistor 51b may be used as a substitute for the capacitor 67, so that the capacitor 67 can be omitted. The gate capacitance of the second thin film transistor 51b may be provided in a region where a source region, a drain region, an LDD region, or the like overlaps with the gate electrode. Alternatively, the gate capacitance of the second thin film transistor 51b may be provided between a channel formation region and the gate electrode.

Next, the operation of the light-emitting display device is described. It is to be noted that the case is described where the light-emitting display device described in this embodiment mode is operated by a constant-current analog gray scale method. Constant-current driving refers to driving by a constant current in a period of holding video, such as one frame period, but does not refer to driving by a constant current at all times.

In a pixel where the scan line G is selected, the potential of the signal line S is input to one of electrodes of the capacitor 67 through the first thin film transistor 51a which has been turned on (in a conduction state). Electric charges for voltage corresponding to a video signal are stored in the capacitor 67, and the capacitor 67 stores the voltage. This voltage corresponds to gate-source voltage $V_{gs}$ of the second thin film transistor 51b.

Then, the voltage between the electrodes of the capacitor 67 is applied to the gate of the second thin film transistor 51a, and current flows through the light-emitting element 68 from the power supply line V through the second thin film transistor 51b in accordance with the applied voltage. Thus, the light-emitting element 68 emits light.

The emission luminance of the light-emitting element 68 is almost proportional to the amount of current passing through the light-emitting element 68. Therefore, the gray scale of the pixel can be expressed by changing the amount of current flowing through the light-emitting element 68.

In the light-emitting display device described in this embodiment mode, the current flowing through the light-emitting element 68 is applied from the power supply line V in accordance with the voltage applied to the gate of the second thin film transistor 51a. Here, a drain-source voltage $V_{ds}$ of a thin film transistor and a drain current $I_d$ thereof have a relation shown in FIG. 7.

Figure 7:
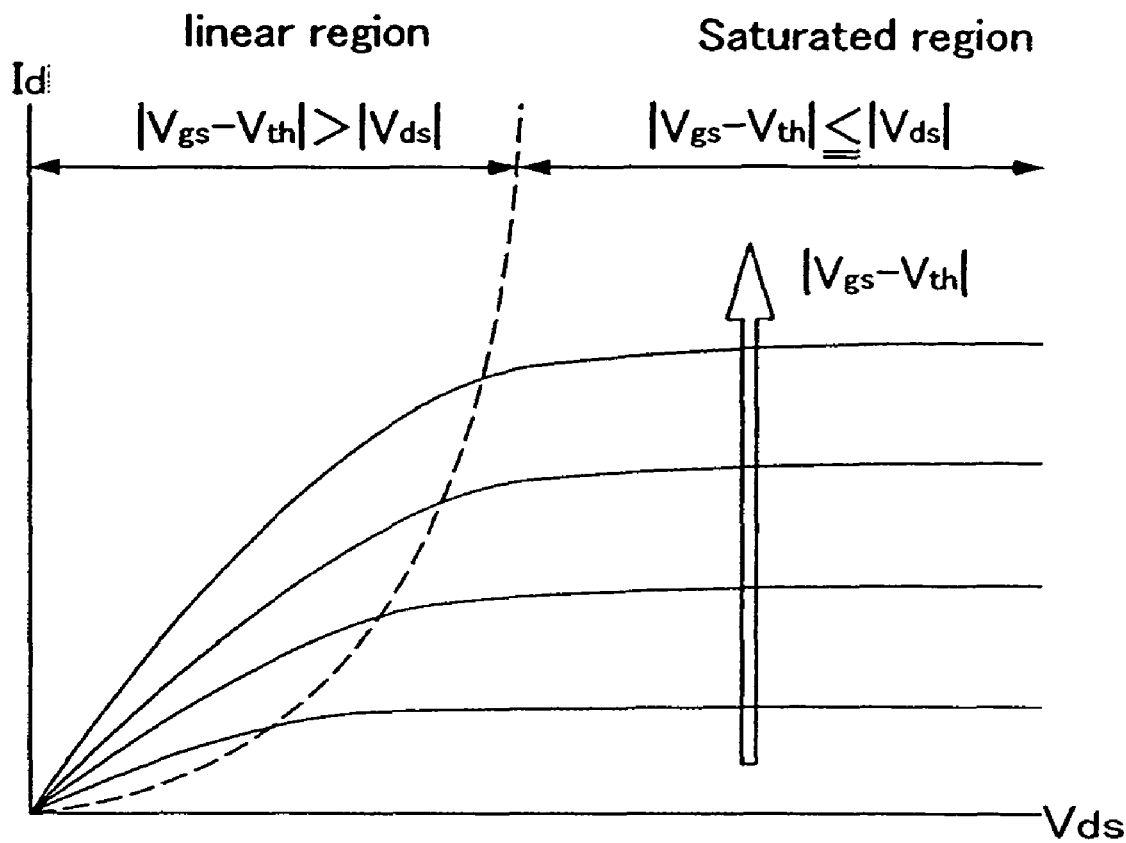
FIG. 7 illustrates the operation of a display device of the present invention.

FIG. 7 shows graphs of drain currents $I_d$ corresponding to different gate voltages $V_{gs}$. The drain current $I_d$ is increased as $|V_{gs}-V_{th}|$, an absolute value of a difference between gate voltage $V_{gs}$ and threshold voltage $V_{th}$ of the second thin film transistor 51b, is increased; in other words, $|V_{gs}|$, an absolute value of the gate voltage Vgs, is increased.

In the case where $|V_{gs}-V_{th}|$, an absolute value of a difference between the gate voltage $V_{gs}$ and the threshold voltage $V_{th}$ of the second thin film transistor 51b, is higher than $|V_{ds}|$, an absolute value of the drain-source voltage $V_{ds}$, the thin film transistor operates in the linear region. In the case where $|V_{gs}-V_{th}|$ is equal to or lower than $|V_{ds}|$, an absolute value of the drain-source voltage $V_{ds}$, the transistor operates in the saturation region. When the transistor operates in the saturation region, a current value is hardly changed even if the drain-source voltage $V_{ds}$ is changed, and the current value is determined only by the amount of $V_{gs}$.

In the light-emitting display device described in this embodiment mode, when the light-emitting element 68 emits light, the second thin film transistor 51b is operated in the saturation region in which $|V_{ds}|$, an absolute value of the drain-source voltage $V_{ds}$, is equal to or higher than $|V_{gs}-V_{th}|$, an absolute value of a difference between the gate voltage $V_{gs}$ and the threshold voltage $V_{th}$ of the second thin film transistor 51a. When the light-emitting element 68 does not emit light, the second thin film transistor 51b may be turned off.

The gray scale of the pixel in the light-emitting display device is expressed by changing a voltage to be applied to the gate of the second thin film transistor 51b (by changing a potential to be applied to the signal line S) to change current flowing through the light-emitting element 68 (by a constant-current analog gray scale method). That is, in a constant-current analog gray scale method, a gray scale is displayed by changing an analog video signal input to the signal line S (by changing the potential of the signal line S).

Note that although a driving method of a pixel using the equivalent circuit shown in FIG. 1B is described for the light-emitting display device of this embodiment mode, the present invention is not limited to this equivalent circuit, and a variety of equivalent circuits and driving methods of a pixel of an EL may be applied as appropriate. Further, the present invention is not limited to a driving method using an analog gray scale method. A driving method using a digital gray scale method may be applied and a pixel, for which a driving method using a digital gray scale method can be used, can also be formed.

In general, in the case where the second thin film transistor 51b is operated in the saturation region when the light-emitting element 68 emits light, there is a problem in that variation in mobility or threshold values of thin film transistors among pixels leads to variation in drain current, resulting in display unevenness of the light-emitting display device. In particular, in the case where a thin film transistor is formed using a polycrystalline semiconductor film or an amorphous semiconductor film, there is a wide variation in mobility or threshold values of thin film transistors between pixels, which makes it difficult to operate a light-emitting display device by constant-current driving. This is because, in crystallization (laser crystallization or the like) of a semiconductor layer, it is difficult to obtain a polycrystalline semiconductor film having a uniform crystal grain size in the entire region included in a pixel portion.

On the other hand, in the light-emitting display device described in this embodiment mode, a thin film transistor having a microcrystalline semiconductor film is used for a transistor or the like included in a pixel; thus, variation in mobility or threshold values of thin film transistors between pixels can be reduced. Accordingly, even in the case where the second thin film transistor 51b is operated in the saturation region, a change in characteristics of the thin film transistor is small, and thus, display unevenness of the light-emitting display device can be prevented even when the light-emitting display device is operated by a constant-current analog gray scale method.

As for the EL display device described in this embodiment mode, the operation is performed by constant-current driving to control light emission of the light-emitting element 68 by a current. Therefore, even when a V-I characteristic of the light-emitting element is changed by a temperature change or deterioration of the light-emitting element, constant luminance can be maintained as compared to the case where an operation is performed by constant-voltage driving in which light emission of the light-emitting element 68 is controlled by a voltage.

Embodiment Mode 4

In this embodiment mode, the structure of a display device which can prevent electrostatic discharge damage is described with reference to FIG. 8, FIGS. 9A to 9F, and FIGS. 10A and 10B. Here, a protective circuit is formed using an n-channel thin film transistor and a p-channel thin film transistor each having a microcrystalline semiconductor film between a pixel portion and a driver circuit.

Figure 8:
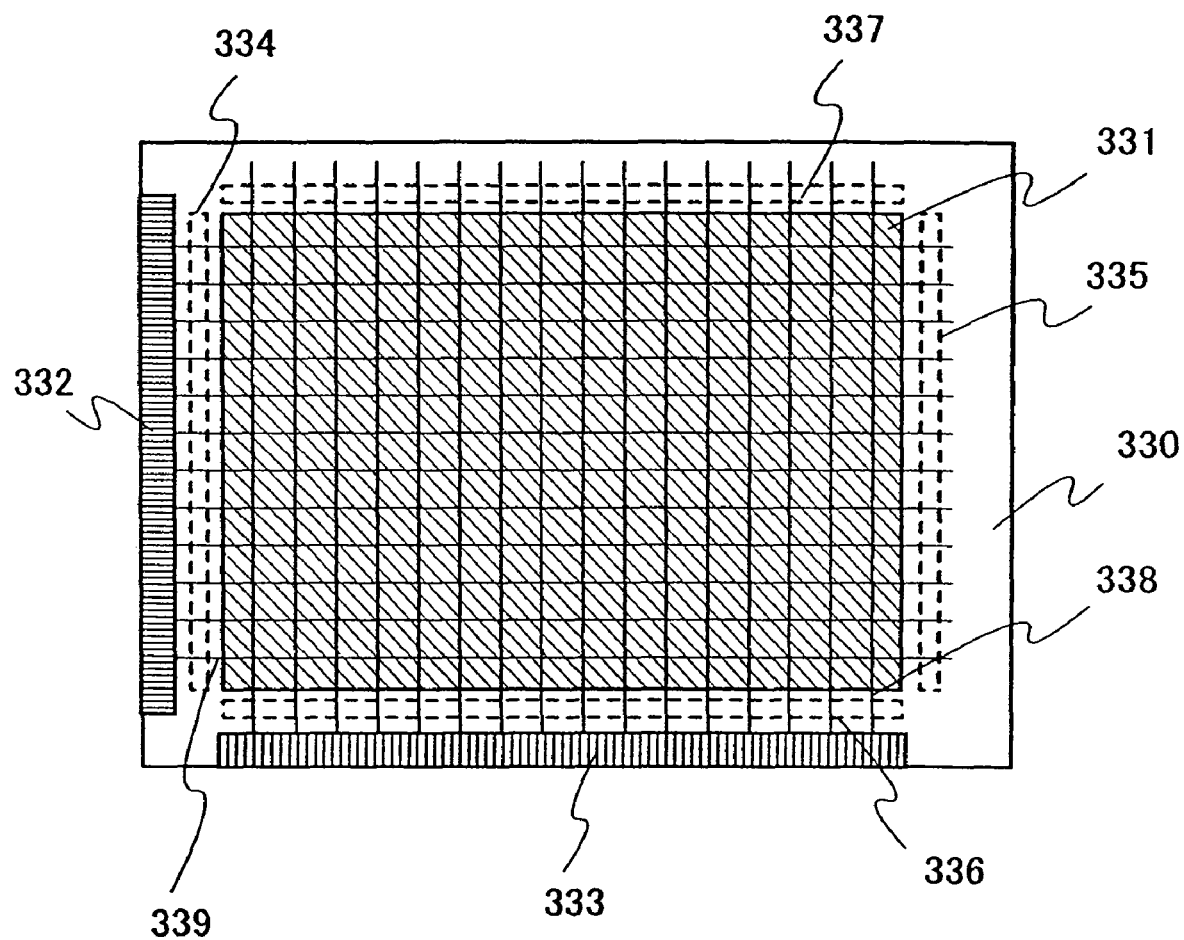
FIG. 8 is a top plan view illustrating the structure of a display device of the present invention.

First, the structure of the display device of this embodiment mode is described with reference to FIG. 8. FIG. 8 is a top plan view of a substrate 330 over which a display device is formed. A pixel portion 331 is formed over the substrate 330. Further, an input terminal supplies a signal or a power supply potential to a pixel circuit formed over the substrate 330.

Note that this embodiment mode is not limited to the mode illustrated in FIG. 8. That is, a scan line driver circuit or a signal line driver circuit may be formed over the substrate 330.

An input terminal 332 on the scan line side and an input terminal 333 on the signal line side which are formed over the substrate 330 are connected to the pixel portion 331 by wirings which are extended in vertical and horizontal directions. The wirings are connected to protective circuits 334 to 337.

The pixel portion 331 and the input terminal 332 are connected by a wiring 339. The protective circuit 334 is provided between the pixel portion 331 and the input terminal 332 and is connected to the wiring 339. By the protective circuit 334, various semiconductor elements such as thin film transistors or the like, which are included in the pixel portion 331, can be protected and thus deterioration or damage can be prevented. Note that although the wiring 339 corresponds to one wiring in the drawing, all of a plurality of wirings provided in parallel to the wiring 339 have connection relations which are similar to that of the wiring 339. Note that the wiring 339 functions as a scan line.

Note that as for the protective circuit on the scan line side, not only the protective circuit 334 provided between the input terminal 332 and the pixel portion 331 but also another protective circuit may be provided on the opposite side of the input terminal 332 across the pixel portion 331 (see a protective circuit 335 in FIG. 8).

Meanwhile, the pixel portion 331 and the input terminal 333 are connected by a wiring 338. The protective circuit 336 is provided between the pixel portion 331 and the input terminal 333 and is connected to the wiring 338. By the protective circuit 336, various semiconductor elements such as thin film transistors or the like, which are included in the pixel portion 331, can be protected and thus deterioration or damage can be prevented. Note that although the wiring 338 corresponds to one wiring in the drawing, all of a plurality of wirings provided in parallel to the wiring 338 have connection relations which are similar to that of the wiring 338. Note that the wiring 338 functions as a signal line.

Note that as for the protective circuit on the signal line side, not only the protective circuit 336 provided between the input terminal 333 and the pixel portion 331 but also another protective circuit may be provided on the opposite side of the input terminal 333 across the pixel portion 331 (see the protective circuit 337 in FIG. 8).

Note that all the protective circuits 334 to 337 are not necessarily provided. However, at least the protective circuit 334 is required to be provided. This is because when an excessive current is generated in the wiring 339, the gate insulating films of the thin film transistors included in the pixel portion 331 are damaged and thus a number of point defects may be generated.

In addition, when not only the protective circuit 334 but also the protective circuit 336 is provided, generation of an excessive current in the wiring 338 can be prevented. Therefore, compared to the case where only the protective circuit 334 is provided, reliability is improved and thus yield is improved. When the protective circuit 336 is provided, electrostatic discharge damage which can be caused in a rubbing process after formation of the thin film transistors can also be prevented.

Further, when the protective circuit 335 and the protective circuit 337 are provided, reliability can be further improved and thus yield can be improved. The protective circuit 335 and the protective circuit 337 are provided on the opposite sides of the input terminal 332 and the input terminal 333, respectively. Therefore, the protective circuit 335 and the protective circuit 337 contribute to prevention of deterioration or damage of the various semiconductor elements, which is caused in the manufacturing process of a display device.

Note that in FIG. 8, a signal line driver circuit and a scan line driver circuit which are formed separately from the substrate 330 are mounted on the substrate 330 by a known method such as a COG method or a TAB method. Alternatively, the scan line driver circuit and the pixel portion may be formed over the substrate 330, and the signal line driver circuit which is formed separately may be mounted on the substrate 330. Alternatively, part of the scan line driver circuit or part of the signal line driver circuit and the pixel portion 331 may be formed over the substrate 330 and another part of the scan line driver circuit or another pail of the signal line driver circuit may be mounted on the substrate 330. When part of the scan line driver circuit is provided between the pixel portion 331 and the input terminal 332 on the scan line side, a protective circuit may be provided between the input terminal 332 on the scan line side and part of the scan line driver circuit over the substrate 330; a protective circuit may be provided between part of the scan line driver circuit and the pixel portion 331; or protective circuits may be provided between the input terminal 332 on the scan line side and part of the scan line driver circuit over the substrate 330 and between part of the scan line driver circuit and the pixel portion 331. Alternatively, when part of the signal line driver circuit is provided between the pixel portion 331 and the input terminal 333 on the signal line side, a protective circuit may be provided between the input terminal 333 on the signal line side and part of the signal line driver circuit over the substrate 330; a protective circuit may be provided between part of the signal line driver circuit and the pixel portion 331; or protective circuits may be provided between the input terminal 333 on the signal line side and part of the signal line driver circuit over the substrate 330 and between part of the signal line driver circuit and the pixel portion 331. That is, since various modes are used for driver circuits, the number and the positions of protective circuits are determined in accordance with the modes of the driver circuits.

Next, examples of specific circuit configurations of protective circuits which are used as the protective circuits 334 to 337 in FIG. 8 are described with reference to FIGS. 9A to 9F.

Figure 9A:
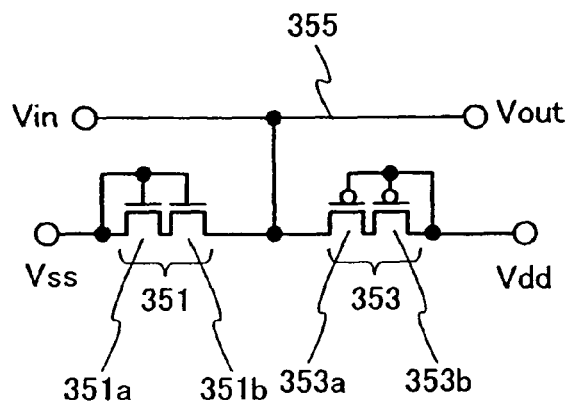
FIGS. 9A to 9F are equivalent circuit diagrams each illustrating the structure of the protective circuit which can be applied to a display device of the present invention.

A protective circuit illustrated in FIG. 9A includes a protective diodes 351 and 353 each using a plurality of thin film transistors. The protective diode 351 includes an n-channel thin film transistor 351a and an n-channel thin film transistor 351b which are connected in series. One of a source or a drain of the n-channel thin film transistor 351a is connected to a gate of the n-channel thin film transistor 351a and a gate of the n-channel thin film transistor 351b and is held at a potential $V_{ss}$. The other of the source or the drain of the n-channel thin film transistor 351a is connected to one of a source or a drain of the n-channel thin film transistor 351b. The other of the source or the drain of the n-channel thin film transistor 351b is connected to the protective diode 353.

The protective diode 353 includes a p-channel thin film transistor 353a and a p-channel thin film transistor 353b which are connected in series. One of a source and a drain of the p-channel thin film transistor 353b is connected to a gate of the p-channel thin film transistor 353a and a gate of the p-channel thin film transistor 353b, and is held at a potential $V_{dd}$. The other of the source or the drain of the p-channel thin film transistor 353b is connected to one of the source or the drain of the p-channel thin film transistor 353a. The other of the source or the drain of the p-channel thin film transistor 353a is connected to the protective diode 351.

Note that in this embodiment mode, the number and polarity of the thin film transistors included in the protective diodes 351 and 353 are not limited to those shown in FIG. 9A.

The protective diodes 351 and 353 are sequentially connected in series, and a wiring 355 is connected between the protective diode 351 and the protective diode 353. Note that the wiring 355 is connected to a semiconductor element which is located in the display portion and protected by the protective circuit.

Figure 9B:
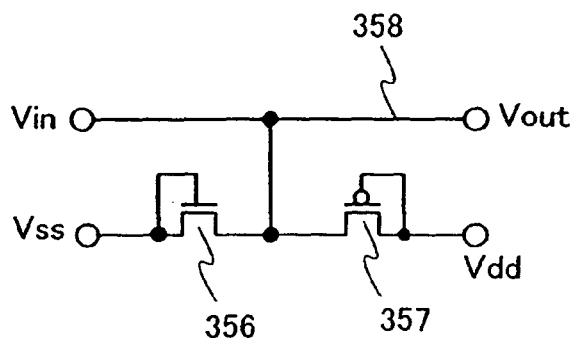

Note that the protective circuit illustrated in FIG. 9A can be replaced with a protective circuit illustrated in FIG. 9B. Since the protective circuit used in this embodiment mode particularly has a high withstand voltage, a structure shown in FIG. 9B can be used. Specifically, a structure is employed, in which a protective diode 356 including a diode-connected n-channel thin film transistor instead of the protective diode 351 of FIG. 9A and a protective diode 357 including a diode-connected p-channel thin film transistor instead of the protective diode 353 are used.

Figure 9C:
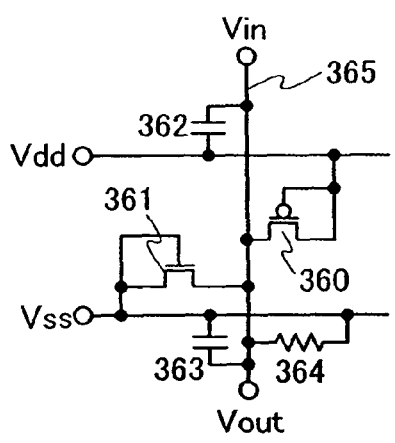

A protective circuit shown in FIG. 9C includes a protective diode 360, a protective diode 361, a capacitor 362, a capacitor 363, and a resistor element 364. The resistor element 364 is a resistor having two terminals. A potential $V_{in}$ which is applied to the wiring 365 is supplied to one of the terminals. The potential $V_{ss}$ is applied to the other of the terminals. The resistor element 364 is provided in order to drop the potential of the wiring 365 to $V_{ss}$ when the potential $V_{in}$ is not applied, and the resistance value of the resistor element 364 is set so as to be sufficiently larger than wiring resistance of the wiring 365. A diode-connected p-channel thin film transistor is used for the protective diode 360 and a diode-connected n-channel thin film transistor is used for the protective diode 361.

Figure 9D:
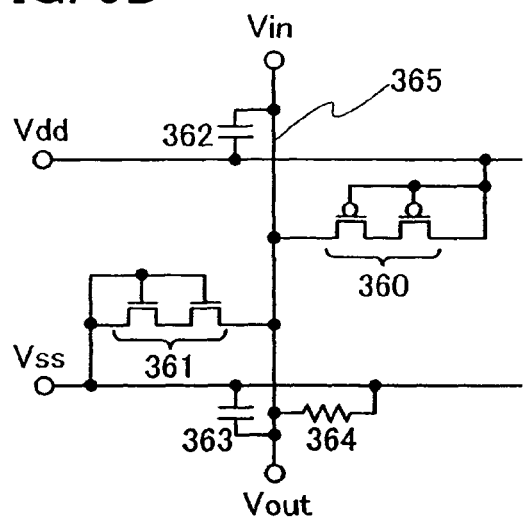

FIG. 9D is an equivalent circuit diagram illustrating a protective circuit in which two p-channel thin film transistors are substituted for the protective diode 360 and two n-channel thin film transistors are substituted for the protective diode 361.

Note that protective circuits illustrated in FIGS. 9C and 9D each employ a diode-connected n-channel thin film transistor and a diode-connected p-channel thin film transistor for protective diodes. However, this embodiment mode is not limited to this structure.

Figure 9E:
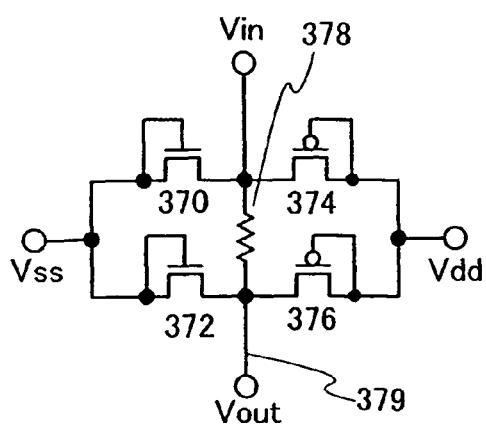

In addition, a protective circuit illustrated in FIG. 9E includes protective diodes 370, 372, 374, and 376, and a resistor element 378. The resistor element 378 is connected to the wiring 379 in series. A diode-connected n-channel thin film transistor is used for each of the protective diodes 370 and 372, and a diode-connected p-channel thin film transistor is used for each of the protective diodes 374 and 376.

One of a source or a drain of each of the protective diode 370 and the protective diode 372 is held at the potential $V_{ss}$, and the other of the source or the drain is connected to the wiring 379. One of a source or a drain of each of the protective diode 374 and the protective diode 376 is held at the potential $V_{dd}$, and the other of the source or the drain is connected to the wiring 379.

Note that protective diodes 370, 372, 374, and 376 are each illustrated using one thin film transistor. However, a plurality of thin film transistors having the same polarity may be connected in series.

Here, as for the source and the drain of the each of protective diodes 353, 357, 360, 374, and 376 which are formed using p-channel thin film transistors, one of sides, which is to be connected to $V_{dd}$, is the drain and the other is the source. As for the source and the drain of each of the protective diodes 351, 356, 361, 370, and 372 which are formed using n-channel thin film transistors, one of sides, which is to be connected to $V_{ss}$ is the drain and the other is the source. Further, the threshold voltage of the protective diodes 353, 357, 360, 374, and 376 which are formed using p-channel thin film transistors is represented as $V_{th}$ (p), and the threshold voltage of the protective diodes 351, 356, 361, 370, and 372 which are formed using n-channel thin film transistors is represented as $V_{th}$ (n). The relation of them is $V_{th}$ (p)>$V_{th}$ (n).

Further, when $V_{in}$ is higher than ($V_{dd}$–$V_{th}$ (p)), the protective diodes 353, 357, 360, 374, and 376 which are formed using p-channel thin film transistors are turned on so that a current flows from $V_{in}$ to $V_{dd}$. When $V_{in}$ is lower than ($V_{ss}$– $V_{th}$ (n)), the protective diodes 351, 356, 361, 370, and 372 which are formed using n-channel thin film transistors are turned on so that a current flows from $V_{ss}$ to $V_{in}$.

Further, when $V_{in}$ is higher than $V_{ss}$, a reverse bias voltage is applied to the protective diodes 351, 356, 361, 370, and 372 which are formed using n-channel thin film transistors and a current does not easily flow therethrough. When $V_{in}$ is lower than $V_{dd}$, a reverse bias voltage is applied to the protective diodes 353, 357, 360, 374, and 376 which are formed using p-channel thin film transistors and a current does not easily flow therethrough.

Here, operations of protective circuits in each of which $V_{out}$ is operated between $V_{ss}$ and $V_{dd}$ are described.

First, the case where the potential $V_{in}$ is higher than the potential $V_{dd}$ is described. When the potential $V_{in}$ is higher than the potential $V_{dd}$ and a potential difference between the gate electrode and the source electrode of each of the protective diodes 353, 357, 360, 374, and 376 is $V_{gs}$=$V_{dd}$–$V_{in}$<$V_{th}$ (p), the p-channel thin film transistors are turned on. Here, since the case where $V_{in}$ is unusually high is assumed, the p-channel thin film transistors are turned on. At that time, the n-channel thin film transistors included in the protective diodes 351, 356, 361, 370, and 372 are turned off. Then, potentials of wirings 355, 358, 365, and 379 are $V_{dd}$ through the protective diodes 353, 357, 360, 374, and 376. Therefore, even when the potential $V_{in}$ is unusually higher than the potential $V_{dd}$ to noise or the like, the potentials of the wirings 355, 358, 365, and 379 are not higher than the potential $V_{dd}$.

On the other hand, when the potential $V_{in}$ is lower than the potential $V_{ss}$ and a potential difference between the gate electrode and the source electrode of each of the protective diodes 351, 356, 361, 370, and 372 is $V_{gs} = V_{ss} - V_{in} > V_{th}$ (n), the n-channel thin film transistors are turned on. Here, since the case where $V_{in}$ is unusually low is assumed, the n-channel thin film transistors are turned on. At that time, the p-channel thin film transistors included in the protective diodes 353, 357, 360, 374, and 376 are turned off. Then, the potentials of the wirings 355, 358, 365, and 379 are $V_{ss}$ through the protective diodes 351, 356, 361, 370, and 372. Therefore, even when the potential $V_{in}$ is unusually lower than the potential $V_{ss}$ due to noise or the like, the potentials of the wirings 355, 358, 365, and 379 are not lower than the potential $V_{ss}$. Further, the capacitor 362 and the capacitor 363 reduce pulsed noise included in the input potential $V_{in}$ and relieve a steep change in potential due to noise.

Note that when the potential $V_{in}$ is between ($V_{ss} - V_{th}$ (n)) and ($V_{dd} - V_{th}$ (p)), the protective diodes 353, 357, 360, 374, and 376 which are formed using p-channel thin film transistors, and the protective diodes 351, 356, 361, 370, and 372 which are formed using n-channel thin film transistors are off, and the potential $V_{in}$ is applied to $V_{out}$.

When the protective circuits are provided as described above, the potentials of the wirings 355, 358, 365, and 379 are almost held between the potential $V_{ss}$ and the potential $V_{dd}$. Therefore, the potentials of the wirings 355, 358, 365, and 379 can be prevented from deviating from this range. That is, the potentials of the wirings 355, 358, 365, and 379 can be prevented from being unusually high or being unusually low, so that a circuit in the next stage of each of the protective circuits can be protected from being damaged or deteriorated.

Further, as shown in FIGS. 9C and 9D, when a protective circuit including the resistor element 364 is provided for an input terminal, potentials of all the wirings to which a signal is to be input can be kept constant (here, the potential $V_{ss}$) when the signal is not input. That is, when a signal is not input, the protective circuit also have a function of a short-circuit ring capable of short-circuiting the wirings. Therefore, electrostatic discharge damage caused by a potential difference between the wirings can be prevented. In addition, since the resistance value of the resistor element 364 is sufficiently large, a signal input to the wiring 355, 358, 365, and 379 can be prevented from dropping to the potential $V_{ss}$ when the signal is input.

Figure 9F:
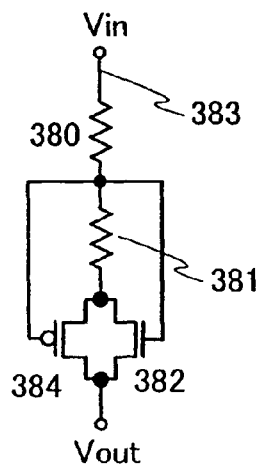

A protective circuit shown in FIG. 9F includes a resistor element 380, a resistor element 381, an n-channel thin film transistor 382, and a p-channel thin film transistor 384. In FIG. 9F, the resistor element 380, the resistor element 381, the n-channel thin film transistor 382, and the p-channel thin film transistor 384 are connected in series to the wiring 383, and the resistor element 380 is connected to the wiring 383. The potential $V_{in}$ is applied to the wiring 383, the potential $V_{out}$ is applied to one of a source or a drain of each of the n-channel thin film transistor 382 and the p-channel thin film transistor 384.

An n-channel thin film transistor and a p-channel thin-film transistor included in each of the protective circuits illustrated in FIGS. 9A to 9F can be manufactured using the n-channel thin film transistor and the p-channel thin-film transistor which are described in Embodiment Mode 1. Here, an n-channel thin film transistor of the protective diode 351 and a p-channel thin film transistor of the protective diode 353 which are shown in FIG. 9A are illustrated in FIGS. 10A and 10B for a typical example.

As shown in FIG. 10A, the protective diode 351 formed using an n-channel thin film transistor and the protective diode 353 formed using a p-channel thin film transistor are provided over the substrate 330. In the protective diode 351 formed using an n-channel thin film transistor, a gate electrode 391 is connected to one of a source or a drain 392. In the protective diode 353 formed using a p-channel thin film transistor, a gate electrode 393 is connected to one of a source or a drain 394. In addition, the protective diode 351 and the protective diode 353 are connected by a wiring 395.

Note that, as shown in FIG. 10B, in the protective diode 351 and the protective diode 353, one of a source or a drain 396 of the protective diode 351 and one of a source or a drain 397 of the protective diode 353 may be connected by a wiring 399, which is formed simultaneously with a pixel electrode, in a contact hole of a protective insulating film 398 formed over the source or the drain 396 and 397.

The n-channel thin film transistor and the p-channel thin film transistor of each of the protective circuits illustrated in FIGS. 9A to 9F are manufactured using the n-channel thin film transistor and the p-channel thin film transistor each having the microcrystalline semiconductor film described in Embodiment Mode 1, so that a reverse bias current can be prevented from flowing through the wiring 383 due to fluctuation in potential. Further, the resistor element 380 and the resistor element 381 can relieve a steep change in the potential of the wiring 383 and thus can prevent deterioration and damage of a semiconductor element.

Note that when only the resistor elements are connected to the wiring in series, a steep change in the potential of the wiring can be relieved and thus deterioration and damage of a semiconductor element can be prevented. Further, when only the protective diodes are connected to the wiring in series, a reverse bias current can be prevented from flowing through the wiring due to fluctuation in potential.

Note that the protective circuit used in this embodiment mode is not limited to the structures illustrated in FIGS. 9A to 9F, and the design of the protective circuit can be changed as appropriate as long as the protective circuit has a similar function.

For the protective diode included in the protective circuit of this embodiment mode, a diode-connected thin film transistor is used. A thin film transistor having a high withstand voltage is used as the diode-connected thin film transistor. Therefore, even when a voltage is applied such that a protective circuit itself can be damaged in the case where the conventional protective circuit is applied to the protective circuit, the potential of a wiring can be prevented from being unusually high or low in the case where the protective circuit of this embodiment mode is used.

Embodiment Mode 5

This embodiment mode will describe the structure of a display panel which is one mode of the display device of the present invention.

Figure 11A:
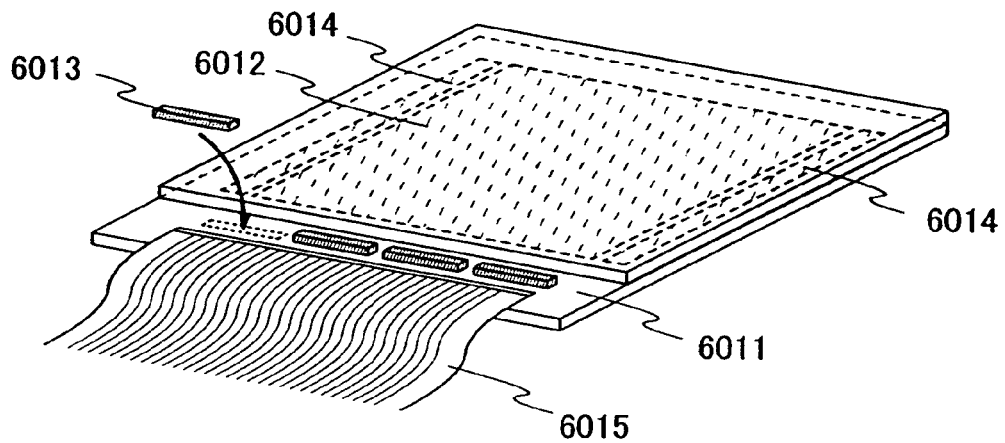
FIGS. 11A to 11C are perspective views each illustrating the structure of a display panel of the present invention.

FIG. 11A illustrates the mode of a display panel in which a pixel portion 6012 formed over a substrate 6011 is connected to a signal line driver circuit 6013 which is separately formed. The pixel portion 6012 and a scan line driver circuit 6014 are each formed using a thin film transistor which uses a microcrystalline semiconductor film for a channel formation region. By forming the signal line driver circuit with a transistor by which higher mobility can be obtained compared to a thin film transistor using the microcrystalline semiconductor film for a channel formation region, operation of the signal line driver circuit which demands a higher driving frequency than that of the scan line driver circuit can be stabilized. Note that the signal line driver circuit 6013 may be formed using a transistor using a single crystal semiconductor for a channel formation region, a thin film transistor using a polycrystalline semiconductor for a channel formation region, or a transistor using SOI for a channel formation region. The pixel portion 6012, the signal line driver circuit 6013, and the scan line driver circuit 6014 are each supplied with a potential of a power source, a variety of signals, and the like through an FPC 6015.

Figure 11B:
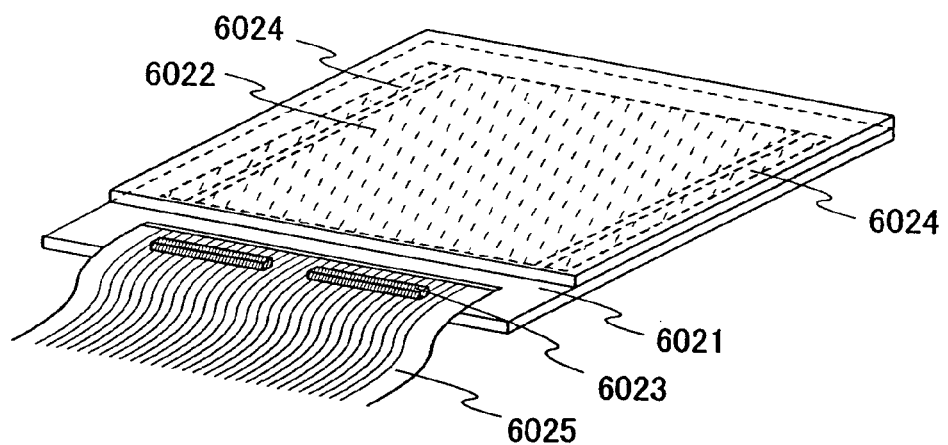

Further, when the driver circuit is separately formed, a substrate provided with the driver circuit is not always required to be attached to a substrate provided with the pixel portion, and may be attached to, for example, the FPC. FIG. 11B illustrates the mode of a display panel in which only a signal line driver circuit 6023 is separately formed and a pixel portion 6022 and a scan line driver circuit 6024 are formed over a substrate 6021. The pixel portion 6022 and the scan line driver circuit 6024 are each formed with a thin film transistor which uses a microcrystalline semiconductor film for a channel formation region. The signal line driver circuit 6023 is connected to the pixel portion 6022 through an FPC 6025. The pixel portion 6022, the signal line driver circuit 6023, and the scan line driver circuit 6024 are each supplied with a potential of a power source, a variety of signals, and the like through the FPC 6025.

Figure 11C:
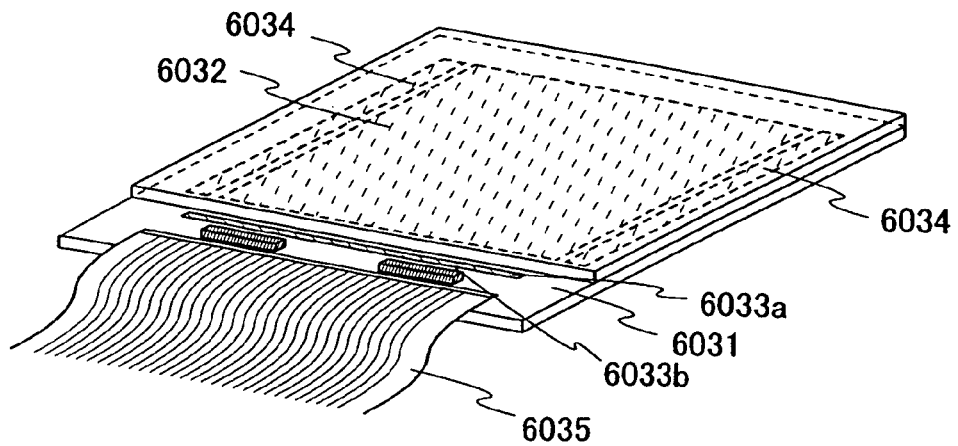

Further, part of the signal line driver circuit or part of the scan line driver circuit may be formed over the same substrate as that of the pixel portion using the thin film transistor which uses a microcrystalline semiconductor film for a channel formation region, and the rest may be formed separately and electrically connected to the pixel portion. FIG. 11C illustrates the mode of a display panel in which an analog switch 6033a included in the signal line driver circuit is formed over a substrate 6031, over which a pixel portion 6032 and a scan line driver circuit 6034 are formed, and a shift register 6033b included in the signal line driver circuit is formed over a different substrate separately and then attached to the substrate 6031. The pixel portion 6032 and the scan line driver circuit 6034 are each formed using the thin film transistor which uses a microcrystalline semiconductor film for a channel formation region. The shift register 6033b included in the signal line driver circuit is connected to the pixel portion 6032 through an FPC 6035. The pixel portion 6032, the signal line driver circuit, and the scan line driver circuit 6034 are each supplied with a potential of a power source, a variety of signals, and the like through the FPC 6035.

As illustrated in FIGS. 11A to 11C, in the display panel of this embodiment mode, an entire driver circuit or part thereof can be formed over the same substrate as that of a pixel portion by using the inversely-staggered thin film transistor which uses a microcrystalline semiconductor film for a channel formation region.

Note that there are no particular limitations on a connecting method of a separately formed substrate, and a known method such as a COG method, a wire bonding method, or a TAB method can be used. Further, a connection position is not limited to the position illustrated in FIGS. 11A to 11C, as long as electrical connection is possible. Further, a controller, a CPU, a memory, or the like may be formed separately and connected.

Embodiment Mode 6

Display devices or the like obtained according to the present invention can be used for modules of active matrix display devices. That is, the present invention can be implemented in all electronic appliances in which these modules are incorporated into a display portion.

As those kinds of electronic appliances, cameras such as video cameras and digital cameras; head-mounted displays (goggle displays); car navigation systems; projectors; car stereos; personal computers; portable information terminals (such as mobile computers, mobile phones, and electronic book readers); and the like can be given. Examples of them are illustrated in FIGS. 12A to 12D.

Figure 12A:
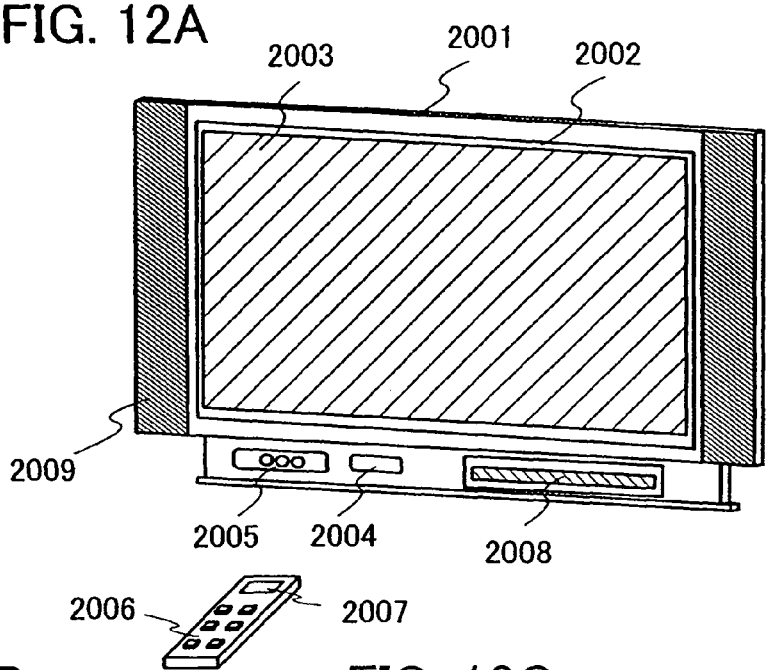
FIGS. 12A to 12D are perspective views each illustrating an electronic device using a display device of the present invention.

FIG. 12A illustrates a television device. A television device can be completed by incorporating a display module into a chassis as illustrated in FIG. 12A. A display panel including components up to an FPC is also referred to as a display module. A main screen 2003 is formed with the display module, and speaker units 2009, operation switches, and the like are provided as accessory equipment. In this manner, a television device can be completed.

As illustrated in FIG. 12A, a display panel 2002 using display elements is incorporated into a chassis 2001, and in addition to reception of general television broadcast by a receiver 2005, communication of information in one direction (from a transmitter to a receiver) or in two directions (between a transmitter and a receiver or between receivers) can be performed by connection to a wired or wireless communication network through a modem 2004. Operations of the television device can be carried out using switches that are incorporated into the chassis or by a remote control device 2006 provided separately, and a display portion 2007 that displays information output to this remote control device may be provided for the remote control device 2006.

Further, in a television device, a sub-screen 2008 may be formed using a second display panel and used to display channel number, volume, and the like, in addition to the main screen 2003. In this structure, the main screen 2003 may be formed with a liquid crystal display panel which has an excellent viewing angle, and the sub-screen 2008 may be formed with a light-emitting display panel by which display at low power consumption is possible. In addition, in order to give priority to a shift toward lower power consumption, the structure may be adopted in which the main screen 2003 and the sub-screen 2008 are each formed with a light-emitting display panel and the sub-screen is set to be turned on or off.

Figure 13:
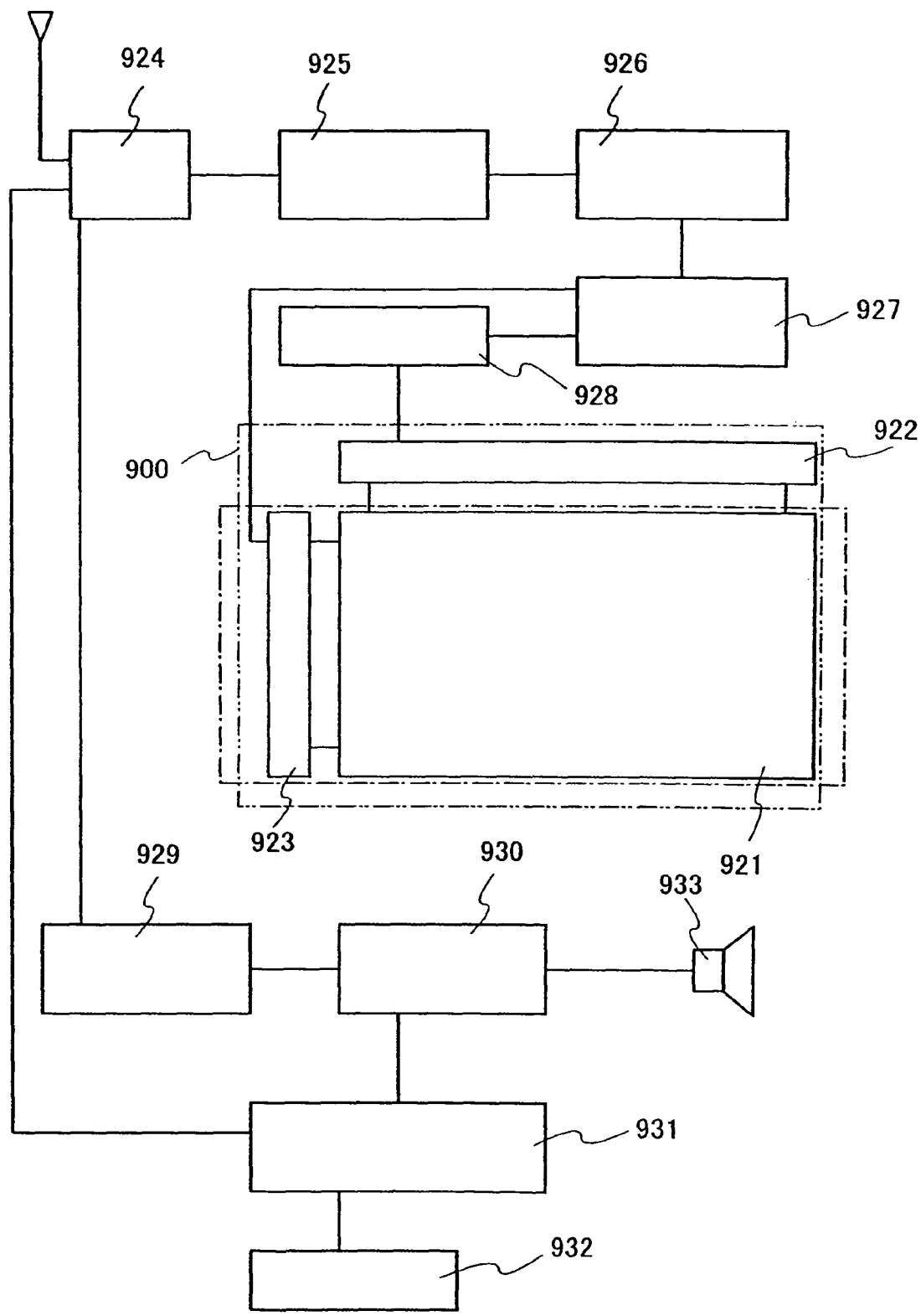
FIG. 13 is a diagram illustrating an electronic device using a display device of the present invention.

FIG. 13 is a block diagram of the main structure of a television device. A display panel 900 is provided with a pixel portion 921. A signal line driver circuit 922 and a scan line driver circuit 923 may be mounted on the display panel 900 by a COG method.

As for another structure of external circuits, the television device includes a video signal amplifier circuit 925 which amplifies a video signal among signals received by a tuner 924; a video signal processing circuit 926 which converts a signal outputted from the video signal amplifier circuit 925 into a color signal corresponding to each color of red, green, and blue; a control circuit 927 which converts the video signal into an input specification of a driver IC; and the like. The control circuit 927 outputs signals to each of the scan line side and the signal line side. When digital driving is performed, a structure may be adopted in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

Note that the present invention is not limited to being used in television devices and can be applied to a variety of applications such as monitors for personal computers and as display media that have a large area, such as information display boards in railway stations, airports, and the like or advertisement display boards on the streets.

Figure 12B:
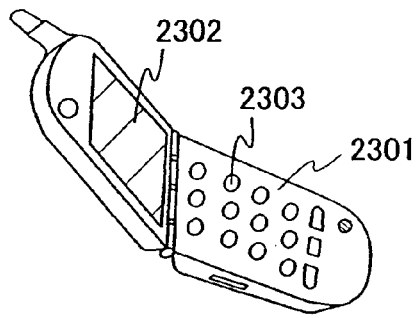

FIG. 12B illustrates one mode of a mobile phone 2301. The mobile phone 2301 includes a display portion 2302, an operation portion 2303, and the like. The display device described in the above embodiment modes is applied to the display portion 2302, so that mass productivity can be improved.

Figure 12C:
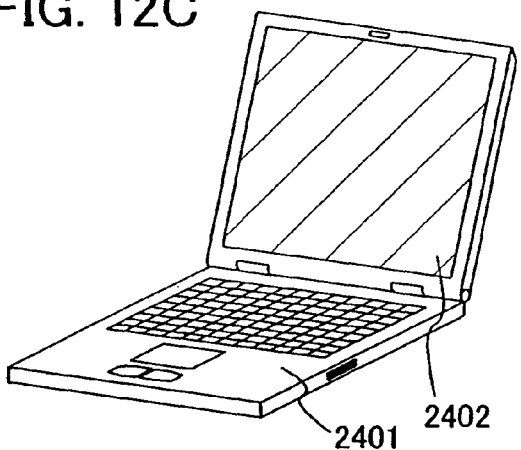

In addition, a portable computer illustrated in FIG. 12C includes a main body 2401, a display portion 2402, and the like. The display device described in the above embodiment modes is applied to the display portion 2402, so that mass productivity can be improved.

Figure 12D:
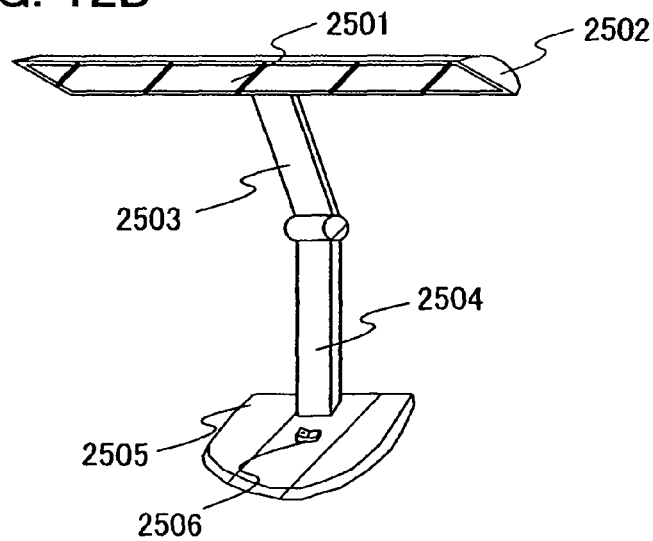

FIG. 12D shows a desk lamp including a lighting portion 2501, a shade 2502, an adjustable arm 2503, a support 2504, a base 2505, and a power switch 2506. The desk lamp is formed using the light-emitting device of the present invention for the lighting portion 2501. Note that a lamp includes a ceiling light, a wall light, and the like in its category. The display device described in the preceding embodiment modes is applied, so that mass productivity can be improved and an inexpensive desk lamp can be provided.

Embodiment 1

Figure 17A:
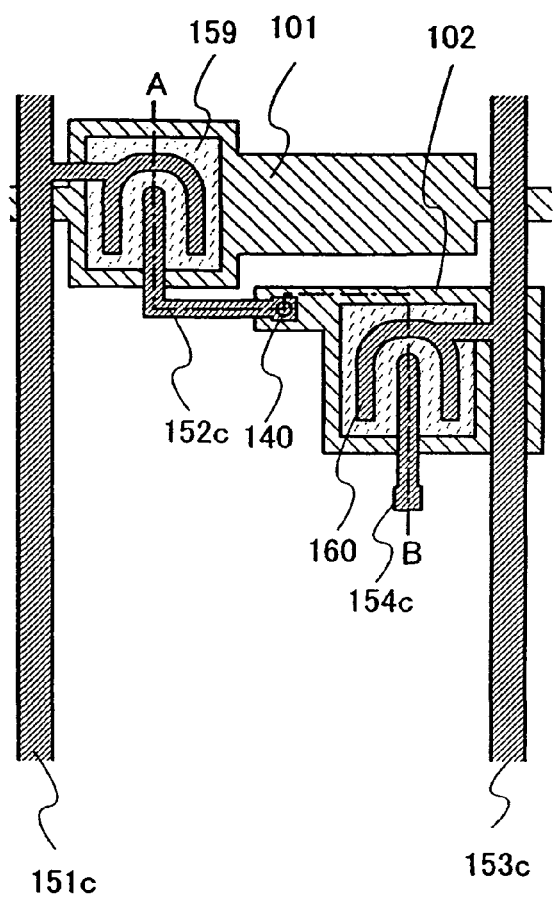
FIGS. 17A and 17B are top plan views illustrating a method for manufacturing a display device of the present invention.
Figure 17B:
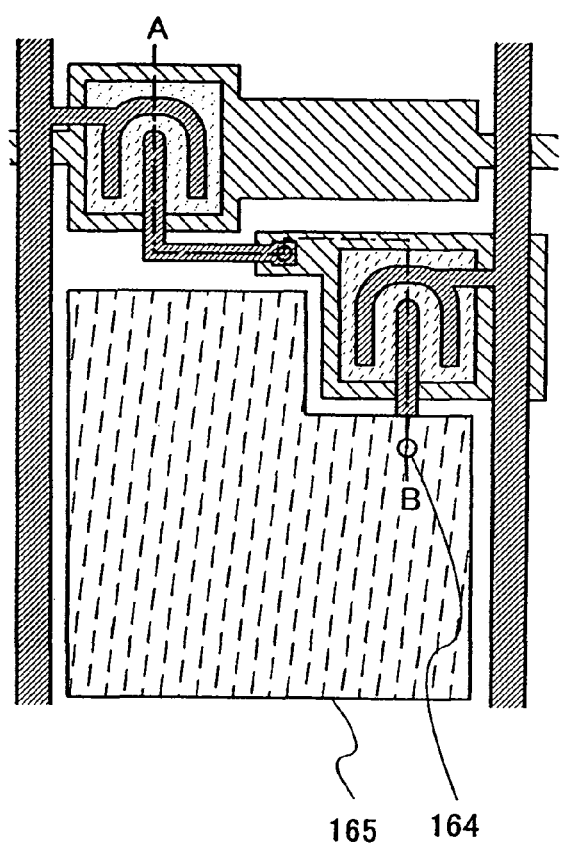

In this embodiment, the process for forming the pixel described in Embodiment Mode 1 is described with reference to FIGS. 14A to 14C, FIGS. 15A to 15C, FIGS. 16A to 16C, and FIGS. 17A and 17B. Note that FIGS. 14A to 14C, FIGS. 15A to 15C, and FIGS. 16A to 16C are cross-sectional views illustrating a process for forming a thin film transistor, and FIGS. 17A and 17B are top plan views of a connection region of a thin film transistor and a pixel electrode in one pixel.

As shown in FIG. 14A, gate electrodes 101 and 102 are formed over a substrate 100. A glass substrate is used as the substrate 100.

An aluminum-neodymium alloy film with a thickness of 150 nm and a molybdenum film with a thickness of from 50 to 150 nm are sequentially stacked by a sputtering method so that a conductive film is formed over the substrate 100. Then, the conductive film is etched using a resist mask which is formed using a first photomask, thereby forming the gate electrodes 101 and 102.

A gate insulating film 103 is formed over the gate electrodes 101 and 102. Here, as the gate insulating film 103, a silicon nitride film with a thickness of from 50 to 150 nm, a silicon oxynitride film with a thickness of from 50 to 150 nm, and a silicon nitride film with a thickness of from 1 to 5 nm are formed by a plasma CVD method.

A microcrystalline silicon film 104 with a thickness of from 20 to 500 nm (preferably, from 100 to 250 nm) is formed over the gate insulating film 103. The microcrystalline silicon film 104 is formed using such a plasma CVD apparatus having an exhaust means 409 capable of high-vacuum evacuation, which is shown in FIG. 3, so that a microcrystalline silicon film with an oxygen concentration of $1 \times 10^{16}$ atoms/$cm^3$ or less can be formed. Here, the microcrystalline silicon film is formed by a plasma CVD method using a silane gas and a hydrogen gas. A flow of the hydrogen gas is from 10 to 2000 times, preferably from 12 to 1000 times, more preferably from 50 to 200 times as large as that of the silane gas. Note that at that time, the substrate 100 is heated at from 100 to 300° C., preferably 120 to 220° C., by which the growth of microcrystalline silicon can be promoted at the interface of the gate insulating film 103 and the microcrystalline silicon film 104.

A buffer layer 105 with a thickness of from 50 to 200 nm is formed over the microcrystalline silicon film 104. For the buffer layer 105, an amorphous silicon film is used. The amorphous silicon film for the buffer layer 105 is formed by a plasma CVD method using hydrogen a flow of which is 1 or more and less than 10 times, more preferably from 1 to 5 times as large as that of the silane gas. Note that the amorphous silicon film for the buffer layer 105 is formed using a plasma CVD apparatus having the exhaust means 409 capable of high-vacuum evacuation similarly to the formation of the microcrystalline silicon film 104, so that a amorphous silicon film with few defects can be formed; therefore, a highly resistant buffer layer can be formed and an off current of a thin film transistor can be reduced.

Note that the buffer layer 105 is preferably formed at from 300 to 400° C. Through the film formation process, hydrogen is supplied to the microcrystalline silicon film 104 and thus an effect similar to that in the case where the microcrystalline silicon film 104 is hydrogenated can be achieved. That is, the buffer layer 105 is deposited over the microcrystalline silicon film 104, by which hydrogen can be diffused to the microcrystalline film 104 to terminate dangling bonds.

After a resist is applied to the buffer layer 105, resist masks 106 and 107 are formed through a photolithography process using a second photomask.

As shown in FIG. 14B, the microcrystalline silicon film 104 and the buffer layer 105 are etched as selected using the resist masks 106 and 107, so that the microcrystalline silicon films 111 and 112 and the buffer layers 113 and 114 are formed. Here, the microcrystalline silicon film 104 and the buffer layer 105 are etched as selected by a dry etching method. After that, the resist masks 106 and 107 are removed.

An n-type semiconductor film 115 with a thickness of from 10 to 100 nm, preferably from 40 to 80 nm is formed. The n-type semiconductor film 115 is formed using a microcrystalline silicon film containing phosphorus by a plasma CVD method using a 0.2 to 1% phosphine gas, a silane gas, and hydrogen. The n-type semiconductor film 115 may also be formed by the plasma CVD apparatus illustrated in FIG. 3.

A conductive film 116 with a thickness of 10 to 60 nm is formed over the n-type semiconductor film 115. The conductive film 116 is formed using a conductive material which can provide high selectivily in etching of the conductive material and a p-type semiconductor film to be formed later. Here, a molybdenum film with a thickness of from 10 to 60 nm is formed by a sputtering method.

A resist mask 117 is formed over the conductive film 116 overlapping with the gate electrode 101 through a photolithography process using a third photomask.

As shown in FIG. 14C, the conductive film 116 and the n-type semiconductor film 115 are etched as selected using the resist mask 117, so that a conductive film 121 and an n-type semiconductor film 122 are formed. At that time, the buffer layer 113 is also partially etched to form a buffer layer 123 of which end portions have steps. In the process, the conductive film 116 and the n-type semiconductor film 115, which are formed over the gate electrode 102, are etched. In this case, ending of the etching process is confirmed by measuring a change in emission intensity in an etching apparatus. That is, plasma emission intensity varies between active species in the case where the n-type semiconductor film 115 is etched and active species in the case where the buffer layer 114 is etched. The change in emission intensity is measured, by which ending of the etching can be confirmed. Therefore, only a part of the buffer layer 113 and a part of the buffer layer 114 are etched. Here, the buffer layer which is formed over the gate electrode 102 is referred to as a buffer layer 124. After that, the resist mask 117 is removed.

Figure 15A:
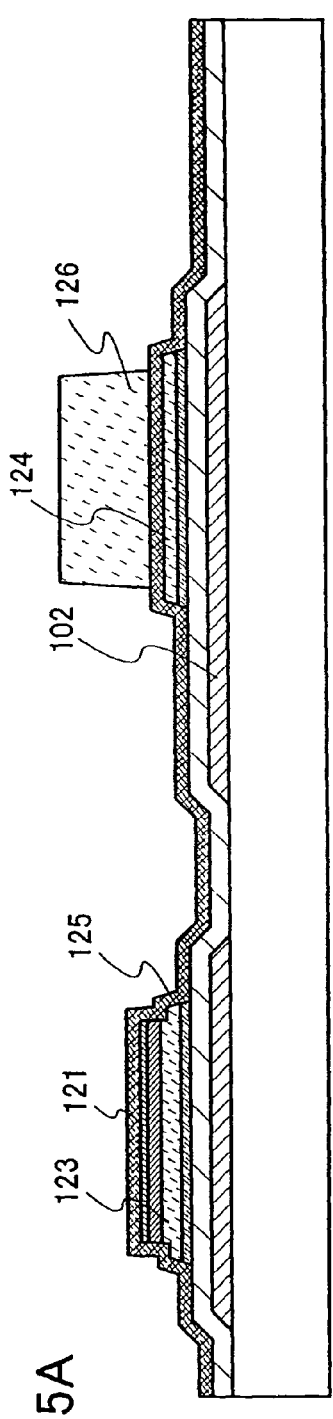
FIGS. 15A to 15C are cross-sectional views illustrating a method for manufacturing a display device of the present invention.

As shown in FIG. 15A, a p-type semiconductor film 125 with a thickness of from 10 to 100 nm, preferably from 40 to 80 nm is formed. The p-type semiconductor film 125 is formed using a microcrystalline silicon film containing boron by a plasma CVD method using 1 to 10% tetramethylboron, silane, hydrogen, and a rare gas (typically, helium or neon). The p-type semiconductor film 125 may also be formed by the plasma CVD apparatus illustrated in FIG. 3.

After a resist is applied to the p-type semiconductor film 125, a resist mask 126 is formed over the p-type semiconductor film 125 overlapping with the gate electrode 102 through a photolithography process using a fourth photomask.

Figure 15B:
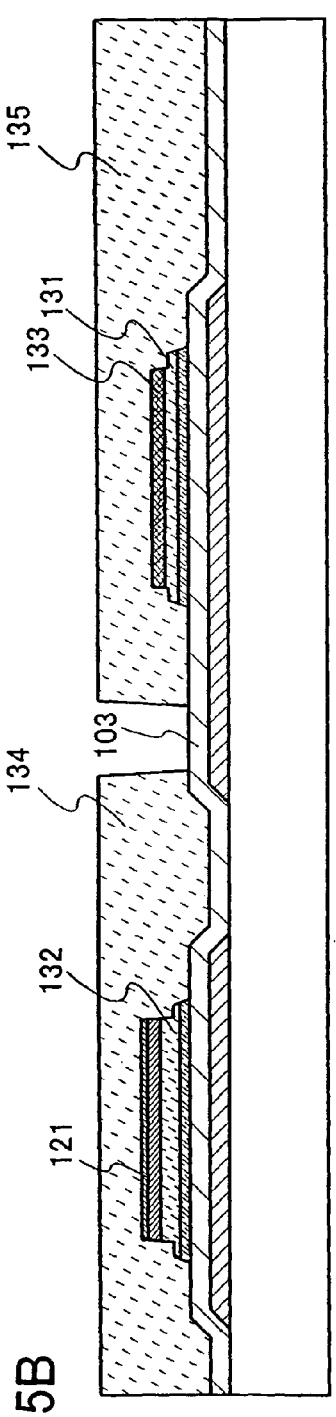

As shown in FIG. 15B, the p-type semiconductor film 125 is etched as selected using the resist mask 126 to form a p-type semiconductor film 133. At that time, the buffer layer 124 is also partially etched to form a buffer layer 131 of which end portions have steps. Further, the p-type semiconductor film is etched as selected over the conductive film 121. However, the end portions of the buffer layer 123, which are not covered with the conductive film 121, are further etched, so that the buffer layer 132 of which end portions have steps is formed.

Resist masks 134 and 135 for partially etching the gate insulating film 103 overlapping with the gate electrode 102 are formed through a photolithography process using a fifth photomask.

Figure 15C:
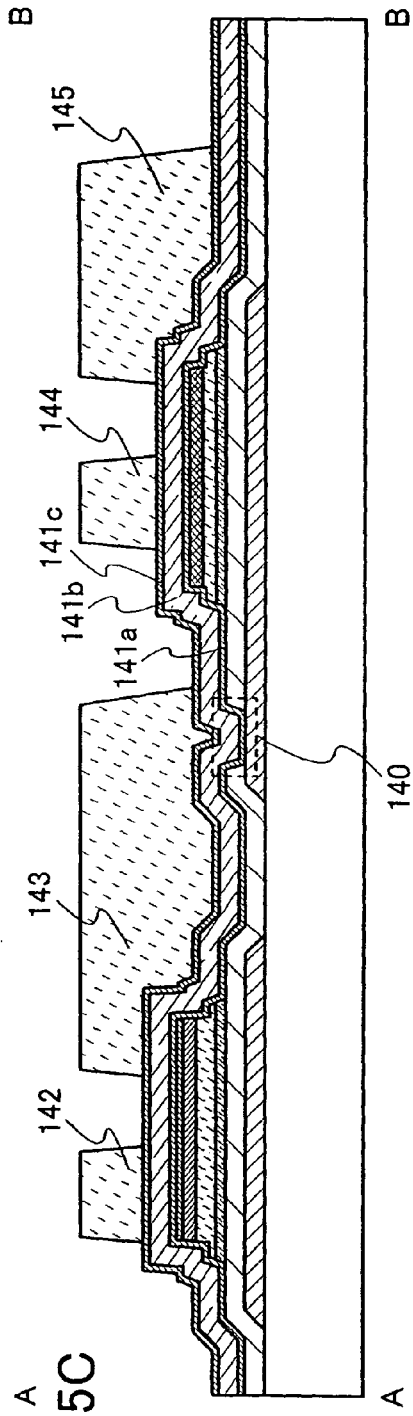

As shown in FIG. 15C, the gate insulating film 103 is partially etched to form a contact hole 140.

Conductive films 141a to 141c are stacked over the conductive film 121, the p-type semiconductor film 133, the gate insulating film 103, and an exposed portion of the gate electrode 102. A molybdenum film with a thickness of from 30 to 60 nm, an aluminum film with a thickness of from 150 to 300 nm, and a molybdenum film with a thickness of from 50 to 100 nm are formed by a sputtering method as the conductive films 141a, 141b, and 142c, respectively.

After a resist is applied to the conductive film 141c, resist masks 142 to 145 for forming wirings from the conductive films 141a to 141c are formed through a photolithography process using a sixth photomask.

As shown in FIG. 16A, the conductive films 141a to 141c and the conductive film 121 are etched using the resist masks 142 to 145. Here, the conductive films 141a to 141c are isotropically etched by an wet etching method; therefore, wirings 151a to 151d, wirings 152a to 152d, wirings 153a to 153c, and wirings 154a to 154c, which have smaller areas than the resist masks 142 to 145, are formed.

The n-type semiconductor film 122 and the p-type semiconductor film 133 are etched using the resist masks 142 to 145 to form a pair of n-type semiconductor films 155 and 156 and a pair of p-type semiconductor films 157 and 158. Here, anisotropic etching is performed using the resist masks 142 to 145 by a dry etching method; therefore, edges of the wirings 151a to 151d and 152a to 152d are not aligned with those of the pair of n-type semiconductor films 155 and 156, respectively, and edges of the wirings 153a to 153c and 154a to 154c are not aligned with those of the pair of p-type semiconductor films 157 and 158, respectively. The edges of the pair of n-type semiconductor films 155 and 156 are extended outward from those of the wirings 151a to 151d and 152a to 152d, respectively, and the edges of the pair of p-type semiconductor films 157 and 158 are extended outward from those of the wirings 153a to 153c and 154a to 154c, respectively.

Note that in the etching process, the buffer layers 132 and 131 are partially overetched, so that the pair of n-type semiconductor films 155 and 156 completely separated from each other and the pair of p-type semiconductor films 157 and 158 completely separated from each other can be formed. The buffer layers each of which has a depressed portion (part of the buffer layer, which is thinner than part overlapped with the n-type semiconductor films or the p-type semiconductor films) due to the overetching are indicated as buffer layers 159 and 160. The n-type semiconductor films 155 and 156 which serve as source and drain regions, the p-type semiconductor films 157 and 158 which serve as source and drain regions, and the depressed portions in the buffer layers can be formed through the same step. The depth of the depressed portion in the buffer layer is set to half to one third of the thicknesses of the thickest regions in the buffer layers, so that the source region and the drain region can be spaced apart from each other. Therefore, a leakage current between the source region and the drain region can be reduced. After that, the resist masks 142 to 145 are removed.

Note that FIG. 16A corresponds to the cross-sectional view along A-B in FIG. 17A. The wirings 151c and 153c have shapes such that they partially surround the wirings 152c and 154c, respectively (specifically, a U shape or a C shape). Therefore, the area of a region in which carriers move can be increased, so that the amount of current can be increased and the area of a thin film transistor can be reduced. Further, the microcrystalline silicon films 111 and 112 and the buffer layers 113 and 114 are formed to have top surfaces smaller than those of the gate electrodes, and the microcrystalline silicon film and the source and drain electrodes overlap the gate electrode; therefore, unevenness of the gate electrodes hardly affects the microcrystalline silicon films 111 and 112 and the buffer layers 113 and 114, so that reduction in coverage and generation of a leakage current can be prevented.

Through the above process, a channel-etched first thin film transistor 155a and a channel-etched second thin film transistor 155b can be formed.

As shown in FIG. 16B, a protective insulating film 161 is formed over wirings 151a to 151d, wirings 152a to 152d, wirings 153a to 153c, wirings 154a to 154c, a pair of n-type semiconductor films 155 and 156, a pair of p-type semiconductor films 157 and 158, buffer layers 159 and 160, microcrystalline silicon films 111 and 112, and the gate insulating film 103. For the protective insulating film 161, a silicon nitride film is formed to a thickness of from 50 to 200 nm by a plasma CVD method.

After a resist is applied to the protective insulating film 161, resist masks 162 and 163 are formed over the protective insulating film 161 through a photolithography process using a seventh photomask.

As shown in FIG. 16C, the protective insulating film 161 is partially etched using the resist masks 162 and 163 to form a contact hole 164.

A pixel electrode 165 is formed to be in contact with the wiring 154c in the contact hole 164. Here, ITO is formed to a thickness of from 50 to 100 nm by a sputtering method. After a resist mask is formed over the ITO through a photolithography process using an eighth photomask, the ITO is etched as selected to form the pixel electrode 165.

Note that FIG. 16C corresponds to a cross-sectional view along A-B in FIG. 17B.

Thus, an element substrate which can be used for a display device can be formed.

Embodiment 2

In this embodiment, a method for forming a thin film transistor, which differs from that of Embodiment 1, is described with reference to FIGS. 18A to 18C, FIGS. 19A and 19B, FIGS. 20A to 20C, FIGS. 21A to 21C, FIGS. 22A and 22B, and FIGS. 23A to 23D. Embodiment 2 will describe steps for forming a thin film transistor by utilizing a process which makes it possible to reduce the number of photomasks as compared with that in Embodiment 1.

As in FIG. 14A, a conductive film is formed over the substrate 100, a resist is applied to the conductive film, and the conductive film is partially etched using a resist mask formed through a photolithography process using a first photomask, so that the gate electrodes 101 and 102 are formed, as shown in FIG. 18A. Then, the gate insulating film 103, the microcrystalline silicon film 104, and the buffer layer 105 are sequentially formed over the gate electrodes 101 and 102.

The n-type semiconductor film 115 is formed over the buffer layer 105 and the conductive film 116 is formed over the n-type semiconductor film 115.

After a resist is applied to the conductive film 116, a resist mask 171 is formed over the conductive film 116 through a photolithography process using a second photomask.

As shown in FIG. 18B, the conductive film 116 and the n-type semiconductor film 115 are etched as selected to form an n-type semiconductor film 172 and the conductive film 173. At that time, part of the buffer layer 105, which is not covered with the resist mask 171, is also etched. The part which is covered with the conductive film 173 is thicker than the part which is not covered with the conductive film 173 and composes a buffer layer 174. In this case, ending of the etching process is determined by measuring a change in emission intensity in an etching apparatus, as in the case of etching illustrated in FIG. 15B.

Next, the p-type semiconductor film 125 with a thickness of from 10 to 100 nm, preferably from 40 to 80 nm is formed.

A resist mask 175 is formed over the p-type semiconductor film 125 overlapping with the gate electrode 102 through a photolithography process using a third photomask.

As shown in FIG. 18C, the p-type semiconductor film 125 is etched as selected using the resist mask 175 to form a p-type semiconductor film 180. At that time, the buffer layer 174 is also partially etched to form buffer layers 176 and 177. Further, the microcrystalline silicon film 104 is also etched to form microcrystalline silicon films 178 and 179.

Figures 19A, 19B:
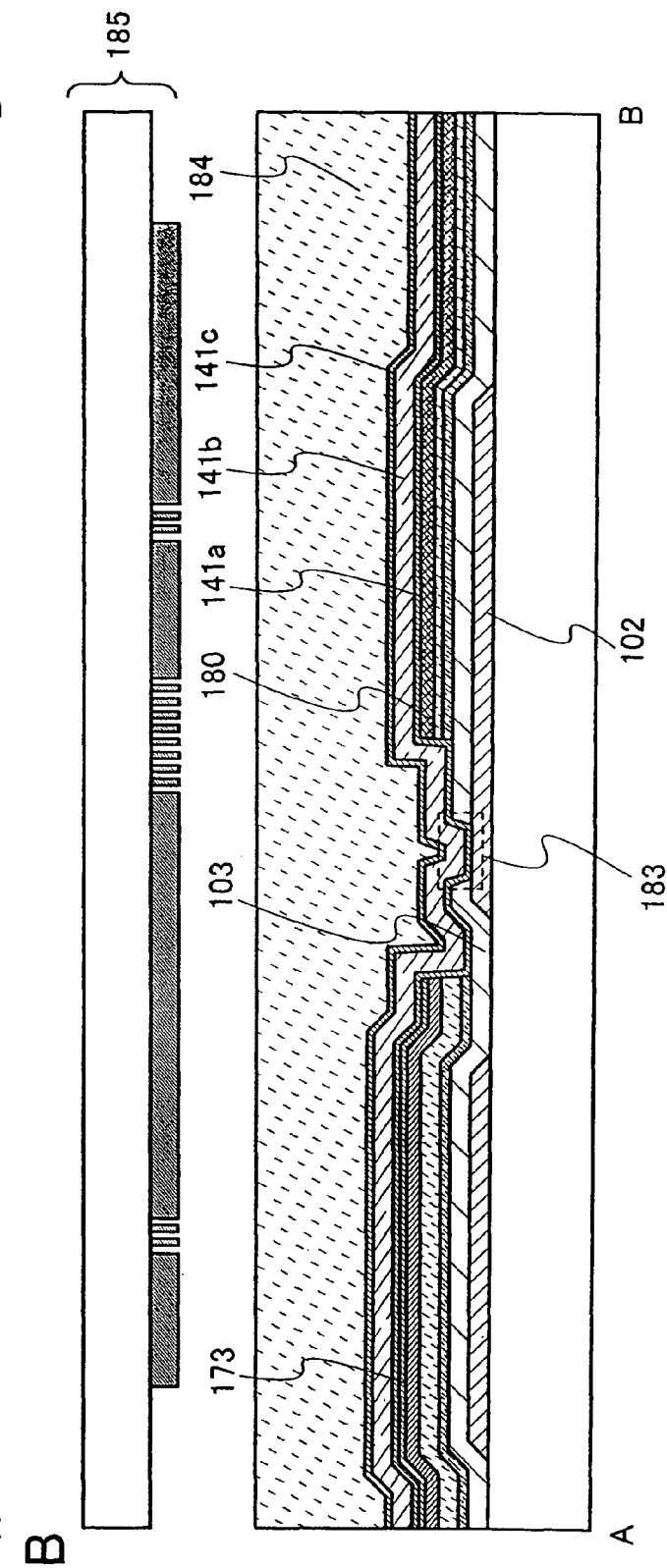
FIGS. 19A and 19B are cross-sectional views illustrating a method for manufacturing a display device of the present invention.

After a resist is applied, resist masks 181 and 182 for partially etching the gate insulating film 103 overlapping with the gate electrode 102 are formed through a photolithography process using a fourth photomask as shown in FIG. 19A.

As shown in FIG. 19B, the gate insulating film 103 is partially etched to form a contact hole 183.

The conductive films 141a to 141c are formed over the conductive film 173, the p-type semiconductor film 180, the gate insulating film 103, and an exposed portion of the gate electrode 102 as in FIG. 15C.

A resist 184 is applied to the conductive film 141c.

Next, the resist 184 is irradiated with light using a multi-tone photomask 185 as the fourth photomask to expose the resist 184 to light.

Here, light exposure using the multi-tone photomask 185 is described with reference to FIGS. 23A to 23D.

A multi-tone photomask can provide three levels of light exposure, an exposed portion, a half-exposed portion, and an unexposed portion; one-time exposure and development process allow a resist mask with regions of plural thicknesses (typically, two kinds of thicknesses) to be formed. The use of a multi-tone photomask allows the number of photomasks to be reduced.

Figure 23A:
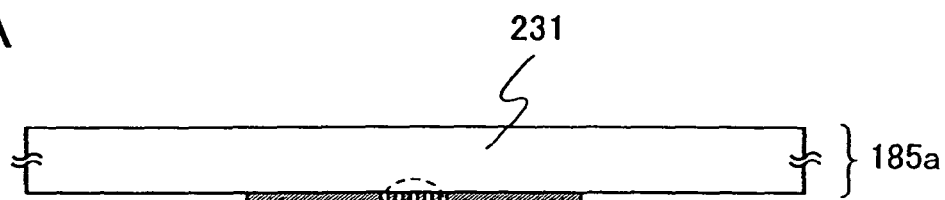
FIGS. 23A to 23D illustrate multiple gray scale masks which can be applied to the present invention.
Figure 23B:
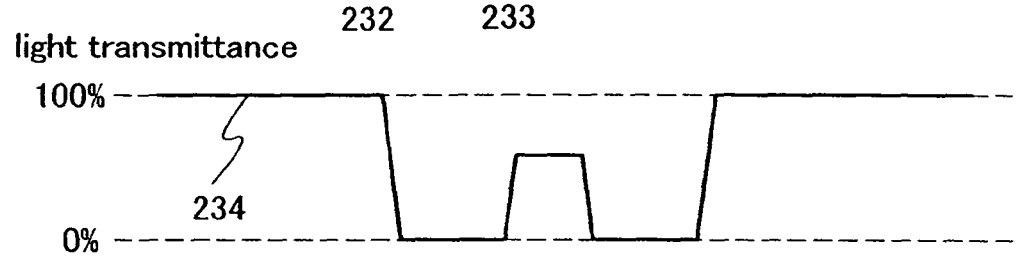
Figure 23C:
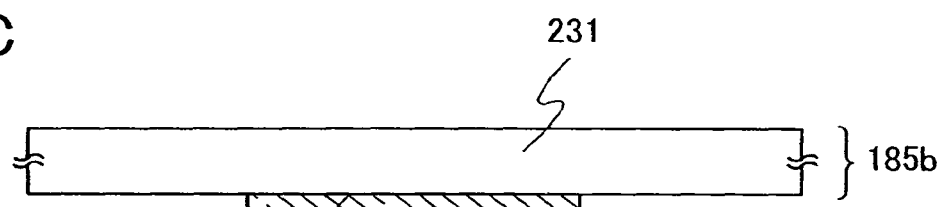

Typical examples of a multi-tone photomask include a gray-tone mask 185a illustrated in FIG. 23A, and a half-tone mask 185b illustrated in FIG. 23C.

As illustrated in FIG. 23A, the gray-tone mask 185a includes a substrate 231 having a light-transmitting property, and a light-shielding portion 232 and a diffraction grating 233 that are formed thereon. The light transmittance of the light-shielding portion 232 is 0%. The diffraction grating 233 has a light-transmitting portion in a slit form, a dot form, a mesh form, or the like at intervals which are less than or equal to the resolution limit for light used for the exposure; thus, the light transmittance can be controlled. The diffraction grating 233 can have regularly-arranged slits, dots, or meshes, or irregularly-arranged slits, dots, or meshes.

For the substrate 231 having a light-transmitting property, a quartz substrate and the like can be used. The light-shielding portion 232 and the diffraction grating 233 can be formed using a light-shielding material such as chromium or chromium oxide, which absorbs light.

When the gray-tone mask 185a is irradiated with light for exposure, the light transmittance 234 of the light-shielding portion 232 is 0% and that of a region where neither the light-shielding portion 232 nor the diffraction grating 233 are provided is 100%, as illustrated in FIG. 23B. The light transmittance of the diffraction grating 233 can be controlled in a range of from 10 to 70%. The light transmittance of the diffraction grating 233 can be controlled by adjusting an interval or a pitch between slits, dots, or meshes of the diffraction grating 233.

As illustrated in FIG. 23C, the half-tone mask 185b includes the substrate 231 having a light-transmitting property, and a semi-transmissive portion 235 and a light-shielding portion 236 that are formed thereon. The semi-transmissive portion 235 can be formed using MoSiN, MoSi, MoSiO, MoSiON, CrSi, or the like. The light-shielding portion 236 can be formed using a light-shielding material such as chromium or chromium oxide, which absorbs light.

Figure 23D:
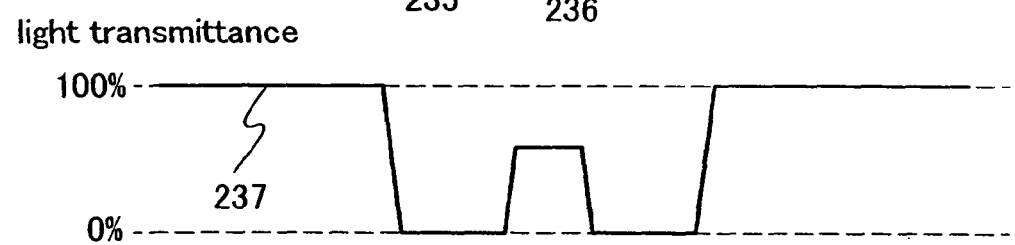

When the half-tone mask 185b is irradiated with light for exposure, the light transmittance 237 of the light-shielding portion 236 is 0% and that of a region where neither the light-shielding portion 236 nor the semi-transmissive portion 235 is provided is 100%, as illustrated in FIG. 23D. The light transmittance of the semi-transmissive portion 235 can be controlled in a range of from 10 to 70%. The light transmittance of the semi-transmissive portion 235 can be controlled by the material of the semi-transmissive portion 235.

After the light exposure using the multi-tone photomask, development is carried out, by which resist masks 186 and 187 each having regions with different thicknesses can be formed, as illustrated in FIG. 20A.

With the resist masks 186 and 187, the microcrystalline silicon films 178 and 179, the buffer layers 176 and 177, the n-type semiconductor film 172, the conductive film 173, the p-type semiconductor film 180, and the conductive films 141a to 141c are etched for separation of the two thin film transistors. As a result, microcrystalline silicon films 197 and 198, buffer layers 195 and 196, an n-type semiconductor film 193, a p-type semiconductor film 194, conductive films 191a to 191d and 192a to 192c can be formed, as illustrated in FIG. 20B.

Ashing is performed on the resist masks 186 and 187. As a result, the area and the thickness of the resist are reduced. At this time, the resist in a region with a small thickness (a region overlapping with part of the gate electrodes 101 and 102) is removed to form separated resist masks 201 to 204, as illustrated in FIG. 20C.

The conductive films 191a to 191d and 192a to 192c are etched to be separated using the resist masks 201 to 204. As a result, sets of wirings 211a to 211d, 212a to 212d, 213a to 213c, and 214a to 214c, which are illustrated in FIG. 21A, can be formed. Wet etching is performed on the conductive films 191a to 191d and 192a to 192c with the use of the resist masks 201 to 204, so that end portions of the conductive films 191a to 191d and 192a to 192c are isotropically etched. Consequently, the wirings 211a to 211d, 212a to 212d, 213a to 213c, and 214a to 214c, which have smaller areas than the resist masks 201 to 204, can be formed.

The n-type semiconductor film 193 and the p-type semiconductor film 194 are etched using the resist masks 201 to 204, so that a pair of n-type semiconductor films 215 and 216 and a pair of p-type semiconductor films 217 and 218 are formed. Here, the n-type semiconductor film 193 and the p-type semiconductor film 194 are anisotropically etched by a dry etching method; therefore, edges of the wirings 211a to 211d and 212a to 212d are not aligned with those of the pair of n-type semiconductor films 215 and 216, respectively, and edges of the wirings 213a to 213c and 214a to 214c are not aligned with those of the pair of p-type semiconductor films 217 and 218, respectively. The edges of the pair of n-type semiconductor films 215 and 216 are extended outward from those of the wirings 211a to 211d and 212a to 212d, respectively, and the edges of the pair of p-type semiconductor films 217 and 218 are extended outward from those of the wirings 213a to 213c and 214a to 214c, respectively.

Note that in the etching process, the buffer layers 176 and 177 are partially overetched, so that the pair of n-type semiconductor films 215 and 216 completely separated from each other and the pair of p-type semiconductor films 217 and 218 completely separated from each other can be formed. The overetched buffer layers having a depressed portion are indicated as the buffer layers 219 and 220. The n-type semiconductor films 215 and 216 which serve as source and drain regions, the p-type semiconductor films 217 and 218 which serve as source and drain regions, and the depressed portions in the buffer layers can be formed through the same step. The depth of the depressed portion in the buffer layer is set to half to one third of the thicknesses of the thickest regions in the buffer layers, so that the source region and the drain region can be spaced apart from each other. Therefore, a leakage current between the source region and the drain region can be reduced. After that, the resist masks 201 to 204 are removed. Note that FIG. 21B corresponds to a cross-sectional view along A-B in FIG. 22A.

Through the above-described process, channel-etched thin film transistors 221a and 221b can be formed.

As shown in FIG. 21B, the protective insulating film 161 is formed over the wirings 211a to 211d, 212a to 212d, 213a to 213c, and 214a to 214c, the pair of n-type semiconductor films 215 and 216, the pair of p-type semiconductor films 217 and 218, the buffer layers 219 and 220, the microcrystalline silicon films 197 and 198, and the gate insulating film 103.

After a resist is applied to the protective insulating film 161, resist masks 222 and 223 are formed through a photolithography process using a fifth photomask.

Next, as shown in FIG. 21C, the protective insulating film 161 is partially etched using the resist mask 222 to form a contact hole 223.

Next, a pixel electrode 224 is formed to be in contact with the wiring 214c in the contact hole 223. Here, an aluminum film is formed to a thickness of from 50 to 100 nm by a sputtering method.

After a resist mask is formed over the aluminum film through a photolithography process using a sixth photomask, the aluminum film is etched as selected to form the pixel electrode 224.

Figure 22A:
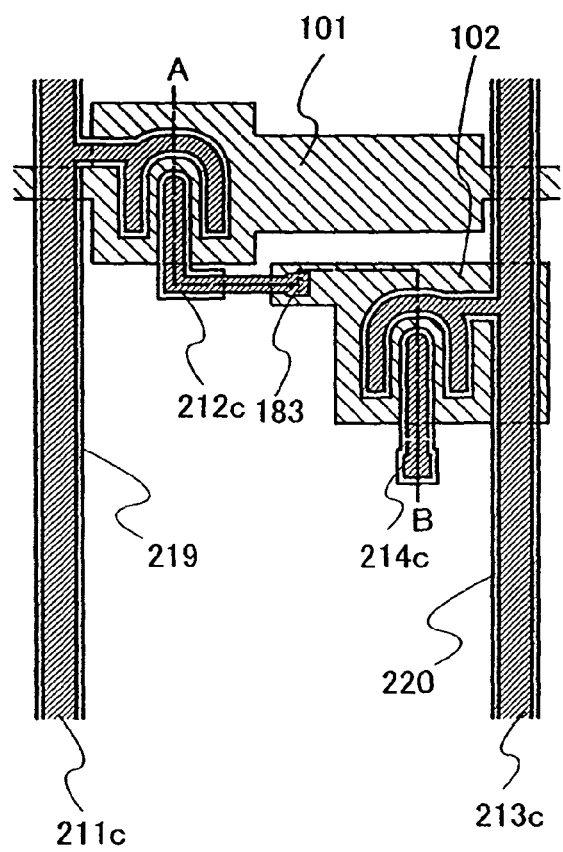
FIGS. 22A and 22B are top plan views illustrating a method for manufacturing a display device of the present invention.
Figure 22B:
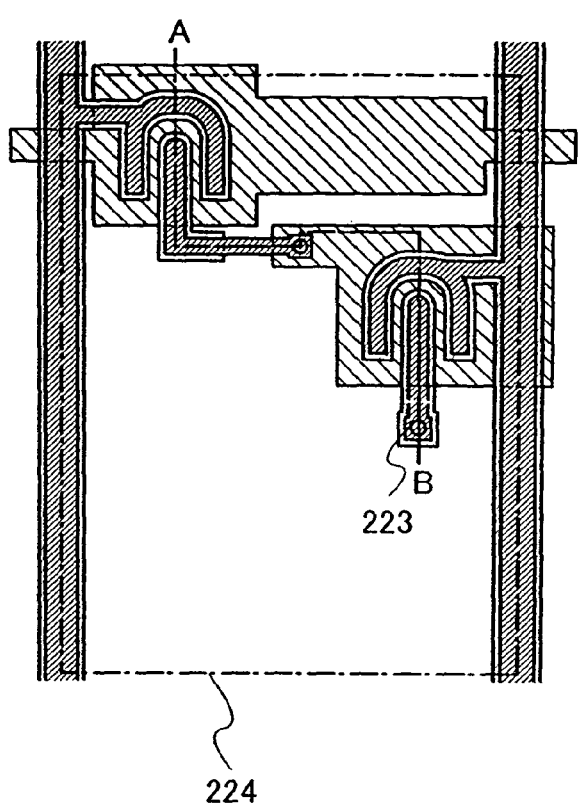

Note that FIG. 21C corresponds to a cross-sectional view along A-B in FIG. 22B.

Through the above process, an element substrate which can be used for a display device can be formed.

This application is based on Japanese Patent Application serial no. 2007-213055 filed with Japan Patent Office on Aug. 17, 2007, the entire contents of which are hereby incorporated by reference.

What is claimed is:

1. A display device comprising:
an n-channel thin film transistor comprising:
a first gate electrode;
a first gate insulating film formed over the first gate electrode;
a first microcrystalline semiconductor film formed over the first gate insulating film;
a first buffer layer formed over the first microcrystalline semiconductor film;
a pair of n-type semiconductor films formed over the first buffer layer; and
a pair of first wirings formed over the pair of n-type semiconductor films; and
a p-channel thin film transistor comprising:
a second gate electrode;
a second gate insulating film formed over the second gate electrode;
a second microcrystalline semiconductor film formed over the second gate insulating film;
a second buffer layer formed over the second microcrystalline semiconductor film;
a pair of p-type semiconductor films formed over the second buffer layer; and
a pair of second wirings formed over the pair of p-type semiconductor films,
wherein the first microcrystalline semiconductor film and the second microcrystalline semiconductor film each contain oxygen at a concentration of $1\times10^{16}$ atoms/cm$^3$ or less,
wherein the pair of n-type semiconductor films include amorphous semiconductor or microcrystalline semiconductor, and
wherein the pair of p-type semiconductor films include amorphous semiconductor or microcrystalline semiconductor.

2. The display device according to claim 1,
wherein mobilities of the n-channel thin film transistor and the p-channel thin film transistor are from 10 to 45 cm$^2$/V·s and 0.3 cm$^2$/V·s or less, respectively.

3. The display device according to claim 1, further comprising:
a pixel having a pixel electrode connected to one of the n-channel thin film transistor and the p-channel thin film transistor.

4. The display device according to claim 1,
wherein the n-channel thin film transistor and the p-channel thin film transistor form a protective circuit, and wherein the n-channel thin film transistor and the p-channel thin film transistor are each diode-connected.

5. The display device according to claim 1,
wherein the display device is a liquid crystal display device.

6. The display device according to claim 1,
wherein one of the pair of first wirings is connected to the second gate electrode.

7. The display device according to claim 1,
wherein the display device is a light-emitting display device.

8. A display device comprising:
an n-channel thin film transistor comprising:
   a first gate electrode;
   a first gate insulating film formed over the first gate electrode;
   a first microcrystalline semiconductor film formed over the first gate insulating film;
   a first buffer layer formed over the first microcrystalline semiconductor film;
   a pair of n-type semiconductor films formed over the first buffer layer;
   a first conductive layer formed over the pair of n-type semiconductor films; and
   a pair of first wirings formed over the first conductive layer; and
a p-channel thin film transistor comprising:
   a second gate electrode;
   a second gate insulating film formed over the second gate electrode;
   a second microcrystalline semiconductor film formed over the second gate insulating film;
   a second buffer layer formed over the second microcrystalline semiconductor film;
   a pair of p-type semiconductor films formed over the second buffer layer; and
   a pair of second wirings formed over the pair of p-type semiconductor films,
wherein the first microcrystalline semiconductor film and the second microcrystalline semiconductor film each contain oxygen at a concentration of $1 \times 10^{16}$ atoms/cm$^3$ or less,
wherein the pair of n-type semiconductor films include amorphous semiconductor or microcrystalline semiconductor, and
wherein the pair of p-type semiconductor films include amorphous semiconductor or microcrystalline semiconductor.

9. The display device according to claim 8,
wherein mobilities of the n-channel thin film transistor and the p-channel thin film transistor are from 10 to 45 cm$^2$/V·s and 0.3 cm$^2$/V·s or less, respectively.

10. The display device according to claim 8, further comprising:
a pixel having a pixel electrode connected to one of the n-channel thin film transistor and the p-channel thin film transistor.

11. The display device according to claim 8,
wherein the n-channel thin film transistor and the p-channel thin film transistor form a protective circuit, and
wherein the n-channel thin film transistor and the p-channel thin film transistor are each diode-connected.

12. The display device according to claim 8,
wherein the display device is a liquid crystal display device.

13. The display device according to claim 8,
wherein one of the pair of first wirings is connected to the second gate electrode.

14. The display device according to claim 8,
wherein the display device is a light-emitting display device.

15. The display device according to claim 8,
wherein the pair of first wirings has a structure in which at least three conductive layers are stacked.

16. A display device comprising:
an n-channel thin film transistor comprising:
   a first gate electrode;
   a first gate insulating film formed over the first gate electrode;
   a first microcrystalline semiconductor film formed over the first gate insulating film;
   a first buffer layer formed over the first microcrystalline semiconductor film;
   a pair of n-type semiconductor films formed over the first buffer layer; and
   a pair of first wirings formed over the pair of n-type semiconductor films; and
a p-channel thin film transistor comprising:
   a second gate electrode;
   a second gate insulating film formed over the second gate electrode;
   a second microcrystalline semiconductor film formed over the second gate insulating film;
   a second buffer layer formed over the second microcrystalline semiconductor film;
   a pair of p-type semiconductor films formed over the second buffer layer;
   a second conductive layer formed over the pair of p-type semiconductor films; and
   a pair of second wirings formed over the second conductive layer,
wherein the first microcrystalline semiconductor film and the second microcrystalline semiconductor film each contain oxygen at a concentration of $1 \times 10^{16}$ atoms/cm$^3$ or less,
wherein the pair of n-type semiconductor films include amorphous semiconductor or microcrystalline semiconductor, and
wherein the pair of p-type semiconductor films is amorphous semiconductor film or microcrystalline semiconductor film.

17. The display device according to claim 16,
wherein mobilities of the n-channel thin film transistor and the p-channel thin film transistor are from 10 to 45 cm$^2$/V·s and 0.3 cm$^2$/V·s or less, respectively.

18. The display device according to claim 16, further comprising:
a pixel having a pixel electrode connected to one of the n-channel thin film transistor and the p-channel thin film transistor.

19. The display device according to claim 16,
wherein the n-channel thin film transistor and the p-channel thin film transistor form a protective circuit, and
wherein the n-channel thin film transistor and the p-channel thin film transistor are each diode-connected.

20. The display device according to claim 16,
wherein the display device is a liquid crystal display device.

21. The display device according to claim 16,
wherein one of the pair of first wirings is connected to the second gate electrode.

22. The display device according to claim 16,
wherein the display device is a light-emitting display device.

23. The display device according to claim 16,
wherein the pair of second wirings has a structure in which at least three conductive layers are stacked.

* * * * *

UNITED STATES PATENT AND TRADEMARK OFFICE
CERTIFICATE OF CORRECTION

| | | |
|---|---|---|
| PATENT NO. | : 7,888,681 B2 | Page 1 of 1 |
| APPLICATION NO. | : 12/222672 | |
| DATED | : February 15, 2011 | |
| INVENTOR(S) | : Shunpei Yamazaki et al. | |

It is certified that error appears in the above-identified patent and that said Letters Patent is hereby corrected as shown below:

At column 8, line 63, "transistor 51a" should be -- transistor 51b --;

At column 9, line 41, "transistors 51a and 51a" should be -- transistors 51a and 51b --;

At column 14, line 16, "401a, and an impurity" should be -- 401b, and an impurity --;

At column 15, line 67, "second thin film transistor 51a" should be -- second thin film transistor 51b --;

At column 18, line 18, "51a; thus" should be -- 51b; thus --;

At column 19, exact line 52, nominally line 53, "second thin film transistor 51a" should be -- second thin film transistor 51b --;

At column 20, line 1, "51a" should be -- 51b --;

At column 20, lines 27-28, "second thin film transistor 51a" should be -- second thin film transistor 51b --;

At column 22, line 49, "another pail of the signal line" should be -- another part of the signal line --;

At column 25, line 6, "$V_{dd}$ to noise" should be -- $V_{dd}$ due to noise --.

Signed and Sealed this
Fifth Day of July, 2011

David J. Kappos
*Director of the United States Patent and Trademark Office*